(12) United States Patent
Kozu et al.

(10) Patent No.: US 9,778,486 B2
(45) Date of Patent: Oct. 3, 2017

(54) METHOD OF COMPILING SHAPE DATA OF A SPECTACLE LENS, SPECTACLE LENS SHAPE DATA COMPILING DEVICE AND SPECTACLE LENS

(71) Applicant: HOYA CORPORATION, Shinjuku-ku (JP)

(72) Inventors: Kazuma Kozu, Tokyo (JP); Takashi Hatanaka, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 389 days.

(21) Appl. No.: 14/322,563

(22) Filed: Jul. 2, 2014

(65) Prior Publication Data
US 2014/0313476 A1    Oct. 23, 2014

Related U.S. Application Data

(63) Continuation of application No. 13/256,150, filed as application No. PCT/JP2010/054261 on Mar. 12, 2010, now Pat. No. 8,814,353.

(30) Foreign Application Priority Data

Mar. 12, 2009    (JP) .................................. 2009-060293

(51) Int. Cl.
*G02C 7/02*    (2006.01)
*G06F 17/50*    (2006.01)
*G02C 7/06*    (2006.01)

(52) U.S. Cl.
CPC .............. *G02C 7/024* (2013.01); *G02C 7/02* (2013.01); *G02C 7/027* (2013.01); *G06F 17/50* (2013.01); *G02C 7/061* (2013.01)

(58) Field of Classification Search
CPC ........ G02C 7/024; G02C 7/025; G02C 7/027; G02C 7/028

(Continued)

(56) References Cited

U.S. PATENT DOCUMENTS 6,361,166 B1 *    3/2002    Perrott .................... G02C 7/02
                                                    351/159.01
7,090,349 B2    8/2006    Perrott et al.
(Continued)

FOREIGN PATENT DOCUMENTS

CN    2325792 Y    6/1999
CN    1262452 A    8/2000
(Continued)

OTHER PUBLICATIONS

Extended European Search Report issued on Feb. 27, 2014 in corresponding European Patent Application No. 10750933.3.
Office Action issued on Dec. 10, 2013 in corresponding Chinese Patent Application No. 201210464508.8.
Office Action issued Apr. 23, 2013, in Japanese Patent Application No. 2011-503883.
(Continued)

*Primary Examiner* — Ricky Mack
*Assistant Examiner* — Robert E Tallman
(74) *Attorney, Agent, or Firm* — Oliff PLC

(57) ABSTRACT

A spectacle lens capable of obtaining a good vision without feeling of discomfort, even being fitted into a frame having a large front angle, and a method of creating the shape data of the spectacle lens having dioptric power to be fitted into a frame having a lens front angle. The method corrects the shape data of a lens back surface so that the prismatic effect undergone via the lens of initial lens shape by a plurality of rays passing through a rotation center of the eye in a case where a lens front angle is provided is identical or close to the prismatic effect undergone via the lens of initial lens shape by the plurality of rays passing through the rotation center of the eye in a case where no lens front angle is provided.

16 Claims, 25 Drawing Sheets

(58) Field of Classification Search
USPC ............. 351/159.45, 159.53, 159.74–159.77
See application file for complete search history.

(56) References Cited

U.S. PATENT DOCUMENTS

| | | |
|---|---|---|
| 2002/0118337 A1 | 8/2002 | Perrott et al. |
| 2005/0122470 A1 | 6/2005 | Perrott et al. |
| 2005/0225719 A1 | 10/2005 | Kamishita et al. |
| 2008/0024719 A1 | 1/2008 | Kamishita et al. |
| 2008/0284978 A1 | 11/2008 | Kaga |

FOREIGN PATENT DOCUMENTS

| | | |
|---|---|---|
| DE | 10 2005 057 533 a1 | 6/2007 |
| EP | 1 582 909 A1 | 10/2005 |
| EP | 1 882 973 A1 | 1/2008 |
| JP | 2000 506628 | 5/2000 |
| JP | 2005 284059 | 10/2005 |
| JP | 2008 26776 | 2/2008 |
| JP | 2008 58576 | 3/2008 |
| JP | 2008-158494 | 7/2008 |
| WO | 97-35224 | 9/1997 |
| WO | WO 2010/104182 A1 | 9/2010 |

OTHER PUBLICATIONS

Office Action issued Apr. 23, 2013, in Japanese Patent Application No. 2012-251100.
International Search Report issued Jun. 22, 2010 in PCT/JP10/054261 filed Mar. 12, 2010.

\* cited by examiner

Left    Right

METHOD OF COMPILING SHAPE DATA OF A SPECTACLE LENS, SPECTACLE LENS SHAPE DATA COMPILING DEVICE AND SPECTACLE LENS

CROSS REFERENCE TO RELATED APPLICATIONS

This application is a continuation of U.S. Ser. No. 13/256,150 filed Sep. 12, 2011, the entire content of which is incorporated herein by reference, and claims the benefit of priority under 35 U.S.C. §120 from PCT Application No. PCT/JP10/054261 filed Mar. 12, 2010, and is further based upon, and claims the benefit of priority under 35 U.S.C. §119 from, Japanese Patent Application No. 2009-060293 filed Mar. 12, 2009.

TECHNICAL FIELD

The present invention relates to a spectacle lens to be fitted into a spectacle frame so that the spectacle lens is tilted to the outside in horizontal direction, and a method for designing such spectacle lens. Particularly, the present invention relates to a method for compiling (creating) shape data of a spectacle lens suitable to be fitted into a spectacle frame having a large front angle, such as a wraparound frame, a device for compiling (creating) the shape data of the spectacle lens, and the spectacle lens.

BACKGROUND ART

Wraparound spectacles whose lenses wrap around the eyes and the area close to both sides of the face are proposed to be used as sporting spectacles, sunglass and the like. By using the wraparound spectacles, many advantages can be achieved such as obtaining a wide vision, keeping the wind out from the eyes, and controlling incident light from the lateral direction. Thus, growing demand for the wraparound spectacles comes not only from the sports lovers, but also from the persons engaged in various outdoor activities. Further, there is another growing demand of the wraparound spectacles derived from functionality.

FIG. 22 is a perspective view showing an example of a spectacle frame 3 for configuring a pair of wraparound spectacles, and FIG. 23 is a plan view of the spectacle frame 3 viewed from above. The spectacle frame 3 includes a front 7, and two temples 8 respectively connected to the left and right ends of the front 7. The front 7 includes left and right rims 5 for holding the lenses, a bridge 9 for connecting the left and right rims 5, and a pad (nose pad) 4 attached to the inner side of the left and right rims 5.

Further, the left and right lens frame shapes 6, which are respectively the inner periphery shapes of the left and right rims 5, respectively correspond to the left and right lens shapes of the lenses fitted into the spectacle frame 3.

As can be known from FIGS. 22 and 23 that, in the wraparound spectacle frame 3, since the front 7 is largely curved along the face of the spectacle wearer, the front 7 has a very large front angle. A front angle $\theta_f$ is defined as an angle in the horizontal direction between a plane Ff of the front 7 (also referred to as "spectacle plane" hereinafter) of the spectacle frame and a plane $F_s$ of each of the left and right lens shapes (referred to as "lens plane" hereinafter). In the present specification, the spectacle plane $F_f$ is a vertical plane passing through the left and right lens shape centers (each lens shape center being an intersection of the horizontal centerline and the vertical centerline of a rectangle formed by two horizontal lines and two vertical lines circumscribing the lens shape) 2, and the lens plane $F_s$ is a vertical plane passing through the horizontal centerline $L_{hc}$ of each lens shape (i.e., the horizontal centerline of the rectangle formed by two horizontal lines and two vertical lines circumscribing the lens shape). For most wraparound spectacle frames described above, the front angle $\theta_f$ is typically set in a range from 10 to 30 degrees.

Conventionally, spectacle lenses with no dioptric power (also referred to as "plano lenses" hereinafter) have been used as the spectacle lenses to be fitted into the aforesaic wraparound spectacle frame; however, in recent years, single-vision spectacle lenses, which are spectacle lenses with dioptric power (also referred to as "prescribed lenses" hereinafter), are also used as the spectacle lenses to be fitted into the aforesaid wraparound spectacle frame. However, if single-vision spectacle lenses (prescribed lenses) designed without considering the front angle is simply fitted into a spectacle frame having large front angle, such as the aforesaid wraparound spectacle frame, since prismatic effect, astigmatism and mean power error (also referred to as "power error" hereinafter) felt by the eyes will change compared with the case where these lenses is fitted into a spectacle frame having no or vary small front angle, the spectacle wearer will feel severe discomfort. To solve such problem, the following methods have been conventionally used: (1) increasing the curve of the lenses in order to reduce the prismatic effect felt by the eyes caused due to the lenses being tilted to the outside; (2) adding a correction prism to the lenses in order to offset the extra prismatic effect caused by the front line-of-sight; (3) correcting the shape of the back surfaces (concave surfaces) of the lenses in order to remove the astigmatism and the mean power error felt by the eyes when viewing objects in front line-of-sight; and (4) forming the back surfaces of the lenses into an aspherical shape so as to reduce the astigmatism and the mean power error felt by the eyes in the area excluding the front line-of-sight (see, for example, Patent document 1). By using these methods, the discomfort felt by the spectacle wearer can be reduced to some extent.

PRIOR ART DOCUMENTS

Patent Documents

Patent document 1: Japanese Unexamined Patent Application Publication No. 2005-284059

DISCLOSURE OF THE INVENTION

Problems to be Solved by the Invention

However, even if a pair of spectacles is configured by fitting the prescribed lenses designed and produced using the aforesaid methods (1) to (4) into a frame having large front angle, the spectacle wearer will still feel discomfort.

In view of the above problems, it is an object of the present invention to provide a spectacle lens having an excellent vision without feeling discomfort even the lens is a prescribed lens fitted into a frame having large front angle, as well as a method and a device for designing such a spectacle lens.

Means for Solving the Problems

Focusing on the reasons why the feeling of discomfort of the spectacle wearer can not be removed even by using the aforesaid conventional methods, the inventor of the present application has performed an examination by studying the line-of-sight direction. The examination will be described below with reference to the attached drawings.

FIG. 24 is a view showing the line-of-sight direction of the eyes in the case of a pair of single-vision spectacle lenses designed based on an assumption that the lenses are to be fitted into a frame having no front angle. Here, the description given here is based on a case where the left and right single-vision spectacle lenses are spherical lenses having the same positive dioptric power, and the prismatic power of each lens is 0.00Δ.

Incidentally, in the attached drawings for describing the spectacle lens (i.e., FIGS. 24 to 26, FIG. 1, FIG. 8, and FIG. 18), the suffix "R" in the numerals of the components means that the components are associated with right eye, and the suffix "L" in the numerals of the components means that the components are associated with left eye. Each of the aforesaid drawings is made when viewing a horizontal cross section passing through the fitting points $P_L$, $P_R$ of the left and right lenses (the fitting points are identical to the respectively prism reference points in the case of a pair of single-vision lenses) from above. Further, although the aforesaid drawings showing a case where the pantoscopic angle of each the left and right lenses is zero degree, obviously the present invention can be also applied to a case where the pantoscopic angle of each the left and right lenses is not zero degree; and in such a case, the influence of the front angle exerted on the line-of-sight direction will also be caused to horizontal component of the line-of-sight.

Note that the eyes 30L, 30R and their rotation centers 31L, 31R shown in the aforesaid drawings are respectively eyes and rotation centers assumed in optical design of the lenses, and the positional relation between the eyes 30 and the lenses is set based on the information about the pupil distance of the spectacle wearer, the shape of the spectacle frame, and the like.

Further, the left and right line-of-sights respectively passing through the rotation centers 31L, 31R of the eyes when viewing distant objects with the naked eyes are called "reference front line-of-sights 40L, 40R"; and the aforesaid drawings illustrate a case where the left and right reference front line-of-sights 40L, 40R extend in parallel with each other in the horizontal direction, and respectively pass through the fitting points of the respective lenses.

As shown in FIG. 24, the left spectacle lens 15L and the right spectacle lens 15R are arranged based on an assumption in optical design so that the fitting points $P_L$, $P_R$ on the lens front surfaces (convex surfaces) of the left spectacle lens 15L and the right spectacle lens 15R are situated in the reference front line-of-sights 40L, 40R respectively passing through the rotation centers 31L, 31R of the eyes, and so that, in the horizontal cross sections passing through the fitting points $P_L$, $P_R$, the normal lines N of the lens front surfaces at the fitting points $P_L$, $P_R$ are identical to the reference front line-of-sights 40L, 40R. Here, a horizontal line orthogonal to the reference front line-of-sights 40L, 40R at the fitting points $P_L$, $P_R$ of the left and right lenses is a straight line L.

Incidentally, in the description of the present invention, angles $\theta_{LF}$ in the horizontal direction between the reference front line-of-sights 40L, 40R and the normal lines N on the lens front surfaces at the fitting points $P_L$, $P_R$ are called "lens front angles", which are differentiated from the "front angle" defined for the spectacle frame. Further, a state where the normal lines N are identical to the reference front line-of-sights 40L, 40R in the horizontal cross sections passing through the fitting points $P_L$, $P_R$ (i.e., a state where the lens front angles are zero degree) is also expressed in terms of "having no lens front angle"; and a state where the normal lines N intersect with the reference front line-of-sights 40L, 40R in the horizontal cross sections passing through the fitting points $P_L$, $P_R$ so that the normal lines N each form a finite angle not equal to zero toward the outside in the horizontal direction is also expressed in terms of "having lens front angle".

In FIG. 24, arrows $a_L$, $b_L$ and $c_L$ represent the line-of-sights of the left eye 30L, arrows $a_{Le}$, $b_{Le}$ and $c_{Le}$ represent image side line-of-sights (i.e., the line-of-sights extending from the rotation center 31L of the eye to the lens 15L) of the respective line-of-sights, and arrows $a_{Lo}$, $b_{Lo}$ and $c_{Lo}$ represent object side line-of-sights (i.e., the line-of-sights extending from the lens 15L to the outside) of the respective line-of-sights. Similarly, arrows $a_R$, $b_R$ and $c_R$ represent the line-of-sights of the right eye 30R, arrows $a_{Re}$, $b_{Re}$ and $c_{Re}$ represent image side line-of-sights of the respective line-of-sights, and arrows $a_{Ro}$, $b_{Ro}$ and $c_{Ro}$ represent object side line-of-sights of the respective line-of-sights.

As shown in FIG. 24, when viewing objects in front vision, the position and direction of the line-of-sight $b_L$ passing through the rotation center 31L of the left eye 30L and the position and direction of the line-of-sight $b_R$ passing through the rotation center 31R of the right eye 30R are respectively identical to the position and direction of the reference front line-of-sight 40L and the position and direction of the reference front line-of-sight 40L.

Further, when viewing objects in peripheral view, due to the prismatic effect of the lenses 15L, 15R, the object side line-of-sights $a_{Lo}$, $a_{Ro}$ corresponding to the image side line-of-sights $a_{Le}$, $a_{Re}$ tilted from the reference front line-of-sights 40L, 40R toward the left side by an angle of θ degrees are refracted toward the reference front line-of-sights 40L, 40R. Similarly, due to the prismatic effect of the lenses 15L, 15R, the object side line-of-sights $c_{Lo}$, $c_{Ro}$ corresponding to the image side line-of-sights $c_{Le}$, $c_{Re}$ tilted from the reference front line-of-sights 40L, 40R toward the right side by an angle of θ degrees are refracted toward the reference front line-of-sights 40L, 40R.

Further, in the case where there is no lens front angle and where the left and right lenses are spherical lenses of the same power, the direction of the line-of-sight after being refracted with respect to the image side line-of-sight of the left eye will be identical to the direction of the line-of-sight after being refracted with respect to the image side line-of-sight of the right eye if the image side line-of-sight of the left eye and the image side line-of-sight of the right eye have the same direction. In other words, if the image side line-of-sight $a_{Le}$ and the image side line-of-sight $a_{Re}$ have the same direction, the direction of the object side line-of-sight $a_{Lo}$ will be identical to the direction of the object side line-of-sight $a_{Ro}$; and if the image side line-of-sight $c_{Le}$ and the image side line-of-sight $c_{Re}$ have the same direction, the direction of the object side line-of-sight $c_{Lo}$ will be identical to the direction of the object side line-of-sight $c_{Ro}$.

In contrast, the line-of-sight directions obtained in the case where the same lenses 15L, 15R are fitted into a frame having large front angle are shown in FIG. 25. In FIG. 25, like components are denoted by like reference numerals as of FIG. 24, and the explanation thereof will be omitted. When being fitted into the frame, the left and right lenses 15L, 15R are respectively tilted toward the outside in the horizontal direction (i.e., the left and right lenses 15L, 15R each have lens front angle), and therefore when viewing objects in front view, object side line-of-sights $b_{Lo}'$, $b_{Ro}'$ of line-of-sights $b_L'$, $b_R'$ will each be subjected to a prismatic effect that refracts the line-of-sight toward the outside (i.e., the side of the ears), so that left and right line-of-sights $b_{Lo}'$, $b_{Ro}'$ will have different directions.

Compared with FIG. 24, when viewing objects in peripheral vision, an object side line-of-sight $a_{Lo}'$ of the left eye 30L corresponding to an image side line-of-sight $a_{Le}'$ tilted from the reference front line-of-sight. 40L toward the left side by an angle of θ degrees is subjected to a prismatic effect that refracts the line-of-sight toward the outside (i.e., the side of the left ear), and an object side line-of-sight $a_{Ro}'$ of the right eye 30R corresponding to an image side line-of-sight $a_{Re}'$ tilted from the reference front line-of-sight 40R toward the left side by an angle of θ degrees is subjected to a prismatic effect that refracts the line-of-sight toward the side of the reference front line-of-sight 40R (i.e., the side of the right ear). Similarly, compared with FIG. 24, an object side line-of-sight $c_{Lo}'$ of the left eye 30L corresponding to an image side line-of-sight $c_{Le}'$ tilted from the reference front line-of-sight 40L toward the right side by an angle of θ degrees is subjected to a prismatic effect that refracts the line-of-sight toward the side of the reference front line-of-sight 40L (i.e., the side of the left ear), and an object side line-of-sight $c_{Ro}'$ of the right eye 30R corresponding to an image side line-of-sight $c_{Re}'$ tilted from the reference front line-of-sight 40R toward the right side by an angle of θ degrees is subjected to a prismatic effect that refracts the line-of-sight toward outside (i.e., the side of the right ear). Thus, in the case where there is lens front angle, the directions of the line-of-sights after being refracted with respect to the image side line-of-sights of the left and right eyes are divergent from each other, instead of being identical to each other, if the image side line-of-sights of the left and right eyes have the same direction. In other words, if the image side line-of-sight $a_{Le}'$ and the image side line-of-sight $a_{Re}'$ have the same direction, the direction of the object side line-of-sight $a_{Lo}'$ will be different from the direction of the object side line-of-sight $a_{Ro}'$; and if the image side line-of-sight $c_{Le}'$ and the image side line-of-sight $c_{Re}'$ have the same direction, the direction of the object side line-of-sight $c_{Lo}'$ will be different from the direction of the object side line-of-sight of-sight $c_{Ro}'$.

In contrast, FIG. 26 shows the line-of-sight directions obtained in the case where a pair of lenses 25L, 25R corrected by the aforesaid conventional methods (1) to (4) are fitted into a frame having the same front angle as FIG. 25.

In FIG. 26, like components are denoted by like reference numerals as of FIGS. 24 and 25, and the explanation thereof will be omitted. The lenses 25L, 25R are lenses corrected by: employing lenses having a large base curve, adding a correction prism to the lenses in order to offset the extra prismatic effect caused by the line-of-sight when viewing objects in front view, correcting the back surfaces of the lenses so as to remove the astigmatism and the mean power error felt by the line-of-sight of the eye when viewing objects in front view, and forming the back surfaces of the lenses into an aspherical shape so as to reduce the astigmatism and the mean power error felt by the eyes in the area excluding the line-of-sight when viewing objects in front view. In the lenses 25L, 25R corrected by the aforesaid methods, since the correction prism is added, although the positions of the object side line-of-sights $b_{Lo}''$, $b_{Ro}''$ of the line-of-sights $b_L''$, $b_R''$ when viewing objects in front view are shifted toward the outside (i.e., the side of the ears) respectively from the reference front line-of-sights 40L, 40R, the directions of the object side line-of-sights $b_{Lo}''$, $b_{Ro}''$ are parallel to the reference front line-of-sights 40L, 40R.

Further, when viewing objects in peripheral vision, since the lenses having a large base curve are employed, the prismatic effect, particularly the prismatic effect in peripheral portion, is reduced compared with the case of FIG. 25. In other words, compared with the case of FIG. 25, the directions of object side line-of-sights $a_{Lo}''$, $a_{Ro}''$, $c_{Lo}''$, $c_{Ro}''$ corresponding to image side line-of-sights $a_{Le}''$, $a_{Re}''$, $c_{Le}''$, $c_{Re}''$ tilted from the reference front line-of-sights 40L, 40R toward the left side and right side by an angle of θ degrees are closer to the directions of the object side line-of-sights of FIG. 24. However, similar to the case of FIG. 25, the object side line-of-sights corresponding to the image side line-of-sights of the left and right eyes are divergent from each other, instead of being identical to each other, if the image side line-of-sight of the left eye and the image side line-of-sight of the right eye have the same direction. In other words, when viewing objects in peripheral vision, the direction of the object side line-of-sight $a_{Lo}''$ and the direction of the object side line-of-sight $a_{Ro}''$ are different from each other; and the direction of the object side line-of-sight $c_{Lo}''$ and the direction of the object side line-of-sight $c_{Ro}''$ are different from each other. FIGS. 27A and 27B show an example of a prismatic effect exerted on the eyes calculated based on the lens shown in FIG. 26 which has been corrected by the conventional methods (wherein the lens is a single-vision lens whose data is: base curve is 8.50D; spherical power is +4.00D; center thickness is 8 mm; and prismatic power is 0Δ), wherein FIG. 27A shows a prismatic effect in horizontal direction undergone by a ray passing through the rotation center, and FIG. 27B shows a prismatic effect in vertical direction undergone by the ray passing through the rotation center. These drawings are viewed from the back surface of the left lens, so that the right side is the nose side, and the left side is the ear side. As can be known from these drawings, the prismatic effect, particularly the prismatic effect in horizontal direction, of the lens is largely unbalanced between left side and the right side.

Thus, even being corrected by the conventional methods, there is still difference of the prismatic effect undergone by the line-of-sight when looking in peripheral vision between the left eye and the right eye, and therefore the prism balance felt by the eyes is lost, which is the cause of the severe discomfort felt by the wearer.

The above description is based on a case where the image side line-of-sight of the left eye and the image side line-of-sight of the right eye when seeing objects in front view or in peripheral vision are parallel to each other; however, obviously the same phenomenon may also be observed in a case where the object to be gazed is positioned a predetermined distance away from the wearer.

Based on the above knowledge, the present inventor considers that the cause of the discomfort felt by the wearer is that the conventional methods are designed to reduce the astigmatism and power error when looking in peripheral vision, but not to reduce the imbalance of the prismatic effect between left eye and the right eye; and therefore the present inventor has made the present invention, focusing on reducing the imbalance of the prismatic effect between left eye and the right eye.

In view of the above problems, a method according to a first aspect of the present invention is adapted to create shape data of a spectacle lens to be fitted into a spectacle frame in a state where there is lens front angle, wherein the spectacle lens has dioptric power. The method comprises a step for creating initial lens shape data by which the shape of a lens front surface and the shape of a lens back surface is determined, and a lens back surface shape data correcting step for correcting the shape data of the lens back surface with respect to the created initial lens shape data.

The lens back surface shape data correcting step comprises a prismatic effect correcting step for correcting the shape data of the lens back surface so that the prismatic effect undergone via the lens of initial lens shape by a plurality of rays passing through a rotation center of the eye assumed in optical design in a state where there is lens front angle is identical or close to the prismatic effect undergone via the lens of initial lens shape by the plurality of rays passing through the rotation center of the eye assumed in optical design in a state where there is no lens front angle, wherein the plurality of rays include a ray in a front view direction.

According to a second aspect of the present invention, in the method according to the first aspect of the present invention, the prismatic effect correcting step comprises: a direction correcting step for correcting the direction of the lens back surface relative to the lens front surface so that the prismatic effect undergone via the lens of initial lens shape by the ray in the front view direction passing through the rotation center of the eye assumed in optical design in a state where there is lens front angle is identical to the prismatic effect undergone via the lens of initial lens shape by the ray in the front view direction passing through the rotation center of the eye assumed in optical design in a state where there is no lens front angle, and a shape correcting step for correcting the shape data of the lens back surface obtained after performing the direction correcting step so that the prismatic effect undergone via the lens of the lens shape after direction correcting step by one or more rays passing through the rotation center of the eye assumed in optical design in a state where there is lens front angle is identical or close to the prismatic effect undergone via the lens of initial lens shape by the one or more rays passing through the rotation center of the eye assumed in optical design in a state where there is no lens front angle, wherein the one or more rays exclude the ray in the front view direction.

A method according to a third aspect of the present invention is adapted to create shape data of a spectacle lens to be fitted into a spectacle frame in a state where there is lens front angle, wherein the spectacle lens has dioptric power. The method comprising a step for creating initial lens shape data by which the shape of a lens front surface and the shape of a lens back surface is determined, and a lens back surface shape data correcting step for correcting the shape data of the lens back surface with respect to the created initial lens shape data.

The lens back surface shape data correcting step comprises a prismatic effect correcting step for correcting the shape data of the lens back surface so that the prismatic effect undergone via the lens of initial lens shape by a plurality of rays passing through an entrance pupil center of the eye when viewing objects in front vision assumed in optical design in a state where there is lens front angle is identical or close to the prismatic effect undergone via the lens of initial lens shape by the plurality of rays passing through the entrance pupil center of the eye when viewing objects in front vision assumed in optical design in a state where there is no lens front angle, wherein the plurality of rays include a ray in the front view direction.

According to a fourth aspect of the present invention, in the method according to the third aspect of the present invention, the prismatic effect correcting step comprises a direction correcting step for correcting the direction of the lens back surface relative to the lens front surface so that the prismatic effect undergone via the lens of initial lens shape by the ray in the front view direction passing through the entrance pupil center of the eye when viewing objects in front vision assumed in optical design in a state where there is lens front angle is identical to the prismatic effect undergone via the lens of initial lens shape by the ray in a front view direction passing through the entrance pupil center of the eye when viewing objects in front vision assumed in optical design in a state where there is no lens front angle, and a shape correcting step for correcting the shape data of the lens back surface obtained after performing the direction correcting step so that the prismatic effect undergone via the lens of the lens shape after direction correcting step by one or more rays passing through the entrance pupil center of the eye when viewing objects in front vision assumed in optical design in a state where there is lens front angle is identical or close to the prismatic effect undergone via the lens of initial lens shape by the one or more rays passing through the entrance pupil center of the eye when viewing objects in front vision assumed in optical design in a state where there is no lens front angle, wherein the one or more rays exclude the ray in the front view direction.

According to a fifth aspect of the present invention, in the method according to any one of the first to fourth aspects of the present invention, lens back surface shape data correcting step comprises a dioptric power correcting step for correcting the shape data of the lens back surface so that, in a state where the lens having a lens shape obtained after performing the prismatic effect correcting steps has lens front angle, the power of the light acting on the eye in a state where the line-of-sight extends from the rotation center of the eye assumed in optical design to power measurement position of the lens is identical to a prescription value.

According to a sixth aspect of the present invention, in the method according to any one of the first to fifth aspects of the present invention, the prismatic effect correcting step is adapted to correct the shape data of the lens back surface so that the prismatic effect in horizontal direction undergone via the lens of initial lens shape by the plurality of rays passing through the rotation center of the eye assumed in optical design in a state where there is lens front angle is identical or close to the prismatic effect in horizontal direction undergone via the lens of initial lens shape by the plurality of rays passing through the rotation center of the eye assumed in optical design in a state where there is no lens front angle, wherein the plurality of rays include the ray in the front view direction.

A device according to a seventh aspect of the present invention is adapted to create shape data of a spectacle lens to be fitted into a spectacle frame in a state where there is lens front angle, wherein the spectacle lens has dioptric power. The device comprises: a section for creating initial lens shape data by which the shape of a lens front surface and the shape of a lens back surface is determined and a lens back surface shape data correcting section for correcting the shape data of the lens back surface with respect to the created initial lens shape data.

The lens back surface shape data correcting section comprises a prismatic effect correcting section for correcting the shape data of the lens back surface so that the prismatic effect undergone via the lens of initial lens shape by a plurality of rays passing through a rotation center of the eye or an entrance pupil center of the eye when viewing objects in front vision assumed in optical design in a state where there is lens front angle is identical or close to the prismatic effect undergone via the lens of initial lens shape by the plurality of rays passing through the rotation center of the eye or the entrance pupil center of the eye when viewing objects in front vision assumed in optical design in a state where there is no lens front angle, wherein the plurality of rays include a ray in a front view direction.

A spectacle lens according to an eighth aspect of the present invention is adapted to be fitted into a spectacle frame in a state where there is lens front angle, wherein the spectacle lens has dioptric power. The spectacle lens comprises: a lens front surface which is a spherical surface or a rotationally symmetric aspherical surface, and a lens back surface which is a bilaterally asymmetrical aspherical surface or atoroidal surface having been subjected to shape correction so as to reduced imbalance of the prismatic effect between left side and right side and increase astigmatism and mean power error, wherein surface mean power of the lens back surface in a horizontal cross section passing through a fitting point of the lens front surface changes more largely on the ear side than on the nose side relative to the fitting point.

Advantages of the Invention

According to the present invention, like the spectacle lens fitted into a spectacle frame having large front angle, in a prescribed lens fitted into a spectacle frame in a state where there is lens front angle, since correction is performed so that the prismatic effect undergone by the line-of-sights excluding the line-of-sight in the front view direction is identical or close to the prismatic effect of the spectacle lens fitted into a spectacle frame in a state where there is no lens front angle, the bias of the prismatic effect distribution caused by the lens front angle is reduced, and therefore the discomfort felt by the wearer can be reduced.

Further, since correction is performed so that the prismatic effect undergone by the rays excluding the ray in the front view direction passing through the center of the entrance pupil of the eye when seeing objects in front view is identical or close to the prismatic effect of the spectacle lens fitted into a spectacle frame in a state where there is no lens front angle, the distortion resulting from the lens front angle can be corrected. Thus, the wearer can obtain a good vision with no feeling of discomfort.

BRIEF DESCRIPTION OF DRAWINGS

FIGS. 2D to 2F are views for explaining the prismatic effect of the lens shown in FIGS. 2A to 2C when the lens is tilted by 15 degrees, wherein FIG. 2A and FIG. 2D are contour maps of the prismatic effect in horizontal direction undergone by a ray passing through the rotation center, and FIG. 2B and FIG. 2D are contour maps of the prismatic effect in vertical direction undergone by the ray passing through the rotation center;

FIGS. 3A to 3F are contour maps showing the optical performance of the single-vision spherical lens whose prescription power includes no cylindrical power according to the first embodiment of the present invention, wherein FIG. 3A is a contour map of the prismatic effect in horizontal direction undergone by a ray passing through the rotation center, FIG. 3B is a contour map of the prismatic effect in vertical direction undergone by the ray passing through the rotation center, FIG. 3C is a contour map of the surface astigmatism of the lens front surface, FIG. 3D is a contour map of the surface mean power of the lens front surface, FIG. 3E is a contour map of the surface astigmatism of the lens back surface, and FIG. 3F is a contour map of the surface mean power of the lens back surface;

FIGS. 4D to 4F are views for explaining the prismatic effect of the lens shown in FIGS. 4A to 4C when the lens is tilted by 15 degrees, wherein FIG. 4A and FIG. 4D are contour maps of the prismatic effect in horizontal direction undergone by a ray passing through the rotation center, and FIG. 4B and FIG. 4E are contour maps of the prismatic effect in vertical direction undergone by the ray passing through the rotation center;

FIGS. 5A to 5F are contour maps showing the optical performance of the single-vision spherical lens whose prescription power includes cylindrical power according to the first embodiment of the present invention, wherein FIG. 5A is a contour map of the prismatic effect in horizontal direction undergone by a ray passing through the rotation center, FIG. 5B is a contour map of the prismatic effect in vertical direction undergone by the ray passing through the rotation center, FIG. 5C is a contour map of the surface astigmatism of the lens front surface, FIG. 5D is a contour map of the surface mean power of the lens front surface, FIG. 5E is a contour map of the surface astigmatism of the lens back surface, and FIG. 5F is a contour map of the surface mean power of the lens back surface;

FIGS. 9D to 9F are views for explaining the prismatic effect of the lens shown in FIGS. 9A to 9C when the lens is tilted by 15 degrees, wherein FIG. 9A and FIG. 9D are contour maps of the prismatic effect in horizontal direction undergone by a ray passing through the center of the entrance pupil, and FIG. 9B and FIG. 4E are contour maps of the prismatic effect in vertical direction undergone by the ray passing through the center of the entrance pupil;

FIGS. 10A to 10F are contour maps showing the optical performance of the single-vision spherical lens whose prescription power includes no cylindrical power according to the second embodiment of the present invention, wherein FIG. 10A is a contour map of the prismatic effect in horizontal direction undergone by a ray passing through the center of the entrance pupil, FIG. 10B is a contour map of the prismatic effect in vertical direction undergone by the ray passing through the center of the entrance pupil, FIG. 100 is a contour map of the surface astigmatism of the lens front surface, FIG. 10D is a contour map of the surface mean power of the lens front surface, FIG. 10E is a contour map of the surface astigmatism of the lens back surface, and FIG. 10F is a contour map of the surface mean power of the lens back surface;

FIGS. 11D to 11F are views for explaining the prismatic effect of the lens shown in FIGS. 11A to 11C when the lens is tilted by 15 degrees, wherein FIG. 11A and FIG. 11D are contour maps of the prismatic effect in horizontal direction undergone by a ray passing through the center of the entrance pupil, and FIG. 11B and FIG. 11E are contour maps of the prismatic effect in vertical direction undergone by the ray passing through the center of the entrance pupil;

FIGS. 12A to 12F are contour maps showing the optical performance of the single-vision spherical lens whose prescription power includes cylindrical power according to the second embodiment of the present invention, wherein FIG. 12A is a contour map of the prismatic effect in horizontal direction undergone by a ray passing through the center of the entrance pupil, FIG. 12B is a contour map of the prismatic effect in vertical direction undergone by the ray passing through the center of the entrance pupil, FIG. 12C is a contour map of the surface astigmatism of the lens front surface, FIG. 12D is a contour map of the surface mean power of the lens front surface, FIG. 12E is a contour map of the surface astigmatism of the lens back surface, and FIG. 12F is a contour map of the surface mean power of the lens back surface;

FIGS. 14C and 14D are contour maps of the prismatic effect of the lens shown in FIGS. 14A and 14B when the lens is tilted by 15 degrees, wherein FIG. 14A and FIG. 14C are contour maps of the prismatic effect in horizontal direction undergone by a ray passing through the rotation center, and FIG. 14B and FIG. 14D are contour maps of the prismatic effect in vertical direction undergone by the ray passing through the rotation center;

FIGS. 15A to 15F are contour maps showing the optical performance of a progressive addition spectacle lens whose prescription power includes no cylindrical power according to a third embodiment of the present invention, wherein FIG. 15A is a contour map of the prismatic effect in horizontal direction undergone by a ray passing through the rotation center, FIG. 15B is a contour map of the prismatic effect in vertical direction undergone by the ray passing through the rotation center, FIG. 15C is a contour map of the surface astigmatism of the lens front surface, FIG. 15D is a contour map of the surface mean power of the lens front surface, FIG. 15E is a contour map of the surface astigmatism of the lens back surface, and FIG. 15F is a contour map of the surface mean power of the lens back surface;

FIGS. 16C and 16D are contour maps of the prismatic effect of the lens shown in FIGS. 16A and 16B when the lens is tilted by 15 degrees, wherein FIG. 16A and FIG. 16C are contour maps of the prismatic effect in horizontal direction undergone by a ray passing through the rotation center, and FIG. 16B and FIG. 16D are contour maps of the prismatic effect in vertical direction undergone by the ray passing through the rotation center;

FIGS. 17A to 17F are contour maps showing the optical performance of a progressive addition spectacle lens whose prescription power includes cylindrical power according to the third embodiment of the present invention, wherein FIG. 17A is a contour map of the prismatic effect in horizontal direction undergone by a ray passing through the rotation center, FIG. 17B is a contour map of the prismatic effect in vertical direction undergone by the ray passing through the rotation center, FIG. 17C is a contour map of the surface astigmatism of the lens front surface, FIG. 17D is a contour map of the surface mean power of the lens front surface, FIG. 17E is a contour map of the surface astigmatism of the lens back surface, and FIG. 17F is a contour map of the surface mean power of the lens back surface;

FIGS. 19C and 19D are contour maps of the prismatic effect of the lens shown in FIGS. 19A and 19B when the lens is tilted by 15 degrees, wherein FIG. 19A and FIG. 19C are contour maps of the prismatic effect in horizontal direction undergone by a ray passing through the rotation center, and FIG. 19B and FIG. 19D are contour maps of the prismatic effect in vertical direction undergone by the ray passing through the rotation center;

FIGS. 20A to 20F are contour maps showing the optical performance of a lens according to the fourth embodiment of the present invention, the lens being a single-vision minus lens whose prescription power includes no cylindrical power and whose deviation amount removal rate of the prismatic effect is 100%, wherein FIG. 20A is a contour map of the prismatic effect in horizontal direction undergone by a ray passing through the rotation center, FIG. 20B is a contour map of the prismatic effect in vertical direction undergone by the ray passing through the rotation center, FIG. 20C is a contour map of the surface astigmatism of the lens front surface, FIG. 20D is a contour map of the surface mean power of the lens front surface, FIG. 20E is a contour map of the surface astigmatism of the lens back surface, and FIG. 20F is a contour map of the surface mean power of the lens back surface;

FIGS. 21A to 21F are contour maps showing the optical performance of a lens according to the first embodiment of the present invention, the lens being a single-vision minus lens whose prescription power includes no cylindrical power and whose deviation amount removal rate of the prismatic effect is 50%, wherein FIG. 21A is a contour map of the prismatic effect in horizontal direction undergone by a ray passing through the rotation center, FIG. 21B is a contour map of the prismatic effect in vertical direction undergone by the ray passing through the rotation center, FIG. 21C is a contour map of the surface astigmatism of the lens front surface, FIG. 21D is a contour map of the surface mean power of the lens front surface, FIG. 21E is a contour map of the surface astigmatism of the lens back surface, and FIG. 21F is a contour map of the surface mean power of the lens back surface;

FIGS. 27A and 27B are views showing the optical performance of the spectacle lens whose shape has been corrected according to the conventional art, wherein FIG. 27A is a contour map of the prismatic effect in horizontal direction undergone by a ray passing through the rotation center, and FIG. 27B is a contour map of the prismatic effect in vertical direction undergone by the ray passing through the rotation center.

BEST MODES FOR CARRYING OUT THE INVENTION

Embodiments for carrying out the present invention (referred to as "embodiments" hereinafter) will be described below; however, it should be understood that the present invention is not limited to the configurations of these embodiments. The description will be made in the following order:

1. First embodiment (an example of correcting imbalance of the prismatic effect resulting from the lens front angle, with respect to the principal fixation line, so as to create the lens shape data, wherein the lens is a single-vision spectacle lens, and the initial lens shape is spherical)

(1) First evaluation example (an example of a single-vision lens whose prescription power includes no cylindrical power)

(2) Second evaluation example (an example of a single-vision lens whose prescription power includes cylindrical power)

2. Second embodiment (an example of correcting distortion resulting from the lens front angle when viewing objects in front view, so as to create the lens shape data, wherein the lens is a single-vision spectacle lens)

(1) First evaluation example (an example of a single-vision lens whose prescription power includes no cylindrical power)

(2) Second evaluation example (an example of a single-vision lens whose prescription power includes cylindrical power)

3. Third embodiment (an example of correcting imbalance of the prismatic effect resulting from the lens front angle, with respect to the principal fixation line, so as to create the lens shape data, wherein the lens is a progressive addition spectacle lens)

(1) First evaluation example (an example of a progressive addition lens whose prescription power includes no cylindrical power)

(2) Second evaluation example (an example of a progressive addition lens whose prescription power includes cylindrical power)

4. Fourth embodiment (an example of correcting imbalance of the prismatic effect resulting from the lens front angle, with respect to the principal fixation line, so as to create the lens shape data, wherein the lens is a single-vision spectacle lens, and the initial lens shape is aspherical)

(1) First evaluation example (an example of a single-vision lens whose prescription power includes no cylindrical power, in a case where the deviation amount removal rate of the prismatic effect is set to 100%)

(2) Second evaluation example (an example of a single-vision lens whose prescription power includes no cylindrical power, in a case where the deviation amount removal rate of the prismatic effect is set to 50%)

1. First Embodiment

Figure 6:
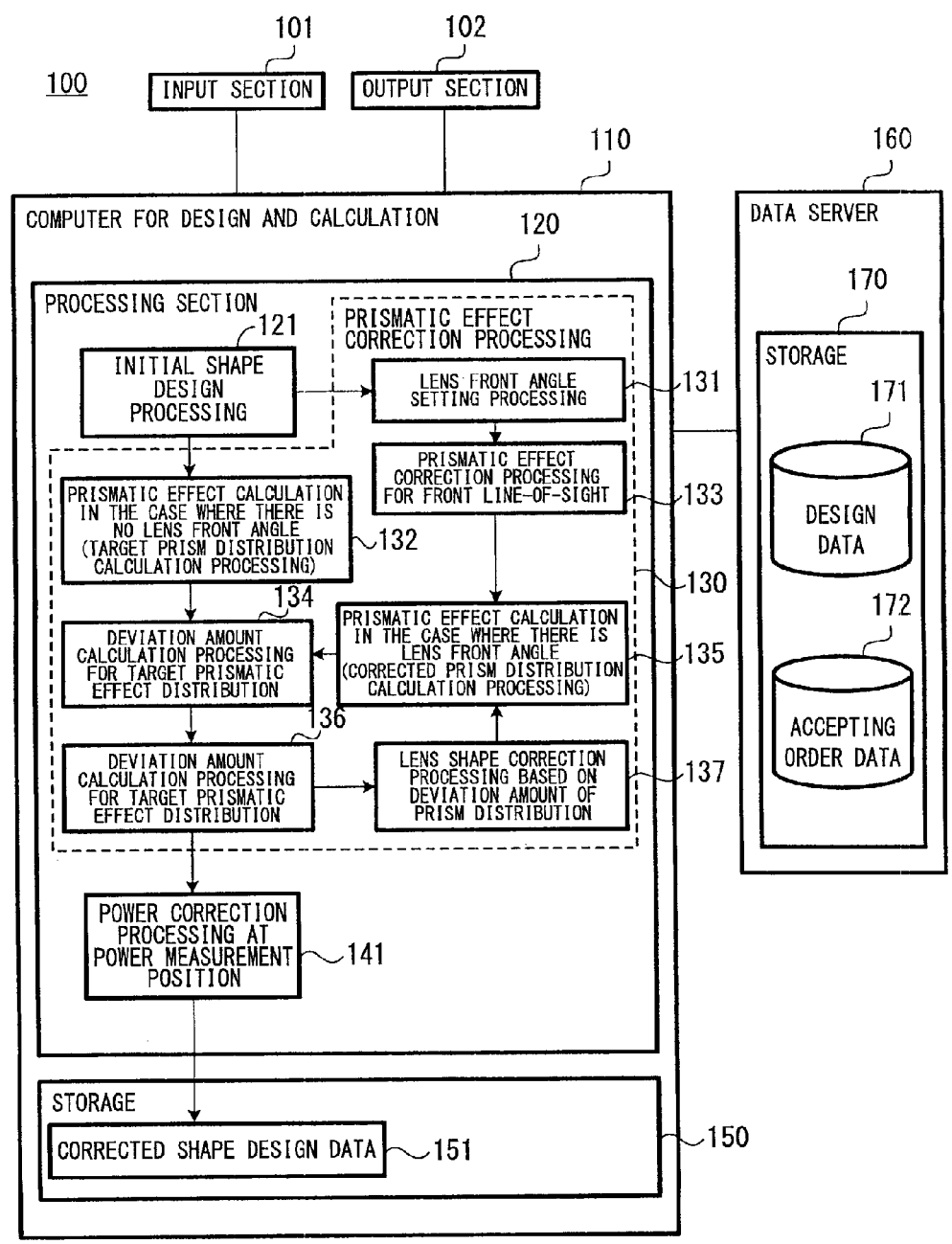
FIG. 6 is a block diagram showing a device for designing a spectacle lens according to embodiments of the present invention.

A first embodiment shows an example in which shape data of a single-vision spectacle lens is created by a method of correcting the imbalance of the prismatic effect resulting from the lens front angle, with respect to the principal fixation line, so as to create the lens shape data. First, a lens shape data creating device 100, to which a lens shape data creating method according to the present embodiment is suitable to be applied, will be described below with reference to FIG. 6. FIG. 6 is a block diagram showing the function of the lens shape data creating device 100.

The lens shape data creating device 100 at least includes a computer 110 for design and calculation, an input section 101, an output section 102 that includes a display, a printer and the like, and a data server 160, wherein the computer 110 for design and calculation is adapted to perform design and calculation process, the input section 101 is adapted to input design conditions and the like to the computer 110 for design and calculation, and operate the design conditions and the like, the output section 102 is adapted to output processing results, and the data server 160 is adapted to store the data necessary for performing design and the designed lens shape data therein.

The data necessary for performing and the lens shape data calculated by the computer 110 for design and calculation are stored in a storage 170 of the data server 160. For example, accepting order data 172 (which is the specification of the lens) and design data 171 (which includes the initial lens shape data calculated by the computer 110 for design and calculation, and the shape data obtained after performing various kinds of correction process) are stored in the storage 170. Here, the accepting order data 172 includes, for example, spectacle lens information, spectacle frame information, prescription value, layout information and the like. The spectacle lens information includes lens material, refractive index, type of the optical design of the lens front surface and lens back surface, lens outer diameter, lens thickness, edge thickness, decentering, base curve, shape data of semifinished lens blank, and the like. The spectacle frame information includes frame size, frame curve, shape of lens shape, frame shape measured by a frame tracer, and the like. The prescription value includes spherical power, cylindrical power, cylinder axis, prismatic power, addition power and the like. The layout information includes pupil distance, near pupil distance, segment position, eye point position and the like. The computer 110 for design and calculation is connected with the data server 160, so that it is possible for the computer 110 for design and calculation to read necessary information from the data server 160 when creating the lens shape data, and transmit the created lens shape data.

The computer 110 for design and calculation includes a processing section 120 adapted to perform design and calculation process, and a storage 150 adapted to store the corrected lens shape data therein.

The processing section 123 includes an initial shape design processing section 121, a prismatic effect correction processing section 130, and a power correction processing section 141.

Based on the accepting order data 172, the initial shape design processing section 121 performs an arithmetic processing to create the initial lens shape data in a case where the front angle of the spectacle frame is not considered (i.e., in a case where there is no lens front angle).

The prismatic effect correction processing section 130 performs an arithmetic processing to correct the initial lens shape data created by the initial shape design processing section 121 based on the prismatic effect.

The power correction processing section 141 performs an arithmetic processing to correct the lens shape based on the dioptric power of the light acting on the eyes in a line-of-sight passing through the eyeball rotation center assumed in optical design and the power measurement position, in a state where there is lens front angle. The details of each processing section will be described later.

The lens shape data (such as initial lens shape data, shape data obtained after performing prismatic effect correcting steps, and shape data obtained after performing power correcting process) created by the processing section 120 is stored in the storage 150, and suitably transmitted to the data server 160 so as to be stored in the storage 170 as the design data 171. Incidentally, the various functions and instruments of the lens shape data creating device 100 may also be suitably divided or integrated.

Next, the method of creating the lens shape data with the lens shape data creating device 100 will be described below.

Figure 7:
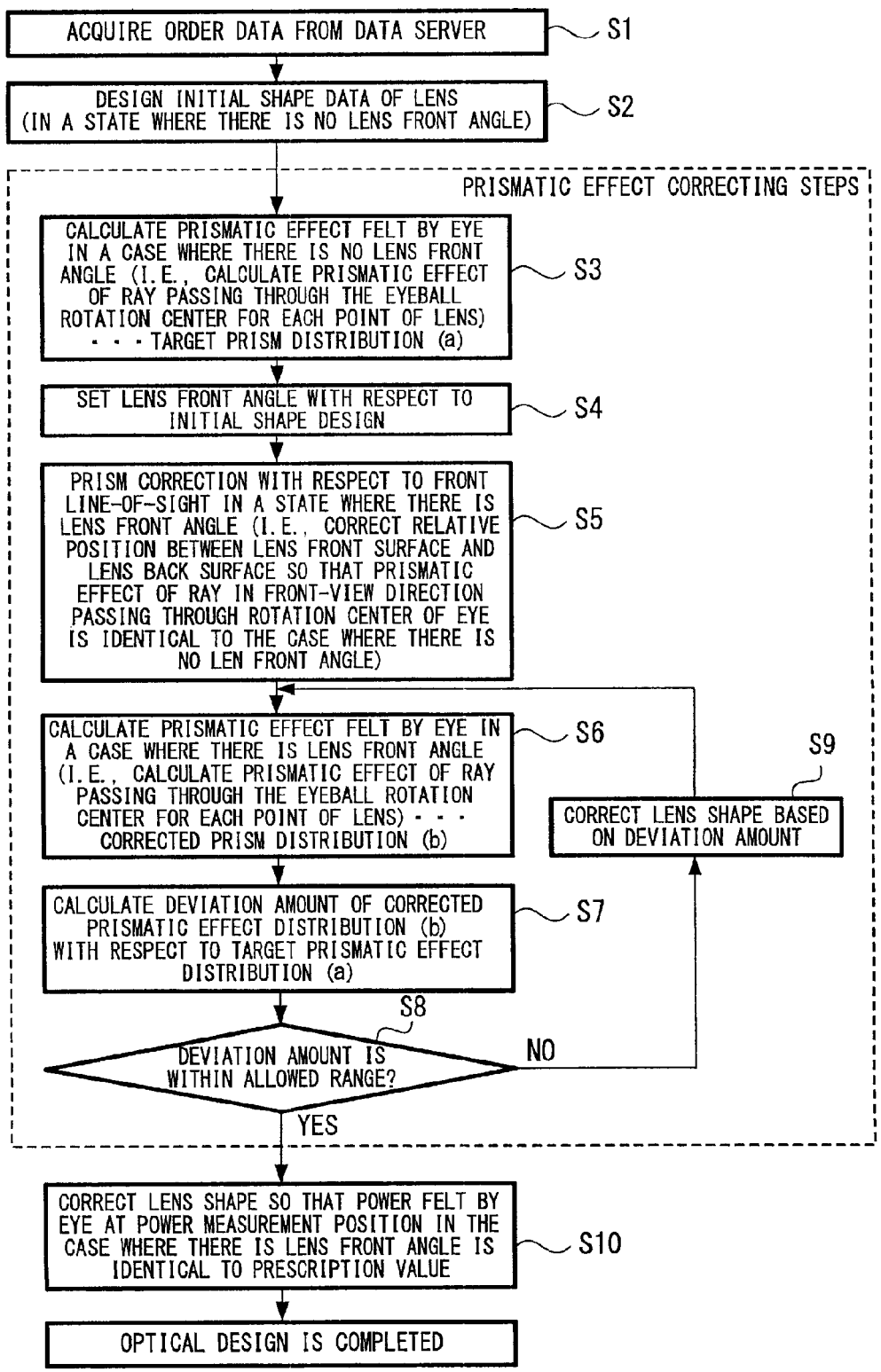
FIG. 7 is a flowchart showing a method for designing a spectacle lens according to the first embodiment of the present invention.

FIG. 7 is a flowchart for explaining the method of creating the lens shape data of the spectacle lens according to the first embodiment.

The method of creating the lens shape data of the spectacle lens includes initial lens shape data creating steps (steps S1 and S2) for acquiring data necessary to create the initial lens shape data, and lens back surface shape data correcting steps (steps S3 to S10) for correcting the lens back surface shape data of the created initial lens shape data. The lens back surface shape data correcting steps include prismatic effect correcting steps (steps S3 to S9) for performing correction based on the prismatic effect undergone via the lens by the ray passing through the eyeball rotation center assumed in optical design, and a dioptric power correcting step (step S10) for performing correction based on the dioptric power of the light acting on the eyes in a line-of-sight passing through the eyeball rotation center assumed in optical design and the power measurement position.

First, the content of the orders received from customers (such as spectacles stores, ophthalmologists and the like) who place the order are stored in the storage 170 of the data server 160 as the accepting order data 172.

The processing section 120 of the computer 110 for design and calculation acquires the information necessary to create the lens shape data of the spectacle lens from the accepting order data (the frame information, the lens information, the prescription value, and the layout information) 172 stored in the storage 170 of the data server 160.

Based on the acquired information, the initial shape design processing section 121 creates the initial lens shape data that satisfies the condition associated with the shape of desired lens front surface (such as the base curve, the shape of the lens front surface of the semifinished lens blank to be used) and that can obtain desired prescription value in a state where there is no lens front angle (step S2). In the initial lens shape data, at least the data associated with the shape of the lens front surface, the shape of the lens back surface, and the relative positions and directions of the lens front surface and lens back surface are defined. Thereafter, correction of the shape data of the lens back surface is performed on the initial lens shape data. Incidentally, in this example, the description is made based on a case where the initial lens shape data is: the front surface is a spherical surface, and the back surface is a spherical surface or toroidal surface.

Figure 1A:
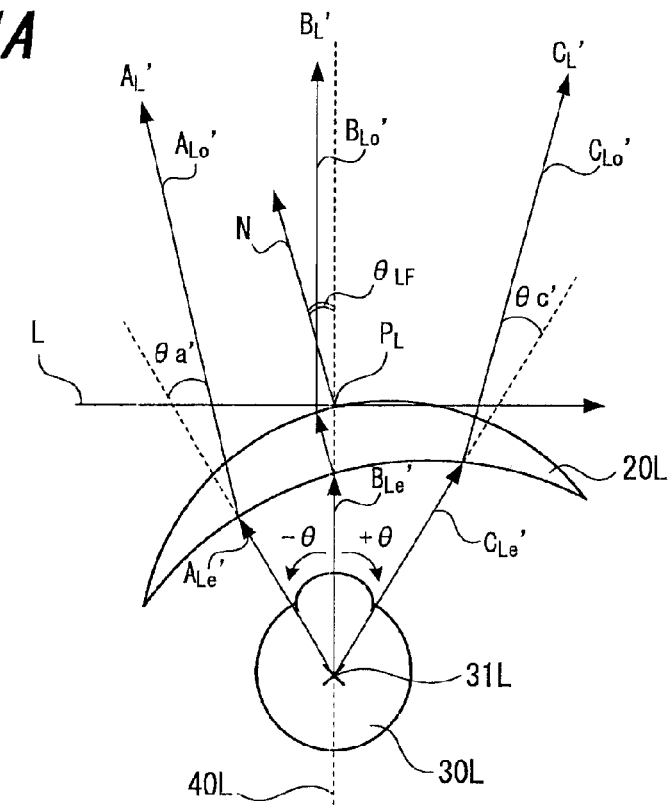
FIG. 1A is a view for explaining the prismatic effect of a spectacle lens according to a first embodiment of the present invention.
Figure 1B:
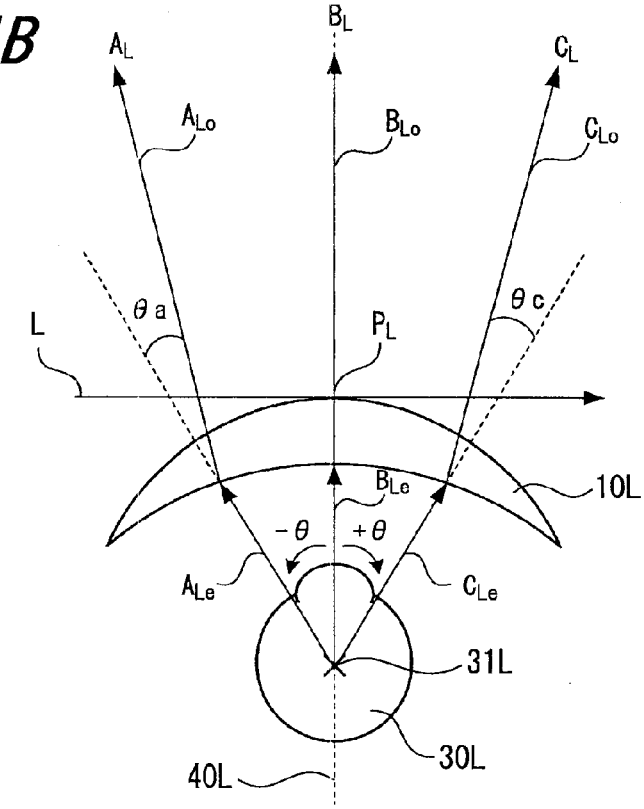
FIG. 1B is a view for explaining the prismatic effect of a spectacle lens in a state where there is no lens front angle.

First, in the lens initial shape obtained in step S2, the target prism distribution calculation processing section 132 calculates the prismatic effect undergone via the lens by the ray passing through the eyeball rotation center for each point of the lens, in a state where there is no lens front angle (step S3). In other words, first, a state where a lens of initial shape is arranged at a predetermined distance ahead of the eye without lens front angle is assumed in optical design so that the fitting point of the lens is situated in a reference front line-of-sight of the eye assumed in optical design (an example of the arrangement state of the eyeball and the lens assumed in optical design by step S3 is shown in FIG. 1B). The distance between the lens and the eye at this time may be set so that the distance between the lens back surface and the rotation center in the reference front line-of-sight becomes a predetermined value. Further, in the aforesaid arrangement state assumed in optical design, the prismatic effect undergone via the lens of initial lens shape by a plurality of rays passing through the rotation center of the eye is calculated, wherein the plurality of rays include the ray in the front view direction. The values of obtained prismatic effect at each point of the lens are regarded as a target prism distribution (a).

Next, the front angle setting processing section 131 sets a lens front angle with respect to the obtained lens initial shape (step S4). First, in step S4, the lens front angle, at which the lens obtained by edging the initial lens shape is fitted into a desired spectacle frame, is calculated based on the spectacle frame information and the layout information. Further, in the arrangement state assumed in optical design in step S3, a state where the lens of the initial shape is tilted toward the outside in the horizontal direction by the calculated lens front angle with the fitting point as the center is assumed in optical design.

Next, in a state where the lens of initial lens shape has lens front angle, the prismatic effect correction processing section 133 corrects, of the shape data of the lens back surface based on the prismatic effect undergone by the front line-of-sight (step S5). In other words, in step S5, the direction of the lens back surface relative to the lens front surface is corrected (referred to as "direction correcting step" hereinafter) so that the prismatic effect undergone via the lens by the ray in front-view direction passing through the rotation center of the eye in the arrangement state assumed in optical design in step S4 is identical to the prismatic effect undergone via the lens by the ray in front-view direction passing through the rotation center of the eye in the arrangement state assumed in optical design in step S3.

Next, a corrected prism distribution calculation processing section 135 calculates the prismatic effect in a state where there is lens front angle, with respect to the lens shape obtained after performing the direction correcting step in step S5 (step S6). In other words, in the arrangement state assumed in optical design in step S5, the prismatic effect undergone via the lens by one or more rays passing through the rotation center of the eye is calculated for each point of the lens, wherein the one or more rays exclude the ray in front-view direction. The obtained values become a corrected prismatic effect distribution (b).

Next, a deviation amount calculation processing section 134 calculates the deviation amount of the prismatic effect of the corrected prismatic effect distribution (b) obtained in step S6 with respect to the target prismatic effect distribution (a) obtained in step S3 for each pair of image side line-of-sights in the same direction (step S7).

Further, a deviation amount determination processing section 136 determines whether the deviation amount obtained in step S7 is within an allowed range (step S8). The deviation amount determination process can be performed by, for example, any one of the following methods: determining whether the deviation amount of each point of the lens is within a preset allowed range; determining whether the deviation amount of the sum of all points of the lens is within the preset allowed range; determining whether the sum of the deviation amount of each of the previously divided areas (for example, an area near the front vision and an area near the peripheral vision) is within the preset allowed range. Further, the preset allowed range may also be changed according to the area of the lens.

As the result of the deviation amount determination process, if the deviation amount is not within the allowed range, a lens shape correction processing section 137 will correct the lens shape of the back surface based on the deviation amount (step S9). The correction is performed by forming the lens back surface into an aspherical shape or an atoroidal shape.

Next, in step S6, the corrected prism distribution calculation processing section 135 calculates the corrected prismatic effect distribution with respect to the lens shape corrected in step S9. Incidentally, in the step S6 performed following step S5, the prismatic effect is calculated in the arrangement state assumed in optical design by step S5; while in the step S6 performed following step S9, the prismatic effect undergone via the lens by one or more rays passing through the rotation center of the eye is calculated for each point of the lens in the arrangement state assumed in optical design by step S9, wherein the one or more rays exclude the ray in front-view direction.

Thereafter, once again the deviation amount calculation processing section 134 calculates the difference between the target prismatic effect distribution (a) and the corrected prismatic effect distribution (b) re-calculated in step S6 after being corrected in step S9.

Steps S6 to S9 form a loop to be repeatedly executed until the deviation amount with respect to the target prismatic effect becomes within the allowed range. Further, when the deviation amount determination processing section 136 determines that the deviation amount is within the allowed range in step S8, the prismatic effect correcting process is ended, so that it is possible to obtain the design shape of a lens having reduced prismatic effect distribution bias.

In other words, lens shape data having the shape data of the lens back surface corrected after the direction correcting step can be obtained so that the prismatic effect undergone via the lens of the lens shape after direction correcting step by one or more rays passing through the rotation center of the eye assumed in optical design in a state where there is lens front angle is identical or close to the prismatic effect undergone via the lens of initial lens shape by the one or more rays passing through the rotation center of the eye assumed in optical design in a state where there is no lens front angle, wherein the one or more rays exclude the ray in the front view direction. Incidentally, it is preferred that the prismatic effect correction is mainly performed on the prismatic effect in horizontal direction undergone via the lens by the ray passing through the eyeball rotation center.

In the case where the initial shape is a spherical surface or a rotationally symmetric aspherical surface, the lens back surface corrected in the aforesaid manner is a bilaterally asymmetrical aspherical surface; while in the case where the initial shape is a toroidal surface or an atoroidal surface, the lens back surface corrected in the aforesaid manner is a bilaterally asymmetrical atoroidal surface.

Thereafter, the power correction processing section 141 corrects the shape data of the lens back surface so that, in a state where there is lens front angle, the dioptric power of the light acting on the eyes in a line-of-sight passing through the eyeball rotation center assumed in optical design and the power measurement position is identical to the prescription value (step S10). Incidentally, here, in lens shape data obtained after performing the prismatic effect correcting steps (steps S3 to S9), the shape data of the lens back surface is corrected so that the power of the light acting on the eye in a state where the line-of-sight extends from the rotation center of the eye to the power measurement position of the lens is identical to the prescription value, in a state where there is lens front angle, i.e., in the arrangement state assumed in optical design by step S9 (or in the arrangement state assumed in optical design by step S5 if step S9 has not been performed). The arrangement state assumed in optical design after performing the dioptric power correcting process is shown in FIG. 1A.

By the above steps, the correction of the shape data of the lens back surface is finished, and the creation of the lens shape data is completed.

Incidentally, in the aforesaid description, steps S4 to S5 are performed following step S3; however, step S3 and steps S4 to S5 may also be performed in parallel.

By performing the prismatic effect correcting process, the astigmatism and the power error of the lens acting on the eye in the state where there is lens front angle is increased compared with those before performing the prismatic effect correcting process; however, after the power correcting step (step S10), the lens back surface may also be formed into an aspherical surface or an atoroidal surface so as to reduce the increased astigmatism and power error. Incidentally, it is preferred that such correction is mainly performed on the peripheral portion around the front line-of-sight direction.

Another method for reducing the astigmatism and power error increased due to the prismatic effect correction is to deliberately leave a certain degrees of deviation amount of the corrected prismatic effect distribution (b) with respect to the target prismatic effect distribution (a), instead of completely removing the deviation amount. The method of leaving the deviation amount may be achieved by, for example, removing the deviation amount of the corrected prismatic effect distribution (b) firstly calculated in the step S6 following step S5 with respect to the target prismatic effect distribution (a) at a predetermined rate in the whole area of the lens (the predetermined rate will be referred to as "deviation amount removal rate" hereinafter). As a concrete example, the deviation amount removal rate may be set to 50% in the whole area of the lens. Further, the deviation amount removal rate may also be changed according to the position of the lens. For example, the deviation amount removal rate may be continuously changed from the area near the front vision (the area near the fitting point or prism reference point) to the area near the peripheral vision, so that the area near the front vision has smaller deviation amount removal rate, and the area near the peripheral vision has larger deviation amount removal rate. As a concrete example, the deviation amount removal rate may be changed in a range between 0% and 50% so that the deviation amount removal rate becomes gradually larger when going away from the fitting point in an area within a radius of 10 mm around the fitting point, and changed in a range between 50% and 100% so that the deviation amount removal rate becomes gradually larger when going away radially from the fitting point in an area more than 10 mm away from the fitting point.

The shape data of the spectacle lens of the first embodiment can be created by performing the above arithmetic processing. The spectacle lens of the present invention is produced based on the created lens shape data. The spectacle lens can be produced by, for example, cast polymerization molding to form a plastic lens. In such a case, the liquid material of the plastic lens is filled into a molding die and is cured in that state, and then the molding die is removed, wherein it is possible to either form a finished lens by setting the shape of the transfer surface for lens front surface, the transfer surface for lens back surface of the molding die, and the relative arrangement of the both transfer surfaces based on the lens shape data created according to the present invention, or form a semifinished lens blank by setting the shape of one transfer surface (for example, the transfer surface for lens front surface) based on the lens shape data created according to the present invention, and then cut and polish the optically unfinished surface based on the lens shape data to finish the lens. Further, it is also possible to form a lens blank with both optically unfinished surfaces, and then cut and polish the optically unfinished surfaces based on the lens shape data created according to the present invention to finish the lens. Further, the lens formed in the above manner is subjected to various kinds of surface treatment processes according to necessity, and then subjected to an edging process (edge grinding process) so as to form an lens shape according to the requirement of the received order, and then the lenses are fitted into a spectacle frame to form a pair of spectacles. Since these methods and devices are known arts, the description thereof will be omitted.

Next, the lens shape data created by the above method will be described below in further details.

FIG. 1A shows the line-of-sight direction in the arrangement state assumed in optical design in step S10, i.e., the line-of-sight direction in a state where a lens front angle is provided to a spectacle lens 20 having a lens shape obtained after performing dioptric power correcting process. FIG. 1B shows the line-of-sight direction in the arrangement state assumed in optical design in step S3, i.e., the line-of-sight direction in a state where no lens front angle is provided to a spectacle lens 10 of initial lens shape. In other words, the spectacle lens 20 shown in FIG. 1A is obtained by correcting the lens back surface of the lens 10 shown in FIG. 1B by the method of the present invention so as to improve the prismatic effect.

Incidentally, FIGS. 1A, 1B, 2A, 2B, 2C, 2D, 2E, 2F, 4A, 4B, 4C, 4D, 4E, 4F, SA, 8B, 9A, 9B, 9C, 9D, 9E, 9F, 11A, 11B, 11C, 17D, 11E, and 11F each show the line-of-sight direction of the spectacle lens for the Left eye; however, since the spectacle lens for the right eye has a configuration bilaterally symmetrical to the spectacle lens for the left eye and therefore has the same function effect as the spectacle lens for the left eye, illustration of the spectacle lens for the right eye will be omitted.

As shown in FIG. 1B, a left spectacle lens 10L is arranged based on an assumption in optical design so that a fitting point $P_L$ on the lens front surface of the left spectacle lens 10L is situated in a reference front line-of-sight 40L passing through a rotation center 31L of the eye; and at the same time, in a horizontal cross section passing through the fitting point $P_L$, a normal line N of the lens front surface at the fitting point $P_L$ is identical to the reference front line-of-sight 40L. The distance between the lens and the eye at this time is set so that the distance between the lens back surface and the rotation center 31L in the reference front line-of-sight 40L becomes a predetermined value.

Further, as shown in FIG. 1A, a left spectacle lens 20L is arranged based on an assumption in optical design so that a fitting point $P_L$ on the lens front surface of the left spectacle lens 20L is situated in the reference front line-of-sight 40L passing through the rotation center 31L of the eye; and at the same time, in the horizontal cross section passing through the fitting point $P_L$, the normal line N of the lens front surface at the fitting point $P_L$ intersects with the reference front line-of-sight 40L at a lens front angle $\theta_{LF}$.

Further, in FIG. 1B, arrows $A_L$, $B_L$ and $C_L$ represent the line-of-sights of the left eye 30L, arrows $A_{Le}$, $B_{Le}$ and $C_{Le}$ represent image side line-of-sights (i.e., the line-of-sights extending from the rotation center 31L of the eye to the lens 10L) of the respective line-of-sights, and arrows $A_L$, $B_{Lo}$ and $C_{Lo}$ represent object side line-of-sights (i.e., the line-of-sights extending from the lens 10L to the outside) of the respective line-of-sights. Similarly, in FIG. 1B, arrows $A_L'$, $B_L'$ and $C_L'$ represent the line-of-sights of the left eye 30L, arrows $A_{Le}'$, $B_{Le}'$ and $C_{Le}'$ represent image side line-of-sights (i.e., the line-of-sights extending from the rotation center 31L of the eye to the lens 20L) of the respective line-of-sights, and arrows $A_{Lo}'$, $B_{Lo}'$ and $C_{Lo}'$ represent object side line-of-sights (i.e., the line-of-sights extending from the lens 20L to the outside) of the respective line-of-sights. Here, the image side line-of-sights $B_{Le}$ and $B_{Le}'$ when viewing objects in front view are identical to the reference front line-of-sight 40L, the image side line-of-sights $A_{Le}$ and $A_{Le}'$ are tilted toward the left side by an angle of θ degrees with respect to the reference front line-of-sight 40L, and the image side line-of-sights $C_{Le}$ and $C_{Le}'$ are tilted toward the right side by an angle of θ degrees with respect to the reference front line-of-sight 40L.

By forming the lens back surface into an aspherical surface or an atoroidal surface, the prismatic effect of the spectacle lens 20 of the present embodiment shown in FIG. 1A undergone by the ray passing through the rotation center 31 of the eyeball 30 becomes equal to the prismatic effect of the lens, which has the initial lens shape in a state where lens front angle is not provided, shown in FIG. 1B undergone by the line-of-sight passing through the rotation center 31 of the eyeball 30, if the ray shown in FIG. 1A and the ray shown in FIG. 1B have the same line-of-sight direction. In other words, as shown in FIG. 1A, the back surface of the lens 20 is corrected so that the line-of-sight directions of the left-direction line-of-sight $A_L'$, the front-direction line-of-sight $B_L'$ and the right-direction line-of-sight $C_L'$ of the eye 30 on the outside of the lens 20 are substantially equal to the line-of-sight directions of the left-direction line-of-sight $A_L$, the front-direction line-of-sight $B_L$ and the right-direction line-of-sight $C_L$ on the outside of the lens 10L shown in FIG. 1B. Such correction is performed by adding a rotationally asymmetric aspherical element to the lens surface facing the eye.

To be specific, as shown in FIG. 1A, the position of the object side line-of-sight $B_{Lo}'$ of the line-of-sight (front line-of-sight) $B_L'$ is shifted from the position of the object side line-of-sight $B_{Lc}$ of the line-of-sight $B_L$ shown in FIG. 1B, but the direction of the object side line-of-sight $B_{Lo}'$ of the line-of-sight $B_L'$ is identical to the direction of the object side line-of-sight $B_{Lo}$ of the line-of-sight $B_L$. Further, if the angle between the image side line-of-sight $A_{Le}'$ and the object side line-of-sight $A_{Le}'$ of the line-of-sight $A_{Lo}$ shown in FIG. 1A is defined as angle $\theta_a'$, and the angle between the image side line-of-sight $A_{Le}$ and the object side line-of-sight $A_{Lo}$ of the line-of-sight $A_L$ shown in FIG. 1B is defined as angle $\theta_a$, the angle $\theta_a'$ will be substantially equal to the angle $\theta_a$. Similarly, if the angle between the image side line-of-sight $C_{Le}'$ and the object side line-of-sight $C_{Lo}'$ of the line-of-sight $C_L'$ shown in FIG. 1A is defined as angle $\theta_c'$, and the angle between the image side line-of-sight $C_{Le}$ and the object side line-of-sight $C_{Lo}$ of the line-of-sight $C_L$ shown in FIG. 1B is defined as angle $\theta_c$, the angle $\theta_c'$ will be substantially equal to the angle $\theta_c$. In other words, the directions of the object side line-of-sights $A_{Lo}'$, $C_{Lo}'$ shown in FIG. 1A are respectively identical to the directions of the object side line-of-sights $A_{Lo}$, $C_{Lo}$ shown in FIG. 1B.

Incidentally, in the case where the deviation amount removal rate is set to a value smaller than 100%, if the deviation amount removal rate is smaller, the angle $\theta_a'$ on the ear side will become smaller and consequently the difference between the angle $\theta_a'$ and angle $\theta_a$ will be increased, while the angle $\theta_c'$ on the nose side will become larger and consequently the difference between the angle $\theta_c'$ and angle $\theta_c$ will be increased. In other words, in the case where the lens is a plus lens, if the deviation amount removal rate is smaller, the object side line-of-sight $A_{Lo}'$ will be more tilted toward the ear side and consequently the direction of the object side line-of-sight $A_{Lo}'$ will be closer to the direction of the image side line-of-sight $A_{Le}'$, while the object side line-of-sight $C_{Lo}'$ will be more tilted toward the ear side and consequently the direction of the object side line-of-sight $C_{Lo}'$ will be farther away from the direction of the image side line-of-sight $C_{Le}'$. The case of a plus lens will be discussed later.

(1) First Evaluation Example (an Example of a Single-Vision Lens Whose Prescription Power Includes No Cylindrical Power)

A first evaluation example of a spectacle lens whose prismatic effect distribution is improved by the aforesaid lens shape data creating method will be described below. The first evaluation example is an example of creating the lens shape data of a single-vision lens by the aforesaid method, wherein data of the single-vision lens is: refractive index of the lens material is 1.5, base curve (referred to as "BC" hereinafter) is 8.50D, spherical power (referred to as "S" hereinafter) is +4.00D, center thickness (referred to as "CT" hereinafter) is 8 mm, and prismatic power is 0Δ (however, in the present example, both surfaces of the initial lens shape are spherical surfaces, and the lens back surface is formed into an aspherical surface by the method of the present invention).

Figure 2A:
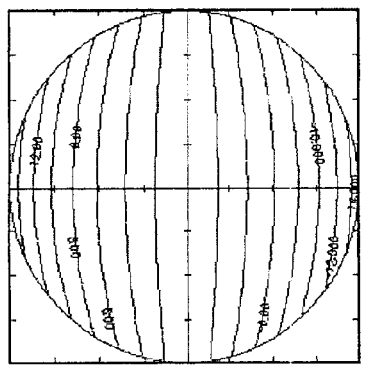
FIGS. 2A to 2C are views for explaining the prismatic effect of a single-vision spherical lens whose prescription power includes no cylindrical power.
Figure 2B:
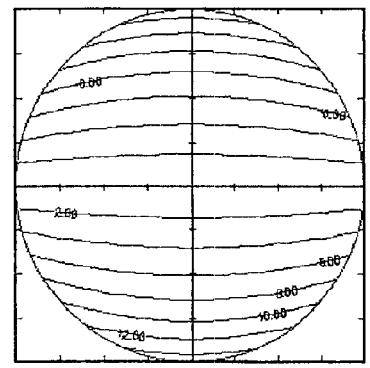
Figure 2C:
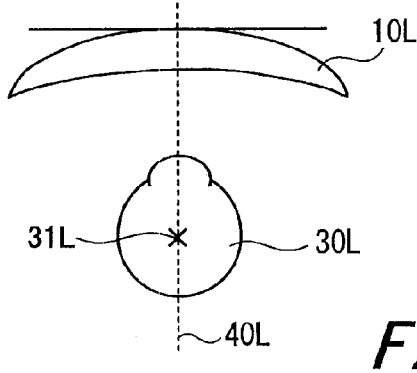

FIGS. 2A and 2B are each a contour map showing the prismatic effect distribution of the lens 10L of initial lens shape shown in FIG. 2C in the case where there is no lens front angle. Incidentally, the contour maps for expressing the prismatic effect distribution shown in the description of the present invention is expressed as coordinates (referred to as "reference spherical coordinates" hereinafter) obtained by projecting the coordinates on a sphere onto a plane perpendicular to the reference front line-of-sight, wherein the center of the sphere is the rotation center, and the radius of the sphere is the distance between the vertex of the surface of the lens facing the eye and the rotation center (expression area is within a circle having a diameter of 40 mm. FIGS. 2D, 2E, 3A, 3B, 4A, 4B, 4D, 4E, 5A, 5B, 9A, 9B, 9D, 9E, 10A, 10B, 11A, 11B, 11D, 11E, 12A, 12B, 14A, 14B, 14C, 14D, 15A, 15B, 16A, 16B, 16C, 16D, 17A, 17B, 19A, 19B, 19C, 19D, 20A, 20B, 21A, 21B, 27A and 27B are also contour maps similar to FIGS. 2A and 2B. Incidentally, FIGS. 2A, 2B, 2D, 2E, 3A, 3B, 4A, 4B, 4D, 4E, 5A, 5B, 9A, 9B, 9D, 9E, 10A, 10B, 11A, 11B, 11D, 11E, 12A, 12B, 19A, 19B, 19C, 19D, 20A, 20B, 21A, 21B, 27A and 27B are coordinates obtained by projecting the left spectacle lens from the back surface, so that the right side is the nose side, and the left side is the ear side. Further, FIGS. 14A, 14B, 14C, 14D, 15A, 15B, 16A, 16B, 16C, 16D, 17A and 17B are coordinates obtained by projecting the left spectacle lens from the front surface, so that the right side is the ear side, and the left side is the nose side. Further, the center of the coordinates expressing the prismatic effect distribution is either the fitting point in the case where the lens is a single-vision lens, or the prism reference point in the case where the lens is a progressive addition lens). FIG. 2A shows the prismatic effect in horizontal direction undergone by the ray passing through the rotation center, and FIG. 2B shows the prismatic effect in vertical direction undergone by the ray passing through the rotation center. It can be known that both the prismatic effect in horizontal direction and the prismatic effect in vertical direction are contour lines with substantially the same interval.

Figure 2D:
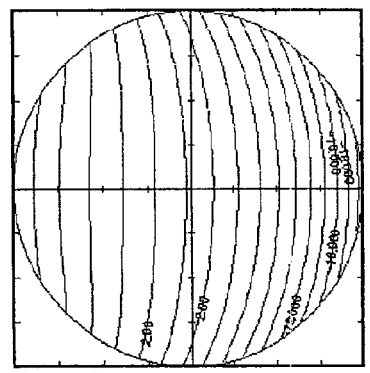
Figure 2E:
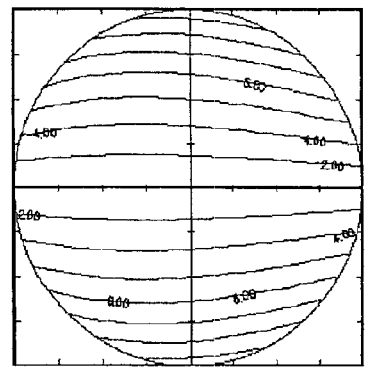
Figure 2F:
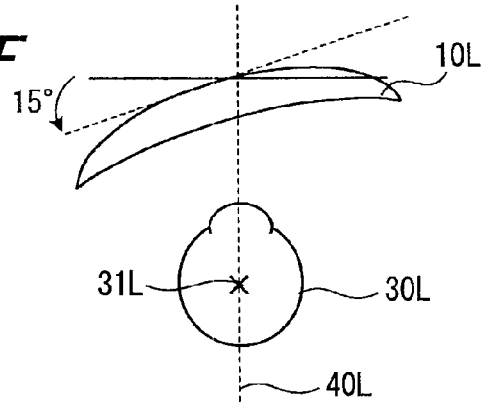

FIGS. 2D and 2E are each a contour map showing a prismatic effect distribution in the case where the lens 10L of initial lens shape shown in FIGS. 2A to 2C is simply tilted by 15 degrees in the horizontal direction with the fitting point as a center (i.e., in the case where the lens front angle is set to 15 degrees) as shown in FIG. 2F; and FIGS. 2D and 2E are each expressed as the reference spherical coordinates. FIG. 2D shows the prismatic effect in horizontal direction undergone by the ray passing through the rotation center, and FIG. 2E shows the prismatic effect in vertical direction undergone by the ray passing through the rotation center. The prismatic effect in vertical direction shown in FIG. 2E has no large difference from the case shown in FIG. 2B; however, in the prismatic effect in horizontal direction shown in FIG. 2D, since the lens 10 is tilted, the interval of the contour lines, particularly the interval of the contour lines in the peripheral portion, becomes uneven, and therefore the prism balance is lost.

Figure 3A:
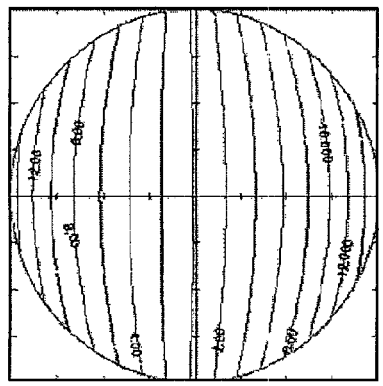
Figure 3B:
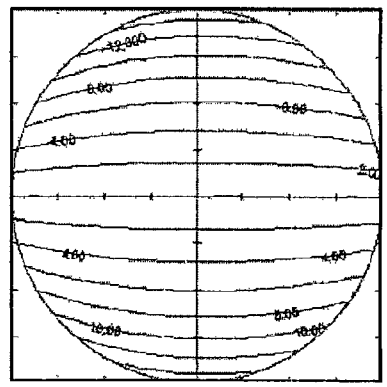
Figure 3C:
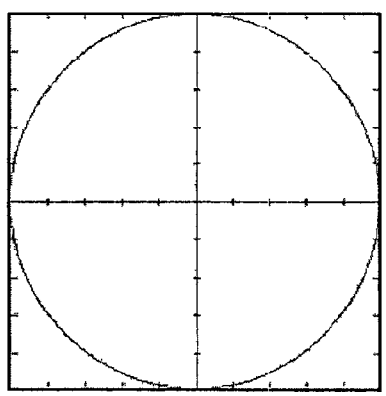
Figure 3D:
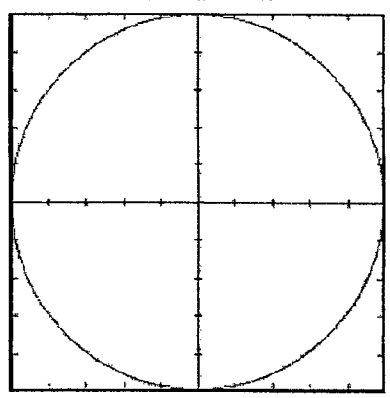
Figure 3E:
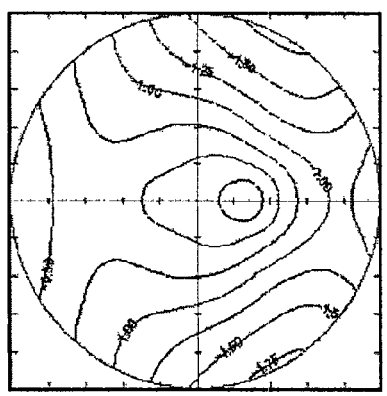
Figure 3F:
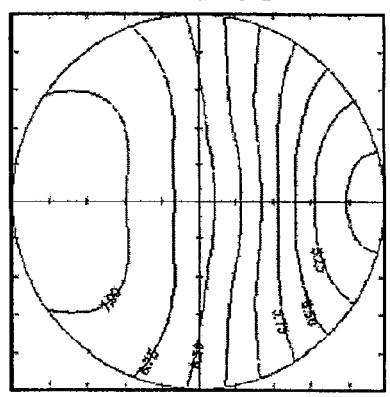

In contrast, optical performance evaluation results of a lens obtained by correcting the shape of the lens back surface from the initial lens shape by using the lens shape data creating method of the present invention are shown in FIGS. 3A to 3F, wherein FIG. 3A shows the prismatic effect in horizontal direction undergone by a ray passing through the rotation center, FIG. 3B shows the prismatic effect in vertical direction undergone by the ray passing through the rotation center, FIG. 3C shows the surface astigmatism of the lens front surface, FIG. 3D shows the surface mean power of the lens front surface, FIG. 3E shows the surface astigmatism of the lens back surface, and FIG. 3F shows the surface mean power of the lens back surface. Incidentally, the expression area of the coordinates expressing the surface astigmatism and the surface mean power discussed in the description of the present invention is within a circle having a diameter of 50 mm. FIGS. 3C, 3D, 5C, 5D, 10C, 10D, 12C, 12D, 20C, 20D, 20F, 21C, 21D and 21F are coordinates obtained by projecting the left spectacle lens from the back surface, so that the right side is the nose side, and the left side is the ear side. Further, FIGS. 14A, 14B, 14C 14D, 3E, 3F, 5E, 5F, 10E, 10F, 12E, 12F, 15C, 15D, 15F, 17C, 17B, 17C, 17D, 17E and 17F are coordinates obtained by projecting the left spectacle lens from the front surface, so that the right side is the ear side, and the left side is the nose side. Further, the center of the coordinates expressing the surface astigmatism and the surface mean power is either the fitting point in the case where the lens is a single-vision lens, or the prism reference point in the case where the lens is a progressive addition lens. In the lens having the lens back surface thereof corrected in the first evaluation example, the astigmatism and the mean power error can not be sufficiently controlled; however, as shown in FIG. 3A, the distribution bias of the prismatic effect in horizontal direction in the peripheral portion can be substantially removed, and therefore prism balance substantially identical to the prismatic effect in horizontal direction shown in FIG. 2A can be obtained. Further, as shown in FIG. 3F, the interval of the contour lines on the right side (the ear side) from the fitting point is smaller than that on the left side (the nose side), so that the surface mean power of the lens back surface in the horizontal cross section passing through the fitting point changes more largely on the ear side than on the nose side.

Thus, in the first evaluation example, by forming the lens back surface into an aspherical surface, the prismatic effect undergone via the lens by the ray in each line-of-sight direction becomes the same as a lens of initial lens shape. Thus, it is possible to almost remove the prism imbalance particularly in the peripheral portion.

In the present embodiment, since the distribution bias of the prismatic power is removed, the problems mentioned above can be improved. Thus, the wearer of a pair of spectacles mounted with such lenses can obtain a vision with no feeling of discomfort.

It is preferred that the process of forming the lens back surface into an aspherical surface by the aforesaid prismatic effect correcting steps is performed on the whole lens within the effective angle of view of the lens; however, such process may also be performed on a part of area depending on the intended use. For example, such process may be performed on a part of area on both the left and right sides. Particularly, it is preferred that such process is at least performed on the outer side area (i.e., the ear side area) where the deviation of the line-of-sight direction is serious.

Further, by also performing the following processes at the same time, it is possible to provide a spectacle lens with further less feeling of discomfort: increasing the base curve, when creating the initial lens shape data, so that the base curve becomes deeper than the curve typically set with respect to the prescription power; correcting the relative positions and directions of the lens front surface and the lens back surface (step S5) so that the prismatic effect in front-view direction is identical to the prismatic effect in the case where there is no lens front angle; correcting the lens back surface (step S10) so that the prescription power at the power measurement positions can be kept even in the case where a lens front angle is provided; and performing correction to reduce the mean power error and the astigmatism (particularly in the area near the front view direction) increased due to performing the prismatic effect correcting steps.

Since the spectacles configured by mounting the spectacle lens corrected in the above manner to a spectacle frame having a large front angle has a shape capable of covering the area surrounding the eyes (particularly the area on the outer sides of the eyes) as well as having a good vision, it is possible to provide a pair of prescription spectacles capable of keeping dust and wind out from the eyes and yet having excellent field of view.

(2) Second Evaluation Example (an Example of a Single-Vision Lens Whose Prescription Power Includes Cylindrical Power)

Described below is a second evaluation example in which the optical performance is evaluated in the case where the present invention was applied to a single-vision lens whose prescription power includes cylindrical power. The second evaluation example is an example of creating the lens shape data of a single-vision lens by the aforesaid method, wherein data of the single-vision lens is: refractive index of the lens material is 1.5, BC is 8.50D, S is +4.00D, cylindrical power (referred to as "C" hereinafter) is −2.00D, cylinder axis (referred to as "AX" hereinafter) is 45 degrees, CT is 8 mm, and prismatic power is 0Δ (however, in the present example, the front surface of initial lens shape is a spherical surface, the back surface of initial lens shape is a toroidal surface, and the lens back surface is formed into an atoroidal surface by the method of the present invention).

Figure 4A:
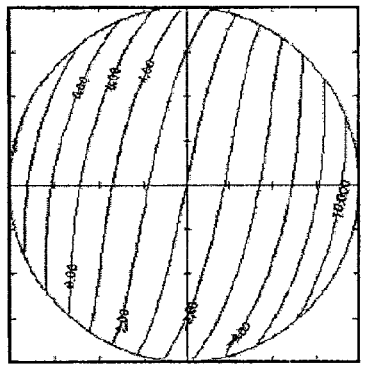
FIGS. 4A to 4C are views for explaining the prismatic effect of a single-vision spherical lens whose prescription power includes cylindrical power.
Figure 4B:
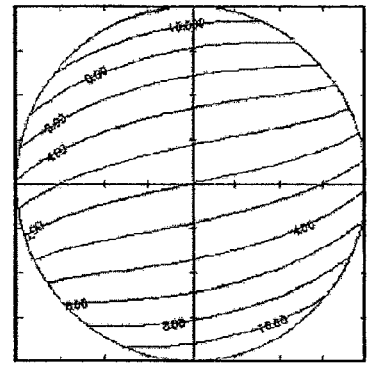
Figure 4C:
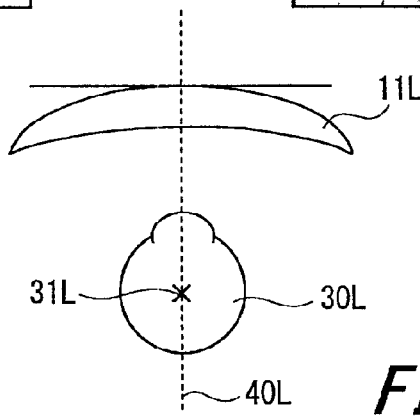
Figure 4D:
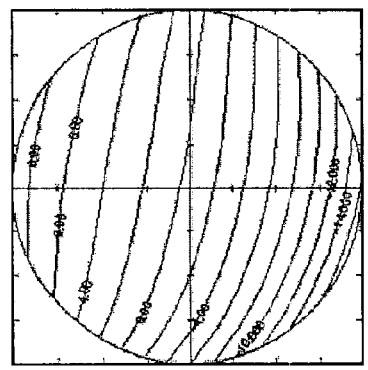
Figure 4E:
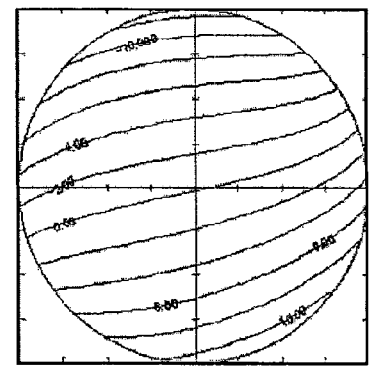
Figure 4F:
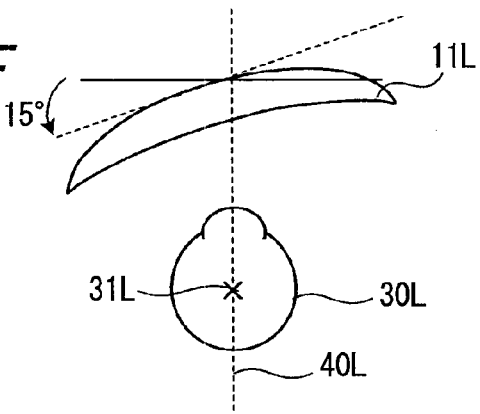

FIGS. 4A and 4B are each a contour map showing the prismatic effect distribution of a lens 11L of initial lens shape shown in FIG. 4C in the case where there is no lens front angle; and FIGS. 4A and 4B are each expressed as the reference spherical coordinates. FIG. 4A shows a prismatic effect in horizontal direction undergone by a ray passing through the rotation center, and FIG. 4B shows a prismatic effect in vertical direction undergone by the ray passing through the rotation center FIGS. 4D and 4E are each a contour map showing a prismatic effect distribution in the case where the lens 11L of initial lens shape shown in FIGS. 4A to 4C is simply tilted by 15 degrees in horizontal direction with the fitting point as a center (i.e., in the case where the lens front angle is set to 15 degrees) as shown in FIG. 4F; and FIGS. 4D and 4E are each expressed as the reference spherical coordinates. FIG. 4D shows the prism effect in horizontal direction undergone by a ray passing through the rotation center, and FIG. 4E shows the prism effect in vertical direction undergone by the ray passing through the rotation center.

It is known that, as shown in FIG. 4E, since the lens 11L is tilted, the distribution bias of the prismatic power in horizontal direction is caused in the peripheral portion.

Figure 5A:
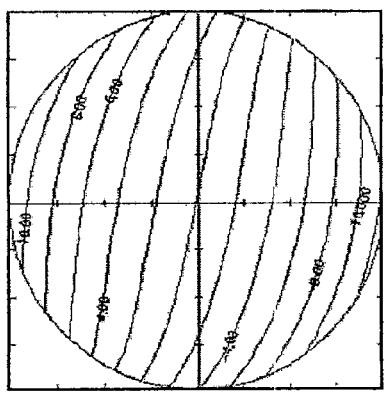
Figure 5B:
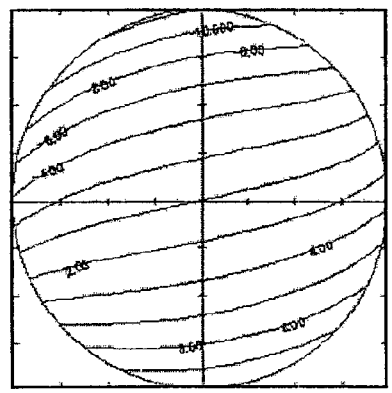
Figure 5C:
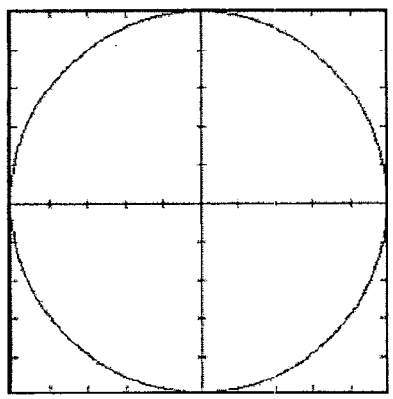
Figure 5D:
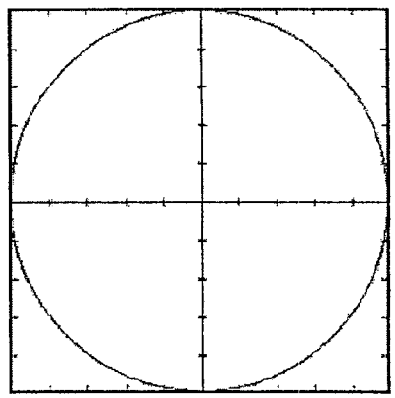
Figure 5E:
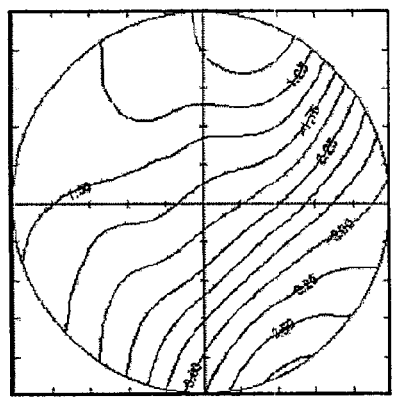
Figure 5F:
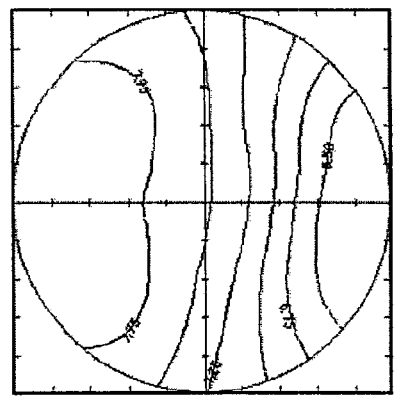

In contrast, optical performance evaluation results of a lens obtained by correcting the shape of the lens back surface from the initial lens shape using the lens shape data creating method of the present invention are shown in FIGS. 5A to 5F, wherein FIG. 5A shows the prismatic effect in horizontal direction undergone by a ray passing through the rotation center, FIG. 5B shows the prismatic effect in vertical direction undergone by the ray passing through the rotation center, FIG. 5C shows the surface astigmatism of the lens front surface, FIG. 5D shows the surface mean power of the lens front surface, FIG. 5E shows the surface astigmatism of the lens back surface, and FIG. 5F shows the surface mean power of the lens back surface.

In the lens having its lens back surface corrected in the first evaluation example, the astigmatism and the mean power error can not be sufficiently controlled; however, the distribution bias of prismatic effect in horizontal direction is significantly reduced, and Therefore it is possible to obtain a prismatic effect substantially identical to the optical performance shown in FIGS. 4A and 4B, where the lens is not tilted. Further, as shown in FIG. 5F, the interval of the contour lines on the right side (the ear side) from the fitting point is smaller than that on the left side (the nose side), so that the surface mean power of the lens back surface in the horizontal cross section passing through the fitting point changes more largely on the ear side from the fitting point than on the nose side.

Thus, the bias of the prism balance is removed by forming the lens back surface into an atoroidal surface, even if the spectacle lens includes cylindrical power such as lens in the second evaluation example. Thus, with a pair of spectacles configured by mounting such lenses to a frame having a large front angle, it is possible to obtain the same advantages as those obtained by the spectacles configured by using the lenses of the first evaluation example, in which the line-of-sight direction passing through the peripheral vision of the left lens and the line-of-sight direction passing through the peripheral vision of the right lens can be made substantially identical to each other, and therefore the discomfort felt by the wearer can be reduced.

2. Second Embodiment

A second embodiment shows an example in which the shape data of a single-vision spectacle lens is created by a method of correcting the distortion resulting from the lens front angle when viewing objects in front view to create the lens shape data.

A lens shape data creating device, to which a lens shape data creating method according to a second embodiment is suitable to be applied, differs from the lens shape data creating device 100, which has been described above with reference to FIG. 6, in that the processing method of the target prism distribution calculation processing section 132, the processing method of the corrected prism distribution calculation processing section 135 and the processing method of the lens shape correction processing section 137 based on the deviation amount are different, and these differences will be discussed later when describing the lens shape data creating method. However, the description of the like components and configurations will be omitted.

First, the method of creating the lens shape data with the lens shape data creating device 100 will be described below.

Figure 13:
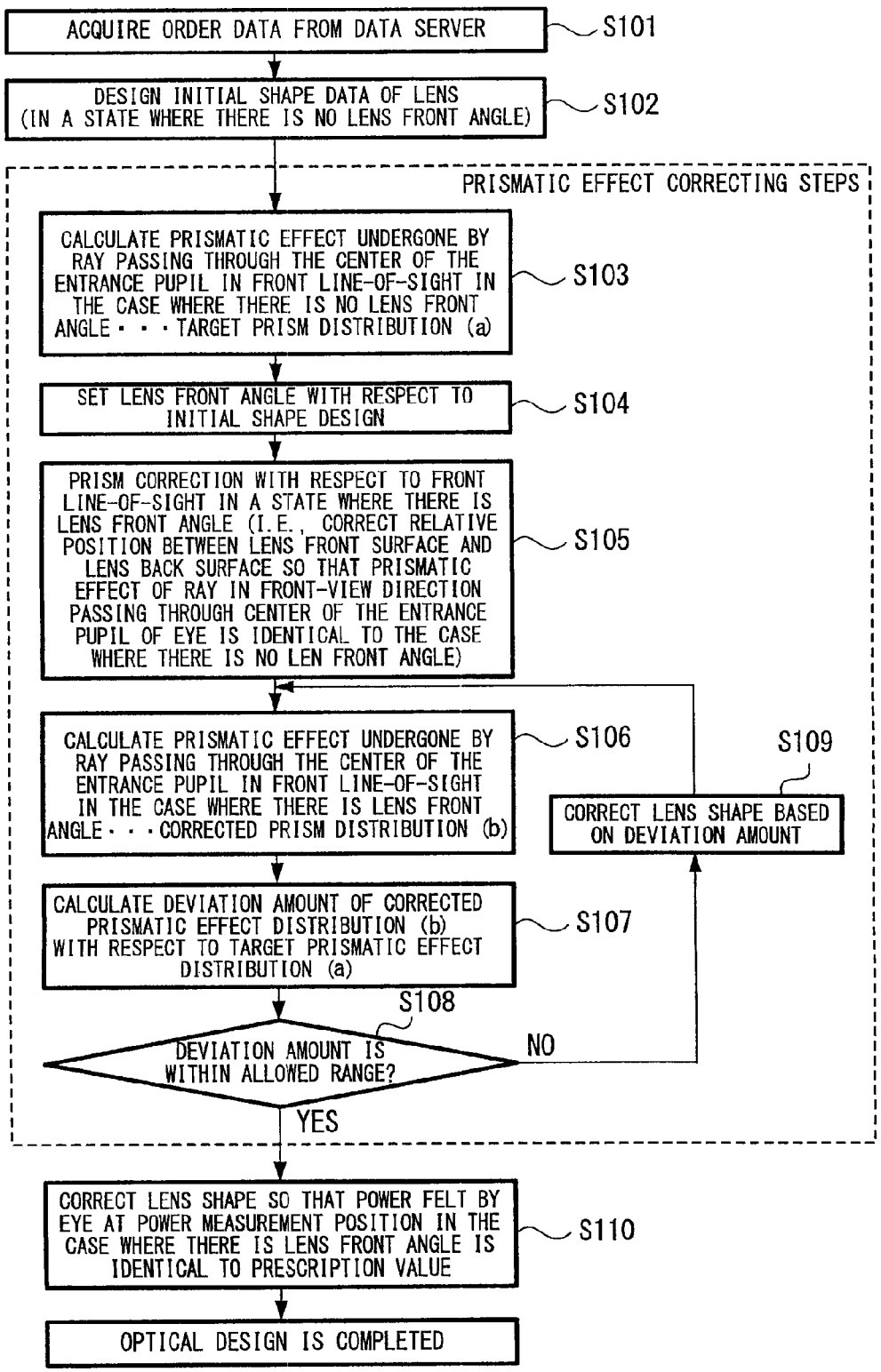
FIG. 13 is a flowchart showing a method for designing a spectacle lens according to the second embodiment of the present invention.

FIG. 13 is a flowchart for explaining the method of creating the lens shape data of the spectacle lens according to the second embodiment. Similar to the first embodiment, the method of creating the lens shape data of the spectacle lens includes initial lens shape data creating steps (steps S101 and S102) for acquiring data necessary to create the initial lens shape data, and lens back surface shape data correcting steps (steps S103 to S110) for correcting the lens back surface shape data of the created initial lens shape data. The lens back surface shape data correcting steps include prismatic effect correcting steps (steps S103 to S109) for performing correction based on the prismatic effect undergone via the lens by the ray passing through the center of the entrance pupil assumed in optical design, and a dioptric power correcting step (step S110) for performing correction based on the dioptric power of the light acting on the eyes in a line-of-sight passing through the eyeball rotation center assumed in optical design and the power measurement position.

Since the steps for creating the initial lens shape data (steps S101 and S102) are identical to steps S1 and S2 of the first embodiment, the description thereof will be omitted.

Thereafter, correction of the shape data of the lens back surface is performed on the initial lens shape data obtained in steps S101 and S102. Incidentally, in this example, the description is made based on a case where the initial lens shape data is: the front surface is a spherical surface, and the back surface is a spherical surface or toroidal surface.

With respect to the lens initial shape obtained in step S102, the target prism distribution calculation processing section 132 calculates the prismatic effect undergone by the ray entering the eye and passing through the center of the entrance pupil when viewing objects in front view for each point of the lens, in a state where there is no lens front angle (step S103). In other words, first, a state where a lens of the initial shape is arranged at a predetermined distance ahead of the eye without lens front angle is assumed in optical design so that the fitting point of the lens is situated in a reference front line-of-sight of the eye assumed in optical design (an example of the arrangement state of the eyeball and the lens assumed in optical design by step S103 is shown in FIG. 8B). The distance between the lens and the eye at this time may be set so that the distance between the lens back surface and the rotation center in the reference front line-of-sight becomes a predetermined value. Further, in the aforesaid arrangement state assumed in optical design, the prismatic effect undergone via the lens of initial lens shape by a plurality of rays passing through the center of the entrance pupil when viewing objects in the front view direction is calculated, wherein the plurality of rays include the ray in the front view direction. The values of the obtained prismatic effect at all points of the lens are regarded as a target prism distribution (a).

Next, the front angle setting processing section 131 sets a lens front angle with respect to the obtained lens initial shape (step S104). Since the details of setting the front angle are identical to those of the first embodiment, the description thereof will be omitted.

Next, the prismatic effect correction processing section 133 performs correction of the shape data of the lens back surface in a state where the lens of initial lens shape has a lens front angle, based on the prismatic effect undergone by the front line-of-sight (step S105). In other words, in step S105, the direction of the lens back surface relative to the lens front surface is corrected (referred to as "direction correcting step" hereinafter) so that the prismatic effect undergone via the lens by the ray in front-view direction passing through the center of the entrance pupil when viewing objects in front view in the arrangement state assumed in optical design in step S104 is identical to the prismatic effect undergone via the lens by the ray in front-view direction passing through the center of the entrance pupil when viewing objects in front view in the arrangement state assumed in optical design in step S103. Incidentally, when viewing objects in front view, since the ray in the front view direction passing through the center of the entrance pupil is identical to the ray in front-view direction passing through the rotation center of the eye in the first embodiment, step S105 is substantially identical to step S5 of the first embodiment.

Next, the corrected prism distribution calculation processing section 135 calculates the prismatic effect in a state where there is lens front angle, with respect to the lens shape obtained after performing the direction correcting step in step S105 (step S106). In other words, in the arrangement state assumed in optical design in step S105, the prismatic effect undergone via the lens by one or more rays passing through the center of the entrance pupil when viewing objects in front view is calculated for each point of the lens, wherein the one or more rays exclude the ray in front-view direction. The obtained values become a corrected prismatic effect distribution (b).

Next, the deviation amount calculation processing section 134 calculates the deviation amount of the prismatic effect of the corrected prismatic effect distribution (b) obtained in step S106 with respect to the target prismatic effect distribution (a) obtained in step S103 for each pair of image side line-of-sights in the same direction.

Further, the deviation amount determination processing section 136 determines whether the deviation amount obtained in step S107 is within an allowed range (step S108). The determination of the deviation amount is performed by determining whether the deviation amount of each point is within a preset allowed range. Incidentally, the allowed range may also be changed according to the area of the lens.

As the result of the deviation amount determination process, if the deviation amount is not within the allowed range, the lens shape correction processing section 137 will correct the lens shape of the back surface based on the deviation amount (step S109). The correction is performed by forming the lens back surface into an aspherical shape or an atoroidal shape.

Next, in step S106, the corrected prism distribution calculation processing section 135 calculates the corrected prismatic effect distribution with respect to the lens shape corrected in step S109. Incidentally, in the step S106 performed following step S105, the prismatic effect is calculated in the arrangement state assumed in optical design by step S5, while in the step S106 performed following step S109, the prismatic effect undergone via the lens by one or more rays passing through the center of the entrance pupil when viewing objects in front view is calculated for each point of the lens in the arrangement state assumed in optical design by step S9, wherein the one or more rays exclude the ray in front-view direction.

Thereafter, once again the deviation amount calculation processing section 134 calculates the difference between the target prismatic effect distribution (a) and the corrected prismatic effect distribution (b) re-calculated in step S106 after being corrected in step S109 to make determination.

Steps S106 to S109 form a loop to be repeatedly executed until the deviation amount with respect to the target prismatic effect becomes within the allowed range. Further, when determining that the deviation amount is within the allowed range, the deviation amount determination processing section 136 ends the prismatic effect correction, so that the design shape of a lens having corrected distortion when viewing objects in front view can be obtained.

In other words, lens shape data having the shape data of the lens back surface corrected after the direction correcting step can be obtained so that the prismatic effect undergone via the lens of the lens shape after direction correcting step by one or more rays passing through the center of the entrance pupil when viewing objects in front view assumed in optical design in a state where there is lens front angle is identical or close to the prismatic effect undergone via the lens of initial lens shape by the one or more rays passing through the center of the entrance pupil when viewing objects in front view assumed in optical design in a state where there is no lens front angle, wherein the one or more rays exclude the ray in the front view direction. Incidentally, it is preferred that the prismatic effect correction is mainly performed on the prismatic effect in horizontal direction undergone via the lens by the ray passing through the eyeball rotation center.

Thereafter, the power correction processing section 141 corrects the shape data of the lens back surface so that, in a state where there is lens front angle, the dioptric power of the light acting on the eyes in a line-of-sight passing through the eyeball rotation center assumed in optical design and the power measurement position is identical to the prescription value (step S110). Since this step is identical to step S10 of the first embodiment, the description thereof will be omitted.

The shape data of the spectacle lens of the second embodiment can be created by performing the above arithmetic processing. The spectacle lens of the present invention is produced based on the created lens shape data. Further, a pair of spectacles can be obtained by edging the spectacle lenses produced by the method of the present invention and fitting the edged lenses into a spectacle frame. Since these method and device are identical to those of the first embodiment, the description thereof will be omitted.

Next, the lens shape data created by the above method will be described below in further details. In the lens shape of the first embodiment, the prismatic effect (particularly the prismatic effect in horizontal direction) mainly with respect to the fixation line is corrected; while in the lens shape of the second embodiment, as described above, the distortion is corrected in a case where the fixation line is in the front direction, and in such case, the correction is performed considering the ray passing through the center of the entrance pupil of the eyeball optical system.

Figure 8A:
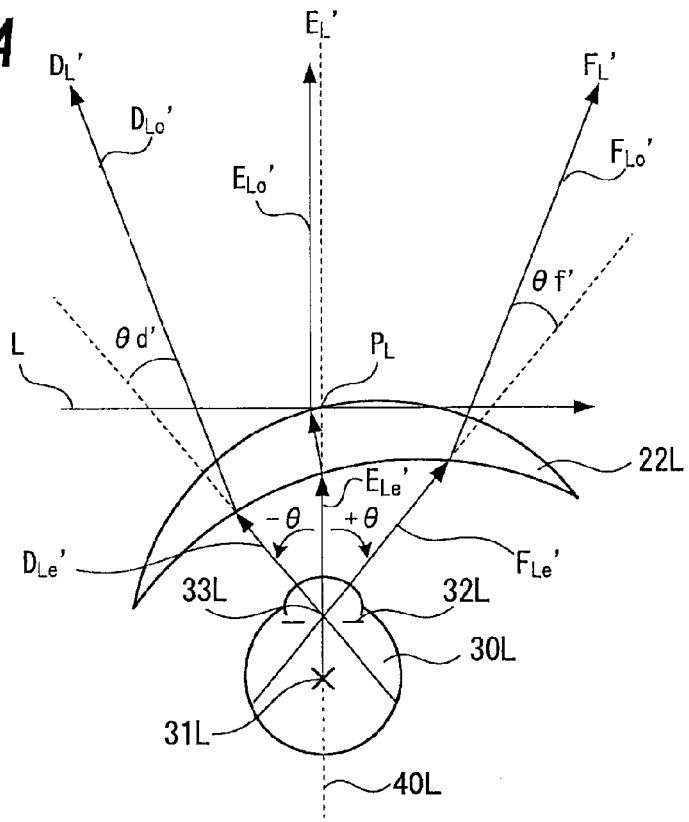
FIG. 8A is a view for explaining the prismatic effect of a spectacle lens according to a second embodiment of the present invention.
Figure 8B:
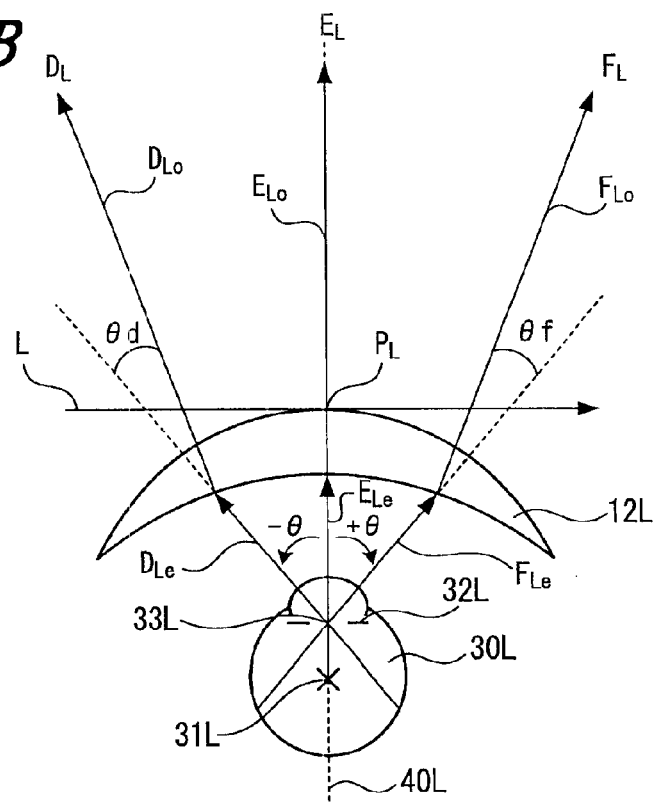
FIG. 8B is a view for explaining the prismatic effect of a spectacle lens in a state where there is no lens front angle.

FIG. 8A shows the line-of-sight direction in the arrangement state assumed in optical design in step S110 (i.e., in the state where a lens front angle is provided to a spectacle lens 22 of the lens shape obtained after performing dioptric power correcting process). FIG. 8B shows the line-of-sight direction in the arrangement state assumed in optical design in step S103 (i.e., in a state where no lens front angle is provided to a spectacle lens 12 of initial lens shape). In other words, the spectacle lens 22 shown in FIG. 8A is obtained by correcting the lens back surface of the lens 12 shown in FIG. 8B by the method of the present invention, so as to reduce the distortion.

As shown in FIG. 8B, a left spectacle lens 12L is arranged based on an assumption in optical design so that a fitting point $P_L$ on the lens front surface of the left spectacle lens 12L is situated in a reference front line-of-sight 40L passing through a rotation center 31L of the eye, and so that, in a horizontal cross section passing through the fitting point $P_L$, a normal line N of the lens front surface at the fitting point $P_L$ is identical to the reference front line-of-sight 40L. The distance between the lens and the eye at this time is set so that the distance between the lens back surface and the rotation center 31L in the reference front line-of-sight 40L becomes a predetermined value.

Further, as shown in FIG. 8A, a left spectacle lens 22L is arranged based on an assumption in optical design so that a fitting point $P_L$ on the lens front surface of the left spectacle lens 22L is located in the reference front line-of-sight 40L passing through the rotation center 31L of the eye; and at the same time, in the horizontal cross section passing through the fitting point $P_L$, the normal line N of the lens front surface at the fitting point $P_L$ intersects with the reference front line-of-sight 40L at a lens front angle $\theta_{LF}$.

Further, in FIG. 8B, arrows $D_L$, $E_L$ and $F_L$ represent the line-of-sights of the left eye 30L, arrows $D_{Lc}$, $E_{Le}$ and $F_{Le}$ represent image side line-of-sights of the respective line-of-sights, and arrows $D_{Lo}$, $E_{Lo}$ and $F_{Lo}$ represent object side line-of-sights of the respective line-of-sights. Similarly, in FIG. 8A, arrows $D_L'$, $E_L'$ and $F_L'$ represent the line-of-sights of the left eye 30L, arrows $D_{Le}'$, $E_{Le}'$ and $F_{Le}'$ represent image side line-of-sights of the respective line-of-sights, and arrows $D_{Lo}'$, $E_{Lo}'$ and $F_{Lo}'$ represent object side line-of-sights of the respective line-of-sights. Here, the image side line-of-sights $E_{Le}$ and $E_{Le}'$ when viewing objects in front view are identical to the reference front line-of-sight 40L, the image side line-of-sights $D_{Le}$ and $D_{Le}'$ are tilted toward the left side by an angle of θ degrees with respect to the reference front line-of-sight 40L, and the image side line-of-sights $F_{Le}$ and $F_{Le}'$ are tilted toward the right side by an angle of θ degrees with respect to the reference front line-of-sight 40L.

In the spectacle lens 22 of the present embodiment shown in FIG. 8A, by forming the lens back surface into an aspherical surface or an atoroidal surface, the prismatic effect undergone by each ray passing through the center of the entrance pupil 32 of the eyeball 30 when viewing objects in front view becomes equal to the prismatic effect of the lens of initial lens shape shown in FIG. 8B undergone by each ray passing through the center of the entrance pupil 32 of the eyeball 30 when viewing objects in front view, in a state where lens front angle is not provided. In other words, as shown in FIG. 8A, the back surface of the lens 22 is corrected so that the line-of-sight directions of the left-direction line-of-sight $D_L'$, the front-direction line-of-sight $E_L'$ and the right-direction line-of-sight $F_L'$ of the eye 30 on the outside of the lens 22 are substantially equal to the line-of-sight directions of the left-direction line-of-sight $D_L$, the front-direction line-of-sight $E_L$ and the right-direction line-of-sight $F_L$ on the outside of the lens 12L shown in FIG. 1B. Such correction is performed by adding a rotationally asymmetric aspherical element to the lens surface facing the eye.

To be specific, as shown in FIG. 8A, the position of the object side line-of-sight $E_{Lo}'$ of the line-of-sight (front line-of-sight) $E_L'$ is shifted from the position of the object side line-of-sight $E_{Lo}$ of the line-of-sight $E_L$ shown in FIG. 8B, but the direction of the object side line-of-sight $E_{Lo}'$ of the line-of-sight $E_L'$ is identical to the direction of the object side line-of-sight $E_{Lo}$ of the line-of-sight $E_L$. Further, if the angle between the image side line-of-sight $D_{Le}'$ and the object side line-of-sight $D_{Lo}'$ of the line-of-sight $D_{Lo}$ shown in FIG. 8A is defined as angle $\theta_d'$, and the angle between the image side line-of-sight $D_{Le}$ and the object side line-of-sight $D_{Lo}$ of the line-of-sight $D_L$ shown in FIG. 1B is defined as angle $\theta_d$, the angle $\theta_d'$ will be substantially equal to the angle $\theta_d$. Similarly, if the angle between the image side line-of-sight $F_{Le}'$ and the object side line-of-sight $F_{Lo}'$ of the line-of-sight $F_L'$ shown in FIG. 8A is defined as angle $\theta_f'$, and the angle between the image side line-of-sight $F_{Le}$ and the object side line-of-sight $F_{Lo}$ of the line-of-sight $F_L$ shown in FIG. 8B is defined as angle $\theta_f$, the angle $\theta_f'$ will be substantially equal to the angle $\theta_f$. In other words, the directions of the object side line-of-sights $D_{Lo}'$, $F_{Lo}'$ shown in FIG. 8A are respectively identical to the directions of the object side line-of-sights $D_{Lo}$, $F_{Lo}$ shown in FIG. 8B.

(1) First Evaluation Example (an Example of a Single-Vision Lens Whose Prescription Power Includes No Cylindrical Power)

A first evaluation example of the spectacle lens whose prismatic effect distribution is improved by the aforesaid lens shape data creating method according to the second embodiment will be described below. The first evaluation example is an example of creating the lens shape data of a single-vision lens by the aforesaid method, wherein data of the single-vision lens is: refractive index of the lens material is 1.5, BC is 8.50D, S is +4.00D, CT is 8 mm, and prismatic power is 0Δ (however, in the present example, both surfaces of initial lens shape are spherical surfaces, and the lens back surface is formed into an aspherical surface by the method of the present invention).

Figure 9A:
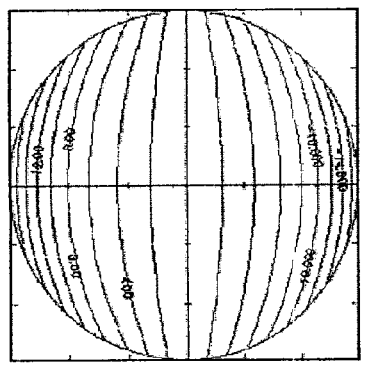
FIGS. 9A to 9C are views for explaining the prismatic effect of a single-vision spherical lens whose prescription power includes no cylindrical power.
Figure 9B:
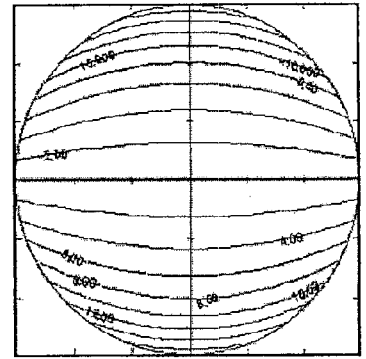
Figure 9C:
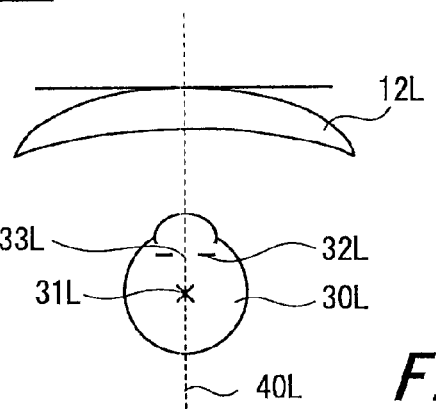

FIGS. 9A and 9B are each a contour map showing the prismatic effect distribution of the lens 12L of initial lens shape shown in FIG. 9C in the case where there is no lens front angle; and FIGS. 9A and 9B are expressed as coordinates obtained by projecting the coordinates on a sphere onto a plane perpendicular to the reference front line-of-sight, wherein the center of the sphere is the center of the entrance pupil when viewing objects in front view, and the radius of the sphere is the distance between the vertex of the surface of the lens facing the eye and the center of the entrance pupil (expression area is within a circle having a diameter of 30 mm. FIGS. 9D, 9E, 10A, 10B, 11A, 11B, 11D, 11E, 12A and 12B are also contour maps similar to FIGS. 9A and 9B). FIG. 9A shows the prismatic effect in horizontal direction undergone by a ray passing through the center of the entrance pupil, and FIG. 9B shows the prismatic effect in vertical direction undergone by the ray passing through the center of the entrance pupil. It can be known that both the prismatic effect in horizontal direction and the prismatic effect in vertical direction are contour lines with substantially the same interval.

Figure 9D:
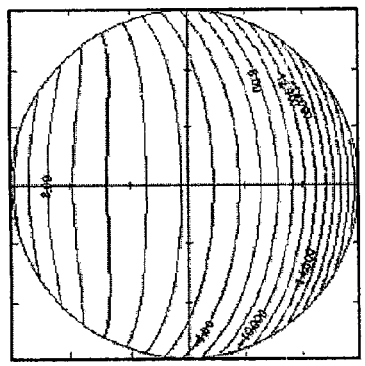
Figure 9E:
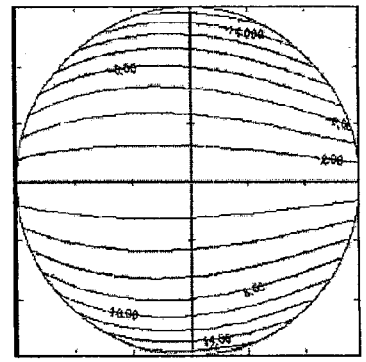
Figure 9F:
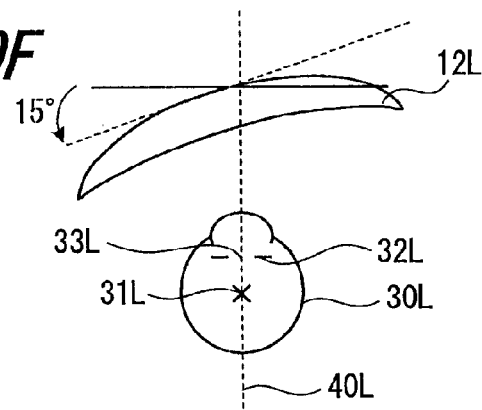

FIGS. 9D and 9E are each a contour map showing the distribution of the prismatic effect with respect to the ray passing through the center of the entrance pupil 32 in the case where the lens 12L of initial lens shape shown in FIGS. 9A to 9C is simply tilted by 15 degrees in the horizontal direction with the fitting point as a center (i.e., in the case where the lens front angle is set to 15 degrees) as shown in FIG. 9F; and FIGS. 9D and 9E are each expressed as the aforesaid coordinates. FIG. 9D shows the prismatic effect in horizontal direction undergone by a ray passing through the center of the entrance pupil, and FIG. 9E shows the prismatic effect in vertical direction undergone by the ray passing through the center of the entrance pupil. It is known that, since the lens 12 is tilted, large bias of the distribution of the prismatic effect in horizontal direction shown in FIG. 9D is caused in the peripheral portion.

Figure 10A:
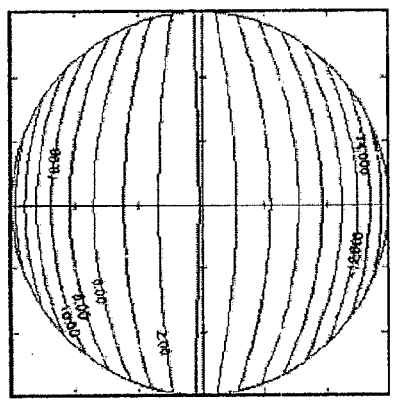
Figure 10B:
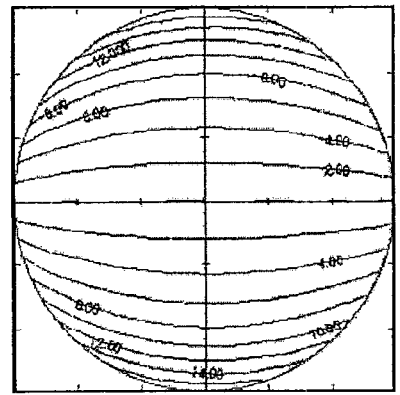
Figure 10C:
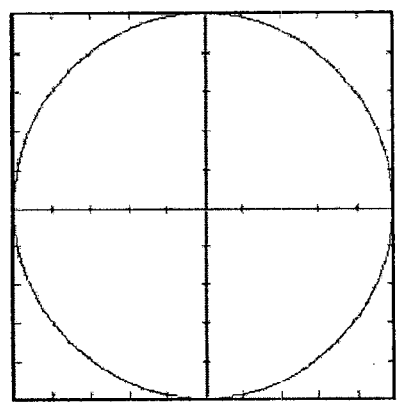
Figure 10D:
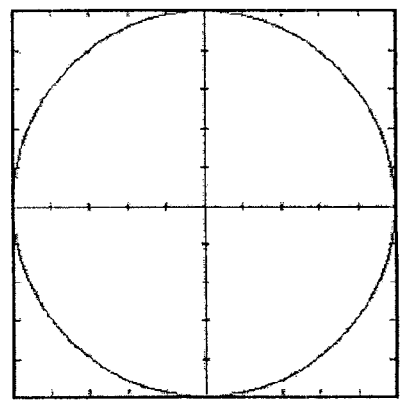
Figure 10E:
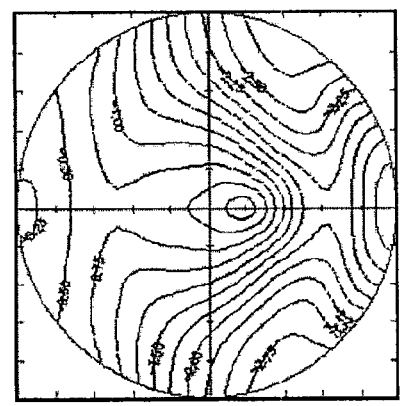
Figure 10F:
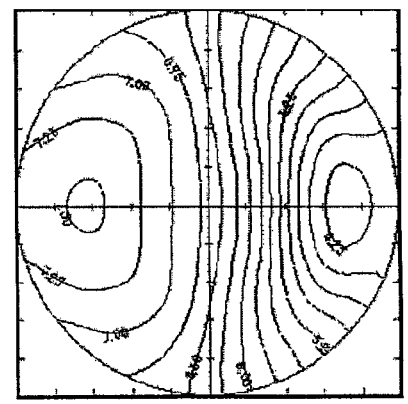

In contrast, optical performance evaluation results of a lens obtained by correcting the shape of the lens back surface from the initial lens shape by the lens shape data creating method of the present invention are shown in FIGS. 10A to 10F, wherein FIG. 10A shows the prismatic effect in horizontal direction undergone by the ray passing through the center of the entrance pupil, FIG. 10B shows the prismatic effect in vertical direction undergone by the ray passing through the center of the entrance pupil, FIG. 10O shows the surface astigmatism of the lens front surface, FIG. 10D shows the surface mean power of the lens front surface, FIG. 10E shows the surface astigmatism of the lens back surface, and FIG. 10F shows the surface mean power of the lens back surface. FIGS. 10A and 10B are each expressed as the aforesaid coordinates. In the lens having the lens back surface thereof corrected in the first evaluation example, the astigmatism and the mean power error can not be sufficiently controlled; however, in the present embodiment, the bias of the distribution of the prismatic effect particularly in horizontal direction is significantly reduced as shown in FIG. 10A. Thus, the prismatic effect distribution of such lens is substantially equal to the prismatic effect distribution shown in FIG. 9A in the case of the lens with no tilt. Further, as shown in FIG. 10F, the interval of the contour lines on the right side (the ear side) from the fitting point is smaller than that on the left side (the nose side), so that the surface mean power of the lens back surface in the horizontal cross section passing through the fitting point changes more largely on the ear side from the fitting point than on the nose side.

In the first embodiment, bias of the prismatic effect with respect to the ray passing through the rotation center of the eyeball (i.e., with respect to each ray in the line-of-sight direction) is reduced; while in the present embodiment, bias of the prismatic effect undergone via the lens by all rays passing through the center of the entrance pupil when viewing objects in front view is reduced.

Thus, the angle at which each ray from the peripheral vision enters the center of the entrance pupil when viewing objects in front view, or the position of the image formed on the retina can be made equivalent to those of the lens with no tilt shown in FIG. 8B. In other words, the distortion caused by tilting the lens can be reduced.

(2) Second Evaluation Example (an Example of a Single-Vision Lens Whose Prescription Power Includes Cylindrical Power)

Described below is a second evaluation example in which the optical performance is evaluated in the case where the present invention was applied to a single-vision lens whose prescription power includes cylindrical power. The second evaluation example is an example of creating the lens shape data of a single-vision lens by the aforesaid method, wherein data of the single-vision lens is: refractive index of the lens material is 1.5, BC is 8.50D, S is +4.00D, C is −2.00D, AX is 45 degrees, CT is 8 mm, and prismatic power is 0Δ (however, in the present example, the front surface of initial lens shape is a spherical surface, the back surface of initial lens shape is a toroidal surface, and the lens back surface is formed into an atoroidal surface by the method of the present invention).

Figure 11A:
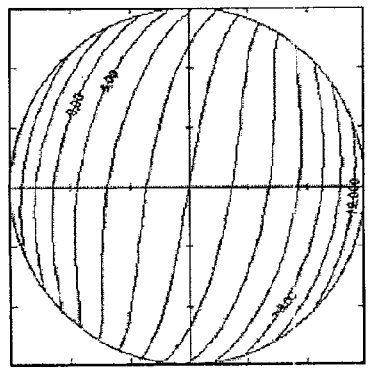
FIGS. 11A to 11C are views for explaining the prismatic effect of a single-vision spherical lens whose prescription power includes cylindrical power.
Figure 11B:
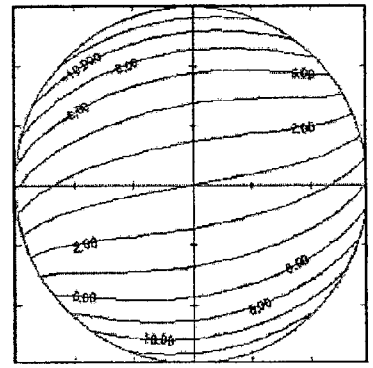
Figure 11C:
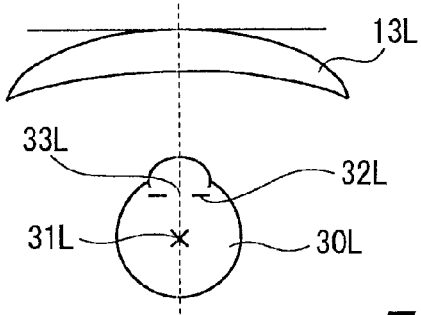

FIGS. 11A and 11B are each a contour map showing the prismatic effect distribution of the lens 13L of initial lens shape shown in FIG. 11C in the case where there is no lens front angle; and FIGS. 11A and 11B are expressed as coordinates obtained by projecting the coordinates on a sphere onto a plane perpendicular to the reference front line-of-sight, wherein the center of the sphere is the center of the entrance pupil when viewing objects in front view, and the radius of the sphere is the distance between the vertex of the surface of the lens facing the eye and the center of the entrance pupil. FIG. 11A shows the prismatic effect in horizontal direction undergone by a ray passing through the center of the entrance pupil, and FIG. 11B shows the prismatic effect in vertical direction undergone by the ray passing through the center of the entrance pupil.

Figure 11D:
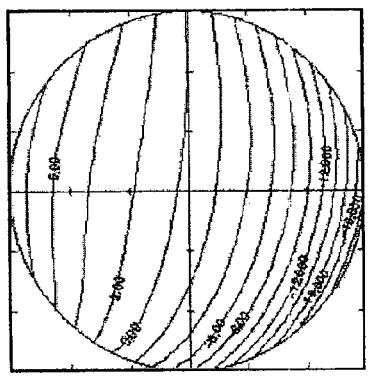
Figure 11E:
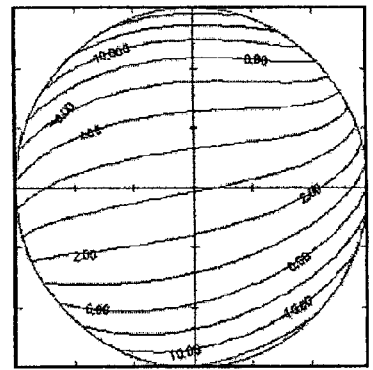
Figure 11F:
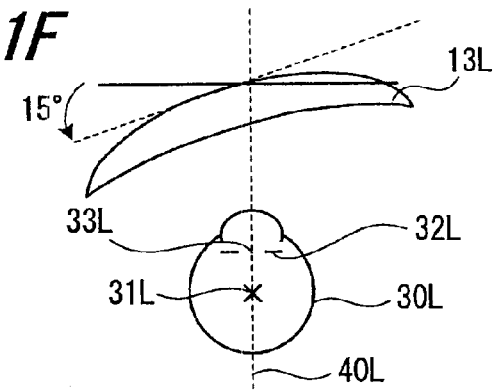

FIGS. 11D and 11E are each a contour map expressing a prism effect distribution in a case where the lens 13L of initial lens shape shown in FIGS. 11A to 11C is simply tilted by 15 degrees in the horizontal direction with the fitting point as a center as shown in FIG. 11F (i.e., in a case where the lens front angle is set to 15 degrees); and FIGS. 11D and 11E are each expressed as the aforesaid coordinates. FIG. 11E shows the prismatic effect in horizontal direction undergone by a ray passing through the center of the entrance pupil, and FIG. 11E shows the prismatic effect in vertical direction undergone by the ray passing through the center of the entrance pupil. Since the lens 13 is tilted, bias of the distribution of the prismatic effect in horizontal direction shown in FIG. 11D is caused in the peripheral portion. Thus, the distortion resulting from the lens front angle is generated in the peripheral vision area when viewing objects in front view.

Figure 12A:
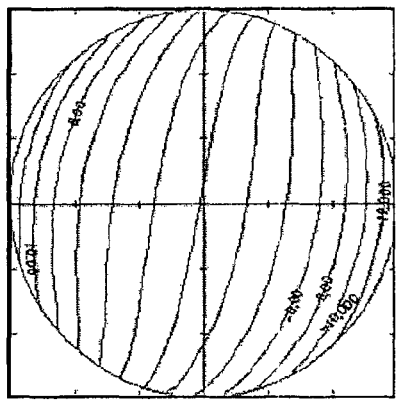
Figure 12B:
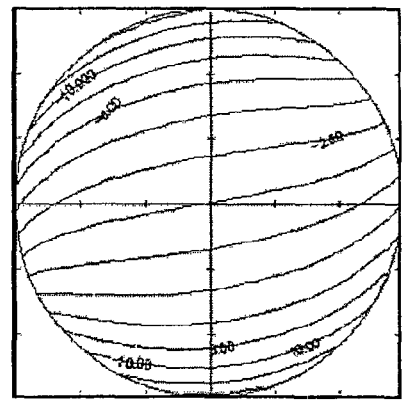
Figure 12C:
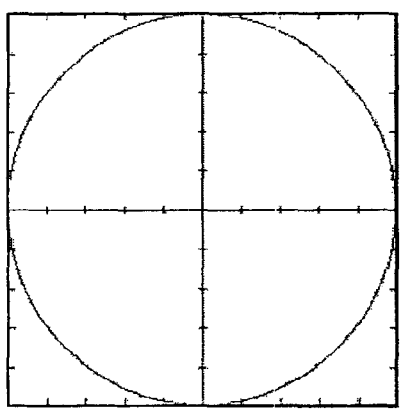
Figure 12D:
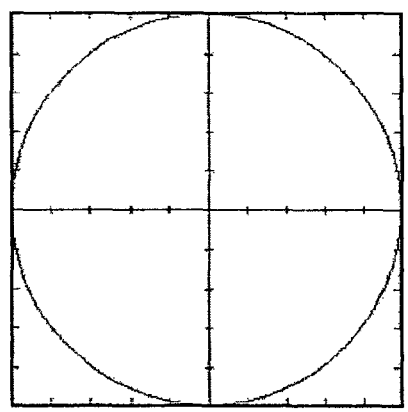
Figure 12E:
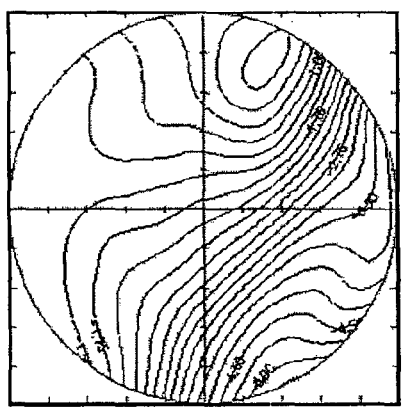
Figure 12F:
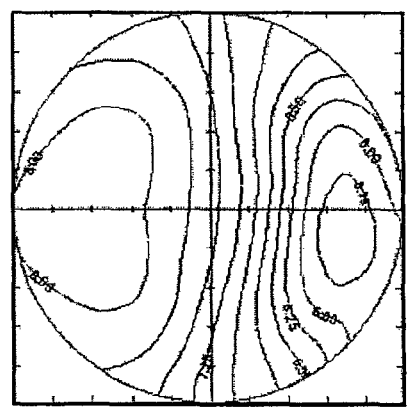

In contrast, optical performance evaluation results of a lens obtained by correcting the shape of the lens back surface from the initial lens shape by the lens shape data creating method of the second embodiment are shown in FIGS. 12A to 12F, wherein FIG. 12A is a contour map of the prismatic effect in horizontal direction undergone by a ray passing through the center of the entrance pupil, FIG. 12B is a contour map of the prismatic effect in vertical direction undergone by the ray passing through the center of the entrance pupil, FIG. 12C is a contour map of the surface astigmatism of the lens front surface, FIG. 12D is a contour map of the surface mean power of the lens front surface, FIG. 12E is a contour map of the surface astigmatism of the lens back surface, and FIG. 12F is a contour map of the surface mean power of the lens back surface. FIGS. 12A and 12B are each expressed as the aforesaid coordinates. In the lens having the lens back surface thereof corrected in the second evaluation example, the astigmatism and the mean power error can not be sufficiently controlled; however, as shown in FIG. 12A, the bias of the prism balance, particularly the bias of the prism in horizontal direction, in the peripheral portion can be almost removed, and therefore the prismatic effect distribution can be made substantially equal to the prismatic effect distribution shown in FIG. 11A where the lens 13 is not tilted. Further, as shown in FIG. 12F, the interval of the contour lines on the right side (the ear side) from the fitting point is smaller than that on the left side (the nose side), so that the surface mean power of the lens back surface in the horizontal cross section passing through the fitting point changes more largely on the ear side from the fitting point than on the nose side.

In the present embodiment, even if the lens has cylindrical power, by forming the lens back surface (i.e., the concave surface facing the eyeball) into an atoroidal surface, bias of the distribution of the prismatic effect undergone via the lens by each ray passing through the center of the entrance pupil of the eyeball when viewing objects in front view is removed. Thus, the distortion caused by tilting the lens, particularly in the peripheral portion when viewing objects in front view, can be corrected.

3. Third Embodiment

The third embodiment is an example of creating the shape data of a progressive addition lens by a method identical to the method of the first embodiment. Incidentally, the present embodiment is described based on a case where the shape data of a progressive addition lens is created, wherein the front surface of the progressive addition lens is a progressive-addition surface, and the back surface of the progressive addition lens is an aspherical or atoroidal surface.

The lens shape data creating device 100 having been described above with reference to FIG. 6 may be used as a lens shape data creating device, to which a lens shape data creating method according to the third embodiment is suitable to be applied. Also, since the method of creating the lens shape data using such a lens shape data creating device can be performed following the flowchart of FIG. 7, the part different from the method of the first embodiment will be described later when describing the lens shape data creating method, and the description of the part identical to the method of the first embodiment will be omitted.

First, the method or creating the lens shape data with the lens shape data creating device 100 will be described below.

The steps of creating the initial lens shape data (i.e., steps S1 and S2) are identical to those of the first embodiment except that, in the created initial lens shape data, the front surface is a progressive-addition surface, and the back surface is a spherical surface or toroidal surface. Since the prismatic effect correcting steps (steps S3 to S9) are identical to those of the first embodiment, the description thereof will be omitted. The dioptric power correcting step (step S10) is identical to that of the first embodiment except that the power measurement position is the distance-portion measuring reference point.

The shape data of the spectacle lens of the third embodiment can be created by performing the above arithmetic processing. The progressive addition spectacle lens of the present invention is produced based on the created lens shape data. Further, a pair of spectacles can be obtained by edging the progressive addition spectacle lenses produced by the method of the present invention and fitting the edged lenses into a spectacle frame. Since these method and device are identical to those of the first: embodiment, the description thereof will be omitted.

Further, with regard to the created lens shape data, similar to the case described with reference to FIG. 1 of the first embodiment, the object side line-of-sights corresponding to the image side lire-of-sights of the same direction between the case where there is lens front angle and the case where there is no lens front angle have substantially the same direction.

(1) First Evaluation Example (an Example of Correcting a Progressive Addition Lens Whose Prescription Power Includes No Cylindrical Power)

A first evaluation example of the progressive addition spectacle lens whose prismatic effect distribution is improved by the aforesaid lens shape data creating method of the third embodiment will be described below. The first evaluation example is an example of creating the lens shape data of a progressive addition lens by the aforesaid method, wherein refractive data of the progressive addition lens is: refractive index of the lens material is 1.5, BC is 9.00D, S is +4.00D, addition power (referred to as "ADD" hereinafter) is 2.00D, CT is 8 mm, and prismatic power is 0Δ (however, in the present example, the front surface of initial lens shape is a progressive-addition surface, the back surface of initial lens shape is a spherical surface, and the lens back surface is formed into an aspherical surface by the method of the present invention).

Figure 14A:
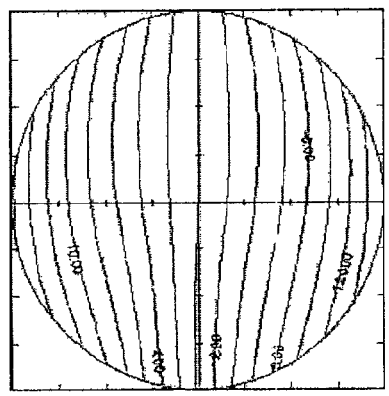
FIGS. 14A and 14B are contour maps of the prismatic effect of a progressive addition spectacle lens whose prescription power includes no cylindrical power.
Figure 14B:
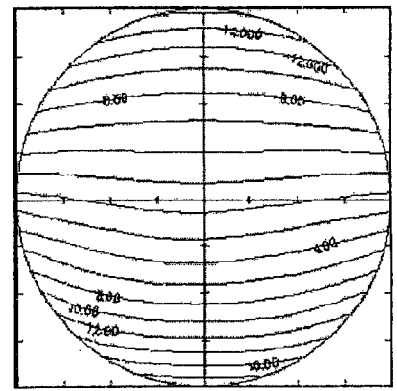

FIGS. 14A and 14B are each a contour map showing the prismatic effect distribution of the lens of initial lens shape in the case where there is no lens front angle, and FIGS. 4A and 4B are each expressed as the reference spherical coordinates. FIG. 14A shows the prismatic effect in horizontal direction undergone by a ray passing through the rotation center, and FIG. 14B shows the prismatic effect in vertical direction undergone by the ray passing through the rotation center. Both the prismatic effect in horizontal direction and the prismatic effect in vertical direction are bilaterally symmetrical contour lines with substantially the same interval.

Figure 14C:
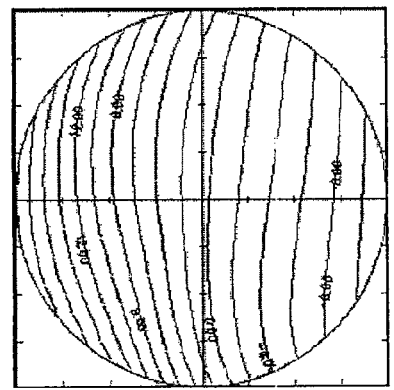
Figure 14D:
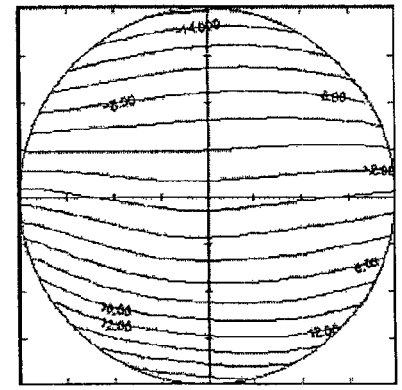

FIGS. 14C and 14D are each a contour map showing a prismatic effect distribution in the case where the lens of initial lens shape shown in FIGS. 14A and 14B is simply tilted by 15 degrees in horizontal direction with the fitting point as a center (i.e., in the case where the lens front angle is set to 15 degrees), and 14C and 14D are each expressed as the reference spherical coordinates. FIG. 14C shows the prism effect in horizontal direction undergone by a ray passing through the rotation center, and FIG. 14D shows the prism effect in vertical direction undergone by the ray passing through the rotation center. The prismatic effect in vertical direction shown in FIG. 14D has no large difference from the case shown in FIG. 14B; however, as shown in FIG. 14C, since the lens is tilted, the interval of the contour lines of the prismatic effect in horizontal direction becomes uneven particularly in the peripheral portion, and therefore the prism balance is lost.

Figure 15A:
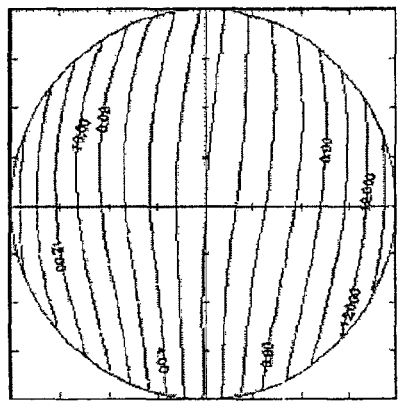
Figure 15B:
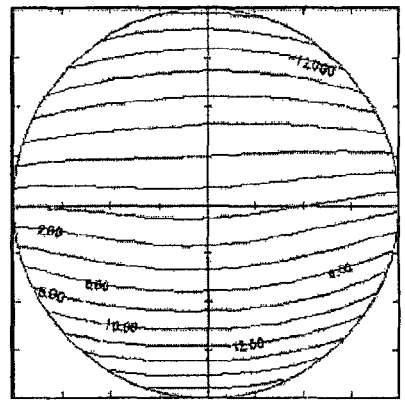
Figure 15C:
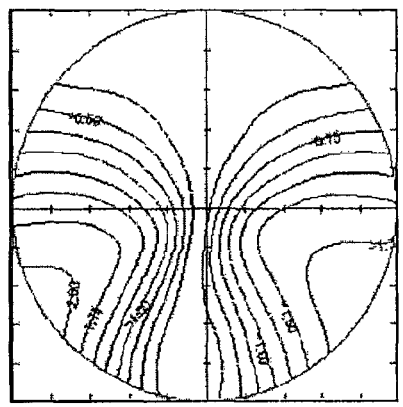
Figure 15D:
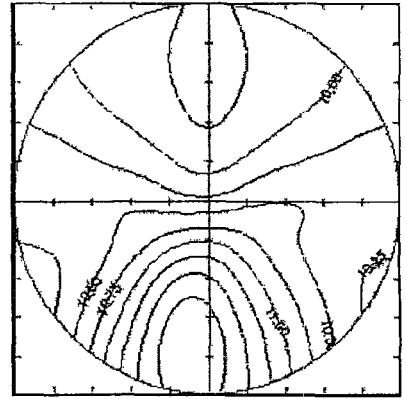
Figure 15E:
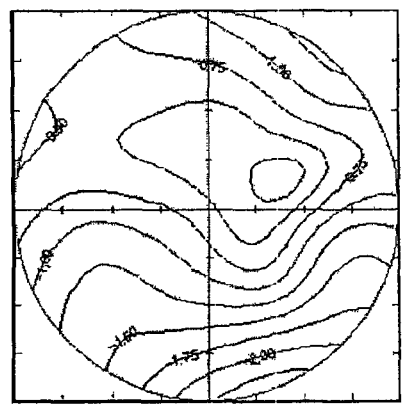
Figure 15F:
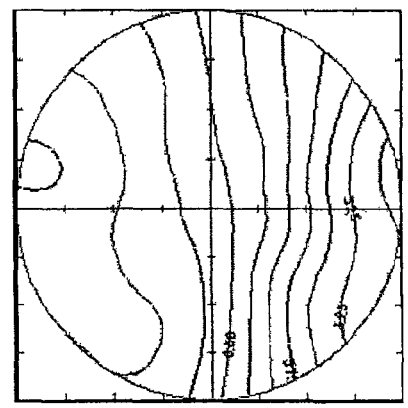

In contrast, optical performance evaluation results of a lens obtained by correcting the shape of the lens back surface from the initial lens shape by the lens shape data creating method of the present invention are shown in FIGS. 15A to 15F, wherein FIG. 15A shows the prismatic effect in horizontal direction undergone by a ray passing through the rotation center, FIG. 15B shows the prismatic effect in vertical direction undergone by the ray passing through the rotation center, FIG. 15C shows the surface astigmatism of the lens front surface, FIG. 15D shows the surface mean power of the lens front surface, FIG. 15E shows the surface astigmatism of the lens back surface, and FIG. 15F shows the surface mean power of the lens back surface. In the lens having the lens back surface thereof corrected in the first evaluation example, the astigmatism and the mean power error can not be sufficiently controlled; however, as shown in FIG. 15A, the distribution bias of the prismatic effect in horizontal direction in the peripheral portion can be substantially removed, and therefore prism balance substantially identical to the prismatic effect in horizontal direction shown in FIG. 14A can be obtained. Further, as shown in FIG. 15F, the interval of the contour lines on the right side (the ear side) from the prism reference point is smaller than that on the left side (the nose side), so that the surface mean power of the lens back surface in the horizontal cross section passing through the prism reference point changes more largely on the ear side from the prism reference point than on the nose side.

Thus, in the first evaluation example, by forming the lens back surface into an aspherical surface, the prismatic effect undergone via the lens by the ray in each line-of-sight direction becomes the same as the lens of initial lens shape. Thus, it is possible to almost remove the prism imbalance particularly in the peripheral portion.

In the present embodiment, similar to the first embodiment, since the distribution bias of the prismatic effect is removed, the problems mentioned above can be improved. Thus, the wearer of a pair of spectacles mounted with such lenses can obtain a vision with no feeling of discomfort.

(2) Second Evaluation Example (an Example of Correcting a Progressive Addition Lens Whose Prescription Power Includes Cylindrical Power)

Described below is a second evaluation example in which the optical performance is evaluated in the case where the present invention was applied to a progressive addition spectacle lens whose prescription power includes cylindrical power. The second evaluation example is an example of creating the lens shape data of a progressive addition lens by the aforesaid method, wherein data of the progressive addition lens is: refractive index of the lens material is 1.5, BC is 9.00D, S is +4.00D, C is −2.00D, AX is 45 degrees, addition ADD is 2.00D, CT is 8 mm, and prismatic power is 0Δ (however, in the present example, the front surface of initial lens shape is a progressive-addition surface, the back surface of initial lens shape is a toroidal surface, and the lens back surface is formed into an atoroidal surface by the method of the present invention).

Figure 16A:
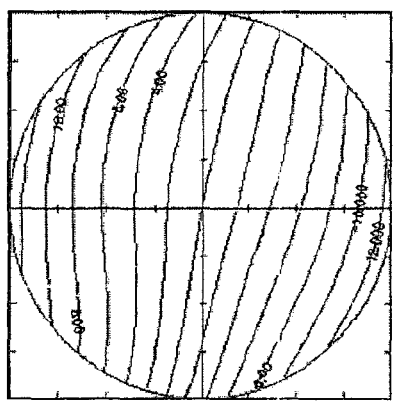
FIGS. 16A and 16B are contour maps of the prismatic effect of a progressive addition spectacle lens whose prescription power includes cylindrical power.
Figure 16B:
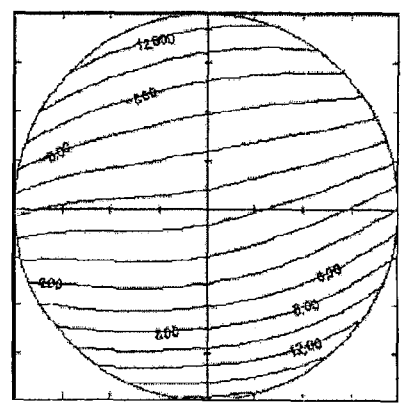

FIGS. 16A and 16B are each a contour map showing the prismatic effect distribution of the lens of initial lens shape in the case where there is no lens front angle, and FIGS. 4A and 4B are each expressed as the reference spherical coordinates. FIG. 16A shows the prismatic effect in horizontal direction undergone by a ray passing through the rotation center, and FIG. 16B shows the prismatic effect in vertical direction undergone by the ray passing through the rotation center.

Figure 16C:
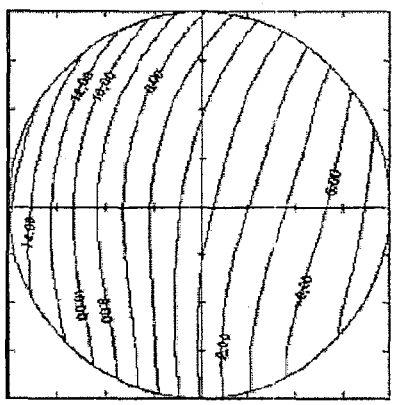
Figure 16D:
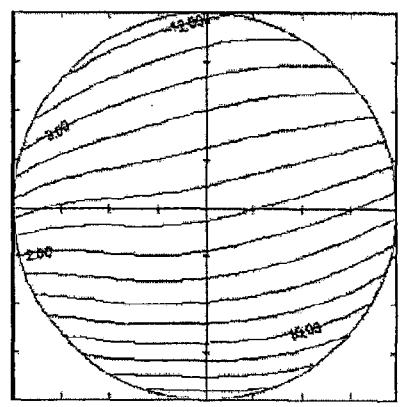

FIGS. 16C and 16D are each a contour map showing a prismatic effect distribution in the case where the lens of initial lens shape shown in FIGS. 16A and 16B is simply tilted by 15 degrees in horizontal direction with the fitting point as a center (i.e., in the case where the lens front angle is set to 15 degrees), and 16C and 16D are each expressed as the reference spherical coordinates. FIG. 16C shows the prism effect in horizontal direction undergone by a ray passing through the rotation center, and FIG. 16D shows the prism effect in vertical direction undergone by the ray passing through the rotation center. As shown in FIG. 16C, since the lens is tilted, the distribution bias of the prismatic effect in horizontal direction is caused in the peripheral portion.

Figure 17A:
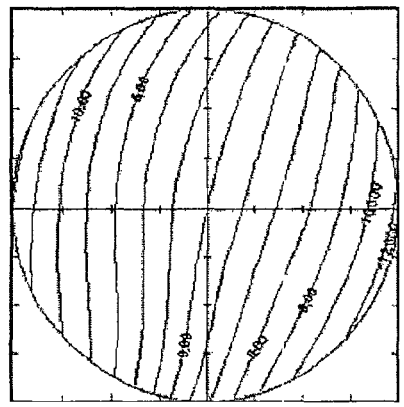
Figure 17B:
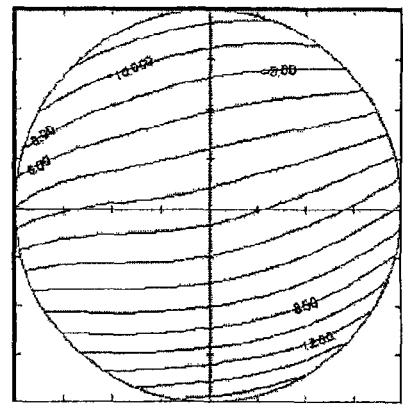
Figure 17C:
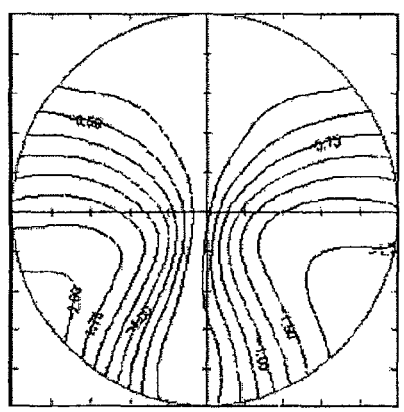
Figure 17D:
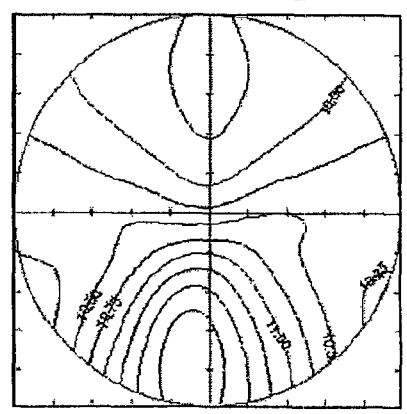
Figure 17E:
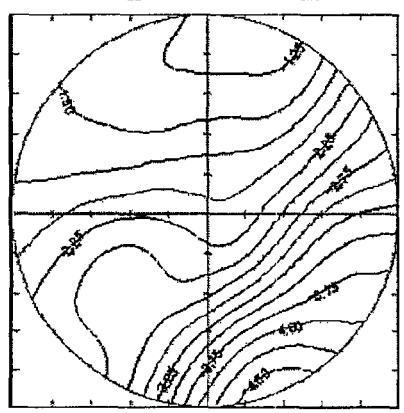
Figure 17F:
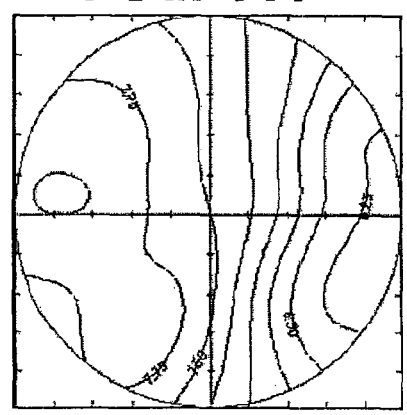

In contrast, optical performance evaluation results of a lens obtained by correcting the shape of the lens back surface from the initial lens shape by the lens shape data creating method of the third embodiment are shown in FIGS. 17A to 17F, wherein FIG. 17A is a contour map of the prismatic effect in horizontal direction undergone by a ray passing through the rotation center, FIG. 17B is a contour map of the prismatic effect in vertical direction undergone by the ray passing through the rotation center, FIG. 17C is a contour map of the surface astigmatism of the lens front surface, FIG. 17D is a contour map of the surface mean power of the lens front surface, FIG. 17E is a contour map of the surface astigmatism of the lens back surface, and FIG. 17F is a contour map of the surface mean power of the lens back surface. In the lens having the lens back surface thereof corrected in the second evaluation example, the astigmatism and the mean power error can not be sufficiently controlled; however, as shown in FIG. 17A, the distribution bias of prismatic power in horizontal direction is significantly reduced, and therefore a prismatic effect substantially identical to the optical performance shown in FIG. 16A, where the lens is not tilted, can be obtained. Further, as shown in FIG. 15F, the interval of the contour lines on the right side (the ear side) from the prism reference point is smaller than that on the left side (the nose side), so that the surface mean power of the lens back surface in the horizontal cross section passing through the prism reference point changes more largely on the ear side from the prism reference point than on the nose side.

In the second evaluation example, bias of the prism balance can be removed by forming the lens back surface into an atoroidal surface, even if the spectacle lens is a progressive addition spectacle lens whose prescription power includes cylindrical power. Thus, with a pair of spectacles configured by mounting such lenses to a frame having a large front angle, it is possible to obtain the same advantages obtained by the spectacles configured using the lenses of the first evaluation example, in which the line-of-sight direction passing through the peripheral vision of the left lens and the line-of-sight direction passing through the peripheral vision of the right lens can be made substantially identical to each other, and therefore the feeling of discomfort when wearing the spectacles can be reduced.

3. Fourth Embodiment

A fourth embodiment shows an example in which shape data of a single-vision spectacle lens is created by a method identical to the method of the first embodiment, wherein a lens having its back surface shape corrected for removing the astigmatism and the mean power error felt by the eyes in the state where there is no lens front angle (the back surface of such lens is an atoroidal surface or rotationally symmetric aspherical surface, and, for sake of simplicity, those lenses are collectively called "back surface aspherical lens" hereinafter) is used as the lens of initial lens shape. Incidentally, the present embodiment is an example in which the shape data of a single-vision minus lens is created, wherein the single-vision minus lens is a single-vision minus lens whose front surface is a spherical surface, whose back surface is an aspherical surface, and whose prescription power includes no cylindrical power. The example is discussed based on two cases, one is the case where the deviation amount removal rate of the prismatic effect is 100%, and another is the case where the deviation amount removal rate of the prismatic effect is 50%.

The lens shape data creating device 100 having been described above with reference to FIG. 6 may be used as a lens shape data creating device, to which a lens shape data creating method according to the third embodiment is suitable to be applied. Also, since the method of creating the lens shape data using such a lens shape data creating device can be performed following the flowchart of FIG. 7, the part different from the method of the first embodiment will be described later when describing the lens shape data creating method, and the description of the part identical to the method of the first embodiment will be omitted.

First, the method or creating the lens shape data with the lens shape data creating device 100 will be described below.

The steps of creating the initial lens shape data (i.e., steps S1 and S2) are identical to those of the first embodiment except that the created initial lens shape data is: the front surface is a spherical surface, and the back surface is a rotationally symmetric aspherical surface whose shape is corrected for removing the astigmatism and the mean power error felt by the eyes in both the front line-of-sight and the area other than front line-of-sight in the state where there is no lens front angle. In the steps of creating the initial lens shape data (i.e., steps S3 to S9), the process is identical to that of the first embodiment except that the deviation amount of the corrected prismatic effect distribution (b) firstly calculated in step S6 following step S5 with respect to the target prismatic effect distribution (a) is removed by 100% or 50% in the whole area of the lens. The dioptric power correcting step (step S10) is identical to that of the first embodiment.

The shape data of the spectacle lens of the fourth embodiment can be created by performing the above arithmetic processing. The single-vision minus lens of the present invention is produced based on the created lens shape data. Further, a pair of spectacles can be obtained by edging the single-vision minus lenses produced by the method of the present invention and fitting the edged lenses into a spectacle frame. Since these method and device are identical to those of the first embodiment, the description thereof will be omitted.

Next, the lens shape data created by the above method will be described below in further details. Similar to the first embodiment, the lens shape of the fourth embodiment has the prismatic effect (particularly the prismatic effect in horizontal direction) undergone mainly by the fixation line of the eye corrected.

Figure 18A:
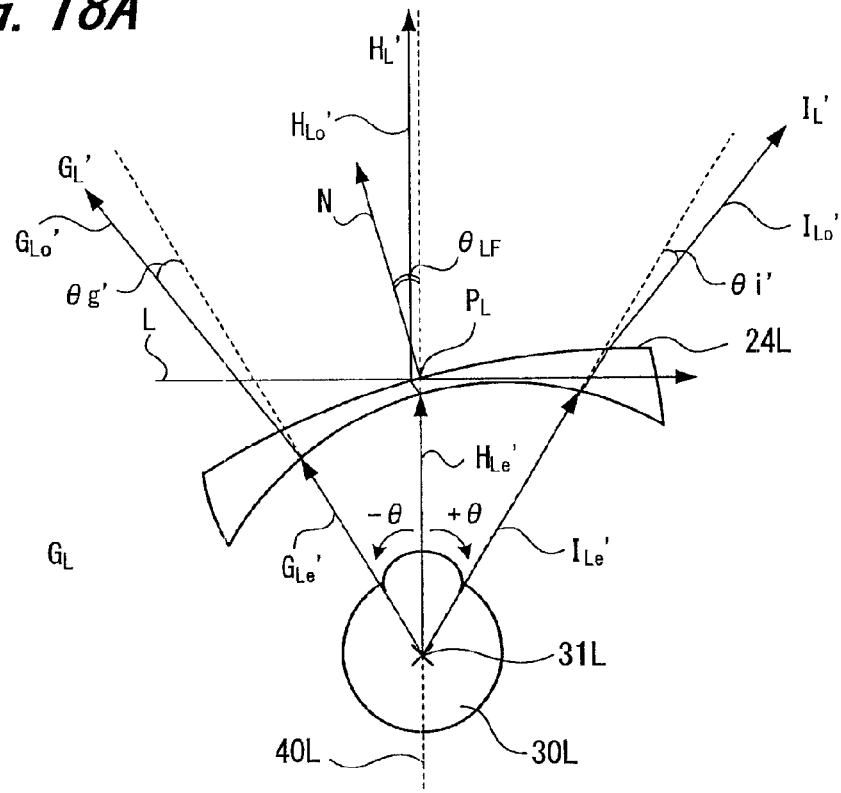
FIG. 18A is a view for explaining the prismatic effect of a spectacle lens according to a fourth embodiment of the present invention.

FIG. 18A shows the line-of-sight direction in the arrangement state assumed in optical design in step S10, i.e., the line-of-sight direction in a state where a lens front angle is provided to a spectacle lens 24 having a lens shape obtained after performing dioptric power correcting process. FIG. 1B shows the line-of-sight direction in the arrangement state assumed in optical design in step S3, i.e., the line-of-sight direction in a state where no lens front angle is provided to a spectacle lens 10 of initial lens shape. In other words, the spectacle lens 24 shown in FIG. 18A is obtained by correcting the lens back surface of the lens 14 shown in FIG. 18B by the method of the present invention so as to improve the prismatic effect.

Figure 18B:
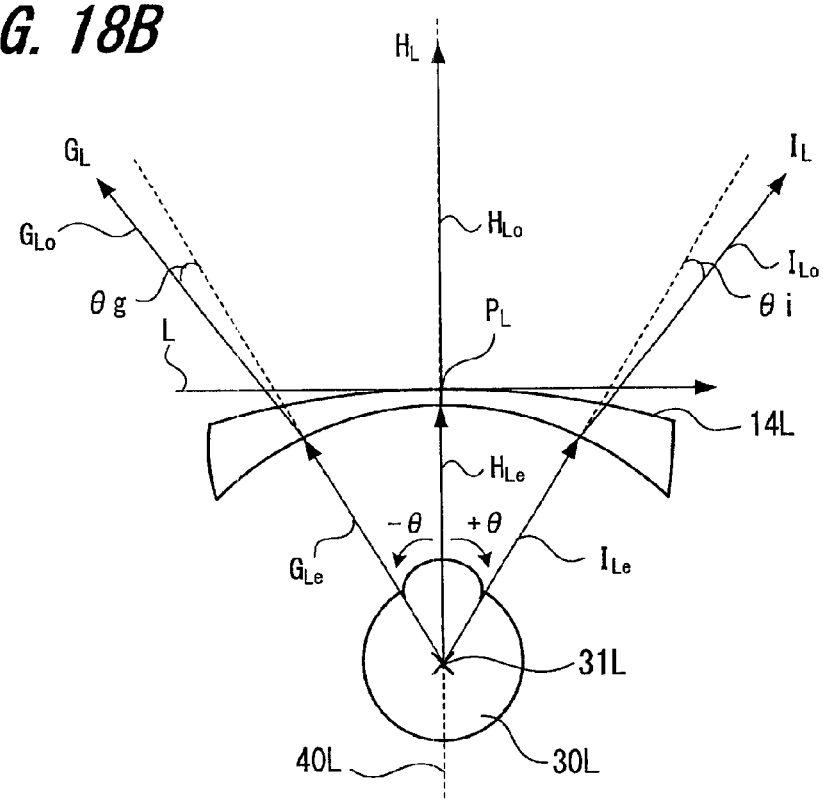
FIG. 18B is a view for explaining the prismatic effect of a spectacle lens in a state where there is no lens front angle.

As shown in FIG. 18B, a left spectacle lens 14L is arranged based on an assumption in optical design so that a fitting point $P_L$ on the lens front surface of the left spectacle lens 14L is situated in a reference front line-of-sight 40L passing through a rotation center 31L of the eye, and so that, in a horizontal cross section passing through the fitting point $P_L$, a normal line N of the lens front surface at the fitting point $P_L$ is identical to the reference front line-of-sight 40L. The distance between the lens and the eye at this time is set so that the distance between the lens back surface and the rotation center 31L in the reference front line-of-sight 40L becomes a predetermined value.

Further, as shown in FIG. 18A, a left spectacle lens 24L is arranged based on an assumption of optical design so that a fitting point $P_L$ or the lens front surface of the left spectacle lens 24L is located in the reference front line-of-sight 40L passing through the rotation center 31L of the eye, and at the same time, in the horizontal cross section passing through the fitting point $P_L$, the normal line N of the lens front surface at the fitting point $P_L$ intersects with the reference front line-of-sight 40L at a lens front angle $\theta_{LF}$.

Further, in FIG. 18B, arrows $G_L$, $H_L$ and $I_L$ represent the line-of-sights of the left eye 30L, arrows $G_{Le}$, $H_{Le}$ and $I_{Le}$ represent image side line-of-sights of the respective line-of-sights, and arrows $G_{Lo}$, $H_{Lo}$ and $I_{Lo}$ represent object side line-of-sights of the respective line-of-sights. Similarly, in FIG. 18A, arrows $G_L'$, $H_L'$ and $I_L'$ represent the line-of-sights of the left eye 30L, arrows $G_{Le}'$, $H_{Le}'$ and $I_{Le}'$ represent image side line-of-sights of the respective line-of-sights, and arrows $G_{Lo}'$, $H_{Lo}'$ and $I_{Lo}'$ represent object side line-of-sights of the respective line-of-sights. Here, the image side line-of-sights $H_{Le}$ and $H_{Le}'$ when viewing objects in front view are identical to the reference front line-of-sight 40L, the image side line-of-sights $G_{Le}$ and $G_{Le}'$ are tilted toward the left side by an angle of θ degrees with respect to the reference front line-of-sight 40L, and the image side line-of-sights $I_{Le}$ and $I_{Le}'$ are tilted toward the right side by an angle of θ degrees with respect to the reference front line-of-sight 40L.

In the prismatic effect of the spectacle lens 24 of the fourth embodiment shown in FIG. 18A, by correcting the lens back surface, the prismatic effect undergone by a ray passing through the rotation center 31 of the eyeball 30 is equal or close, in a degree proportional to the deviation amount removal rate, to the prismatic effect of the initial lens shape in a state where lens front angle is not provided shown in FIG. 18B undergone by a ray passing through the rotation center 31 of the eyeball 30, if the ray shown in FIG. 1A and the ray shown in FIG. 1B have the same line-of-sight direction. In other words, in the case where the deviation amount removal rate is 100%, as shown in FIG. 18A, the back surface of the lens 24 is corrected so that the line-of-sight directions of the left-direction line-of-sight $G_L'$, the front-direction line-of-sight $H_L'$ and the right-direction line-of-sight $I_L'$ of the eye 30 on the outside of the lens 24 are substantially equal to the line-of-sight directions of the left-direction line-of-sight $G_L$, the front-direction line-of-sight $H_L$ and the right-direction line-of-sight $I_L$ on the outside of the lens 12L shown in FIG. 18B. Such correction is performed by adding a rotationally asymmetric aspherical element to the lens surface facing the eye.

To be specific, as shown in FIG. 18A, the position of the object side line-of-sight $H_{Lo}'$ of the line-of-sight (front line-of-sight) $H_L'$ is shifted from the position of the object side line-of-sight $H_{Lo}$ of the line-of-sight $H_L$ shown in FIG. 18B, but the direction of the object side line-of-sight $H_{Lo}'$ of the line-of-sight $H_L'$ is identical to the direction of the object side line-of-sight $H_{Lo}$ of the line-of-sight $H_L$. Further, if the angle between the image side line-of-sight $G_{Le}'$ and the object side line-of-sight $G_{Lo}'$ of the line-of-sight $G_L'$ shown in FIG. 18A is defined as angle $\theta_g'$, and the angle between the image side line-of-sight $G_{Le}$ and the object side line-of-sight $D_{Lo}$ of the line-of-sight $G_L$ shown in FIG. 18B is defined as angle $\theta_g$, the angle $\theta_g'$ will be substantially equal to the angle $\theta_g$. Similarly, if the angle between the image side line-of-sight $I_{Le}'$ and the object side line-of-sight $I_{Lo}'$ of the line-of-sight $I_L'$ shown in FIG. 18A is defined as angle $\theta_i'$, and the angle between the image side line-of-sight $I_{Le}$ and the object side line-of-sight $I_{Lo}$ of the line-of-sight $I_L$ shown in FIG. 18B is defined as angle $\theta_i$, the angle $\theta_i'$ will be substantially equal to the angle $\theta_i$. In other words, the directions of the object side line-of-sights $G_{Lo}'$, $I_{Lo}'$ shown in FIG. 18A are respectively identical to the directions of the object side line-of-sights $G_{Lo}$, $I_{Lo}$ shown in FIG. 18B.

Incidentally, in the case where the deviation amount removal rate is smaller than 100%, when the deviation amount removal rate is smaller, the angle $\theta_g'$ on the ear side will become smaller and therefore the difference between the angle $\theta_g'$ and angle $\theta_g$ will be increased, and the angle $\theta_i'$ on the nose side will become larger and therefore the difference between the angle $\theta_i'$ and angle $\theta_i$ will be increased. In other words, in the case where the lens is a minus lens, if the deviation amount removal rate is smaller, the object side line-of-sight $G_{Lo}'$ will be more tilted toward the nose side and consequently the direction of the object side line-of-sight $G_{Lo}'$ will be closer to the direction of the image side line-of-sight $G_{Le}'$, while the object side line-of-sight $I_{Lo}'$ will be more tilted toward the nose side and consequently the direction of the object side line-of-sight $I_{Lo}'$ will be farther away from the direction of the image side line-of-sight $I_{Le}'$.

(1) First Evaluation Example (an Example of a Single-Vision Lens Whose Prescription Power Includes No Cylindrical Power, in a Case where the Deviation Amount Removal Rate of the Prismatic Effect is Set to 100%)

A first evaluation example of the single-vision minus lens whose prismatic effect distribution is improved by the aforesaid lens shape data creating method of the fourth embodiment will be described below. The first evaluation example is an example of creating the lens shape data of a single-vision minus lens by the aforesaid method with a deviation amount removal rate of 100%, wherein data of the single-vision minus lens is: refractive index of the lens material is 1.5, BC is 8.50D, S is −4.00D, CT is 1 mm, and prismatic power is 0Δ.

Figure 19A:
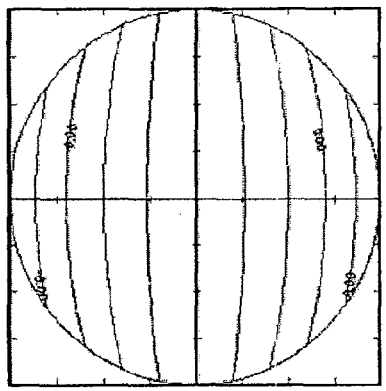
FIGS. 19A and 19B are contour maps of the prismatic effect of a single-vision aspherical lens whose prescription power includes no cylindrical power.
Figure 19B:
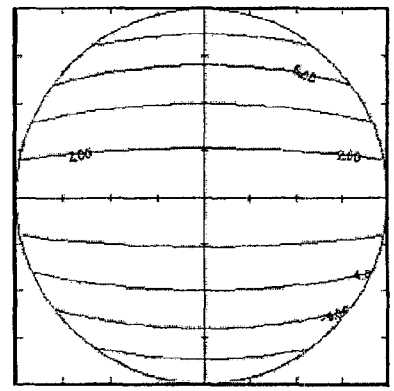

FIGS. 19A and 19B are each a contour map showing the prismatic effect distribution of the lens of initial lens shape in the case where there is no lens front angle, and FIGS. 19A and 19B are each expressed as the reference spherical coordinates. FIG. 19A shows the prismatic effect in horizontal direction undergone by a ray passing through the rotation center, and FIG. 19E shows the prismatic effect in vertical direction undergone by the ray passing through the rotation center. It can be known that both the prismatic effect in horizontal direction is contour lines with substantially the same interval lined up in left-right direction, and the prismatic effect in vertical direction is contour lines with substantially the same interval lined up in up-down direction.

Figure 19C:
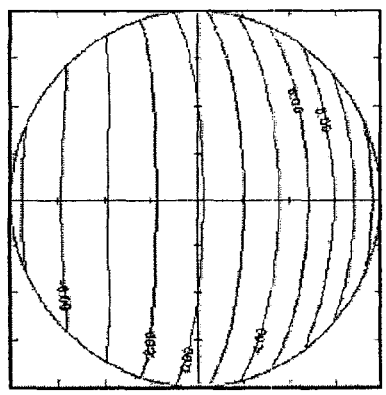
Figure 19D:
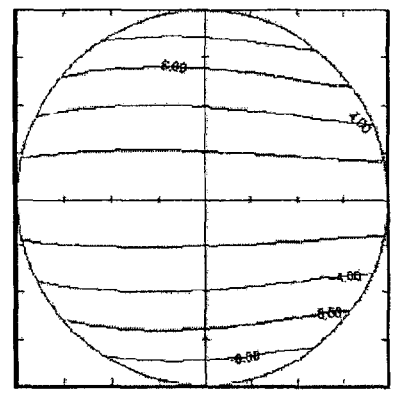

FIGS. 19C and 19D are each a contour map showing a prismatic effect distribution in the case where the lens of initial lens shape shown in FIGS. 19A and 19B is simply tilted by 15 degrees in horizontal direction with the fitting point as a center (i.e., in the case where the lens front angle is set to 15 degrees), and 19C and 19D are each expressed as the reference spherical coordinates. FIG. 19C shows the prism effect in horizontal direction undergone by a ray passing through the rotation center, and FIG. 19D shows the prism effect in vertical direction undergone by the ray passing through the rotation center. The prismatic effect in vertical direction shown in FIG. 19D has no large difference from the case shown in FIG. 19B; however, as shown in FIG. 19C, since the lens is tilted, the interval of the contour lines of the prismatic effect in horizontal direction becomes uneven particularly in the peripheral portion, and therefore the prism balance is lost.

Figure 20A:
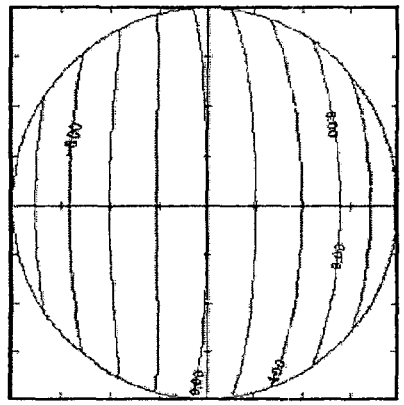
Figure 20B:
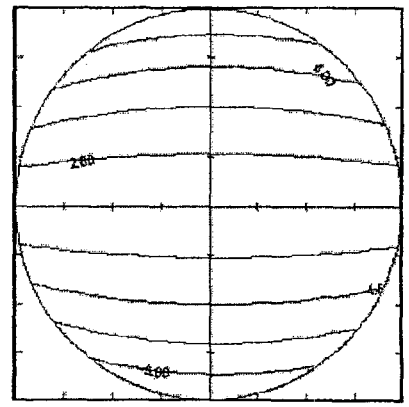
Figure 20C:
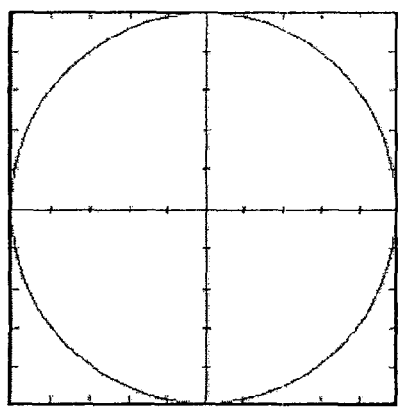
Figure 20D:
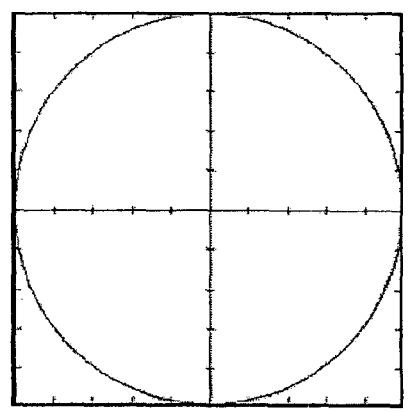
Figure 20E:
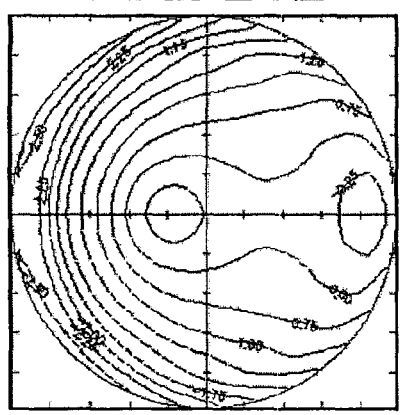
Figure 20F:
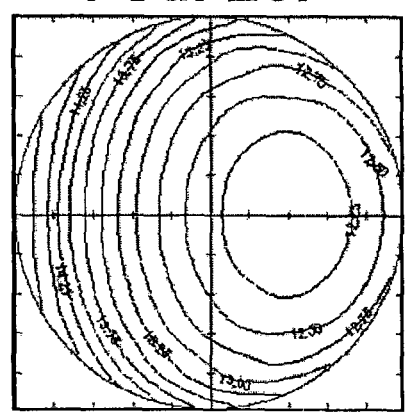

In contrast, optical performance evaluation results of a lens obtained by correcting the shape of the lens back surface from the initial lens shape by the lens shape data creating method of the present invention are shown in FIGS. 20A to 20F, wherein FIG. 20A shows the prismatic effect in horizontal direction undergone by a ray passing through the rotation center, FIG. 20B shows the prismatic effect in vertical direction undergone by the ray passing through the rotation center, FIG. 20C shows the surface astigmatism of the lens front surface, FIG. 20D shows the surface mean power of the lens front surface, FIG. 20E shows the surface astigmatism of the lens back surface, and FIG. 20F shows the surface mean power of the lens back surface. In the lens having the lens back surface thereof corrected in the first evaluation example, the astigmatism and the mean power error can not be sufficiently controlled; however, as shown in FIG. 20A, the distribution bias of the prismatic effect in horizontal direction in the peripheral portion can be substantially removed, and therefore prism balance substantially identical to the prismatic effect in horizontal direction shown in FIG. 20A can be obtained. Further, as shown in FIG. 20F, the interval of the contour lines on the right side (the ear side) from the fitting point is smaller than that on the left side (the nose side), so that the surface mean power of the lens back surface in the horizontal cross section passing through the fitting point changes more largely on the ear side than on the nose side.

Thus, in the first evaluation example, the prismatic effect undergone via the lens by the ray in each line-of-sight direction becomes the same as the lens of initial lens shape. Thus, it is possible to almost remove the prism imbalance particularly in the peripheral portion.

In the present embodiment, similar to the first embodiment, since the distribution bias of the prismatic effect is removed, the problems mentioned above can be improved. Thus, the wearer of a pair of spectacles mounted with such lenses can obtain a vision with no feeling of discomfort.

(2) Second Evaluation Example (an Example of a Single-Vision Lens Whose Prescription Power Includes No Cylindrical Power, in a Case where the Deviation Amount Removal Rate of the Prismatic Effect is Set to 50%)

Next, a second evaluation example of the single-vision minus lens whose prismatic effect distribution is improved by the aforesaid lens shape data creating method of the fourth embodiment will be described below.

The second evaluation example is an example of creating the lens shape data of a single-vision minus lens by the aforesaid method with a deviation amount removal rate of 50%, wherein data of the single-vision minus lens is: refractive index of the lens material is 1.5, BC is 8.50D, S is −4.00D, CT is 1 mm, and prismatic power is 0Δ.

Contour maps showing the prismatic effect distribution of a lens of initial lens shape in the case where there is no lens front angle and contour maps showing a prismatic effect distribution in the case where the aforesaid lens of initial lens shape is simply tilted by 15 degrees in horizontal direction with the fitting point as a center (i.e., in the case where the lens front angle is set to 15 degrees) are identical to those shown in FIGS. 19A to 19D.

Figure 21A:
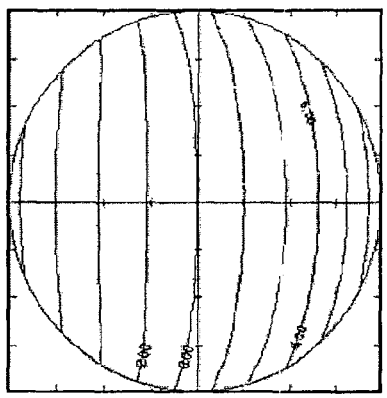
Figure 21B:
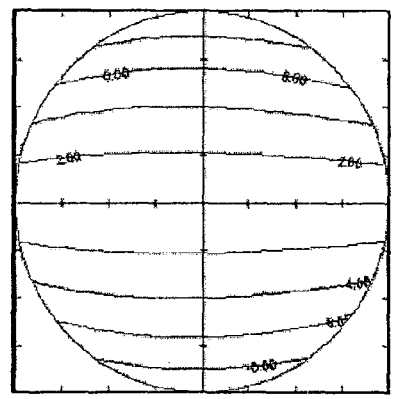
Figure 21C:
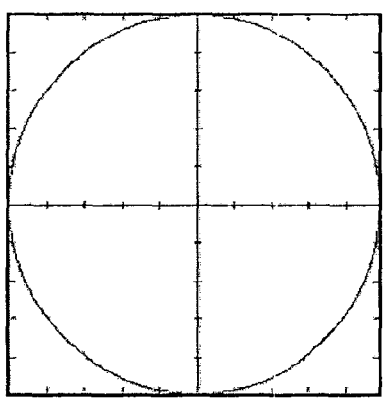
Figure 21D:
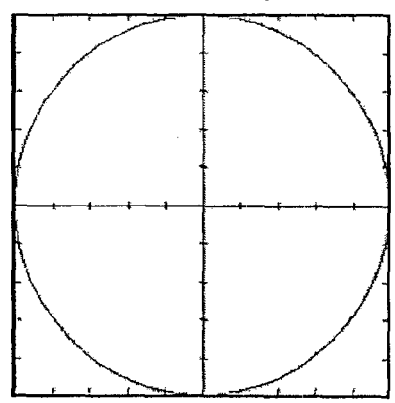
Figure 21E:
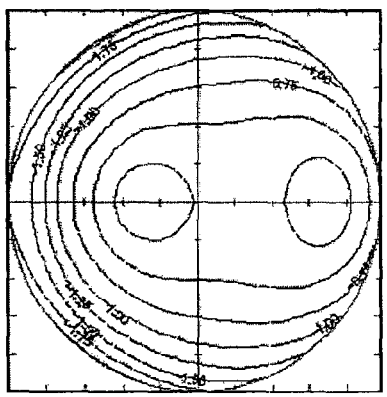
Figure 21F:
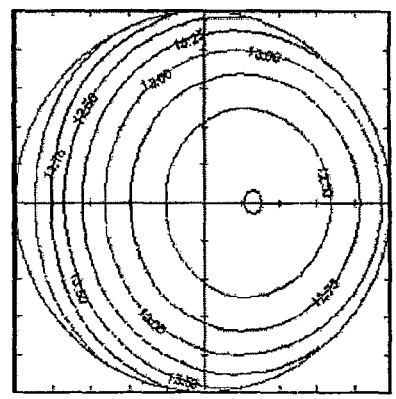
Figure 22:
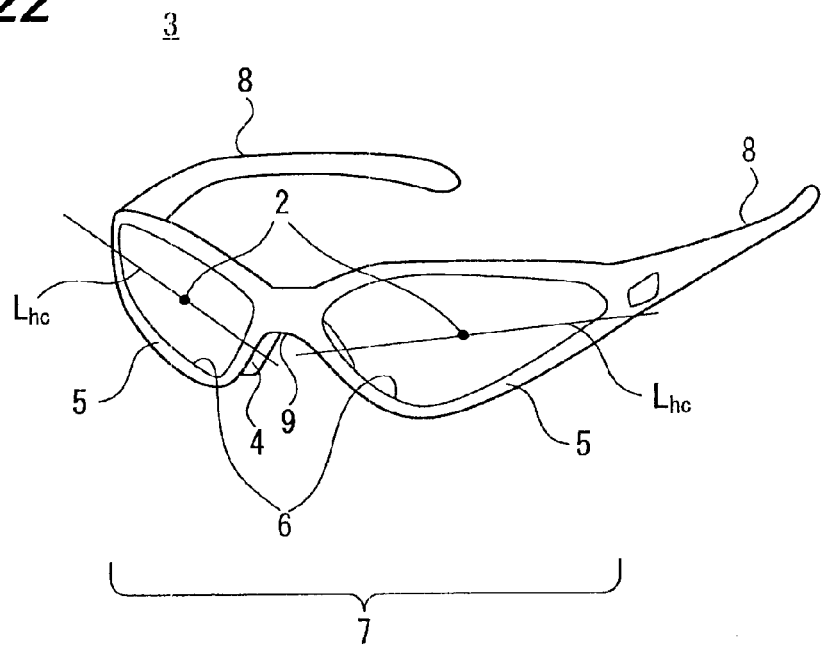
FIG. 22 is a perspective view showing a wraparound spectacle frame.
Figure 23:
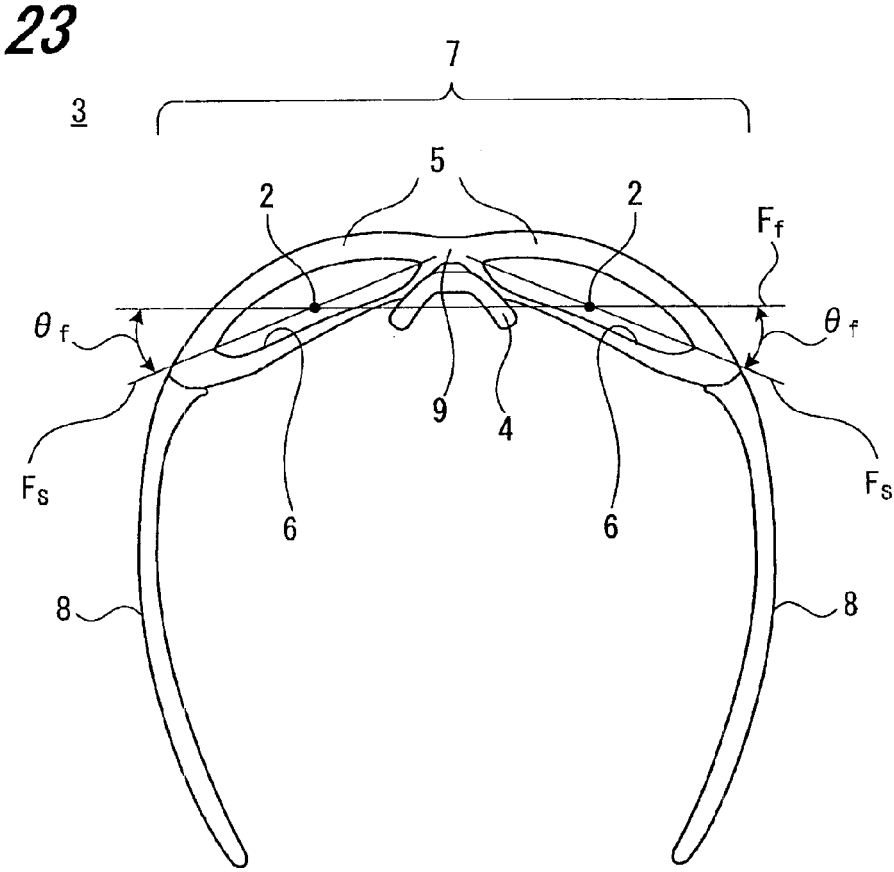
FIG. 23 is a plan view of the wraparound spectacle frame viewed from above.
Figure 24:
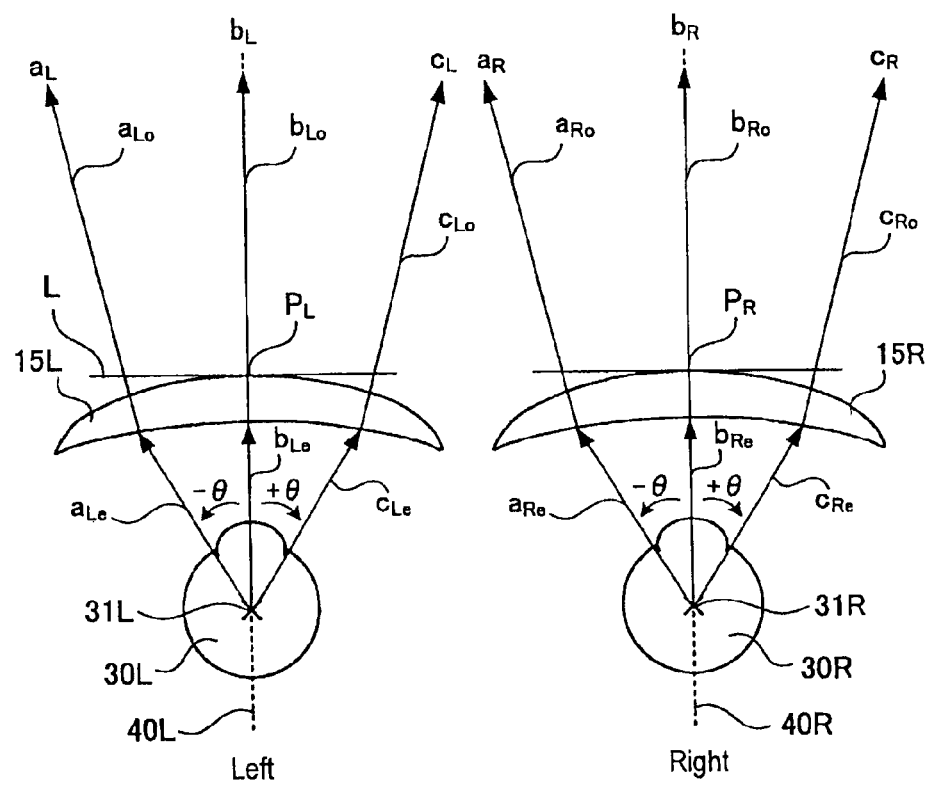
FIG. 24 is a view for explaining the prismatic effect of a spectacle lens in a state where there is no lens front angle.
Figure 25:
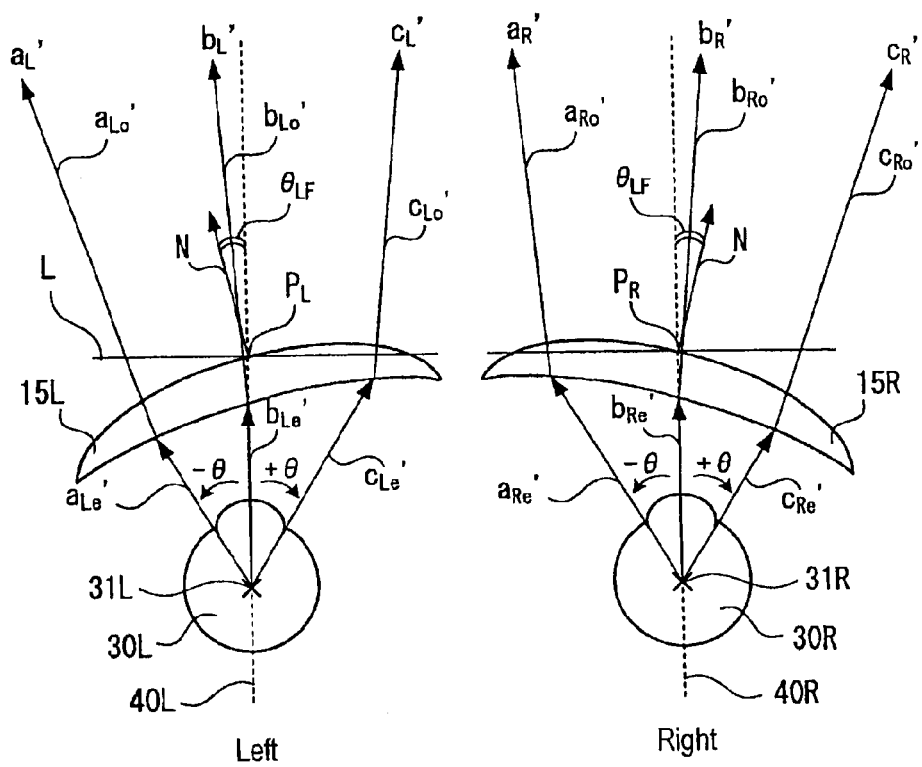
FIG. 25 is a view for explaining the prismatic effect of a spectacle lens in a state where there is lens front angle.
Figure 26:
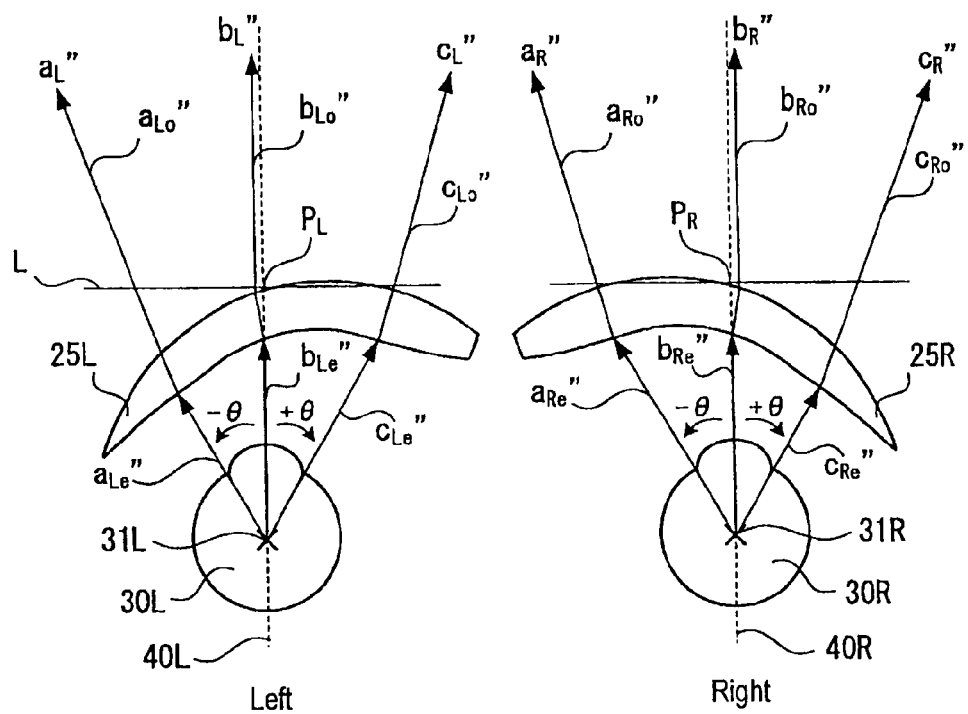
FIG. 26 is a view for explaining the prismatic effect of a spectacle lens whose shape has been corrected according to the conventional art.
Figure 27A:
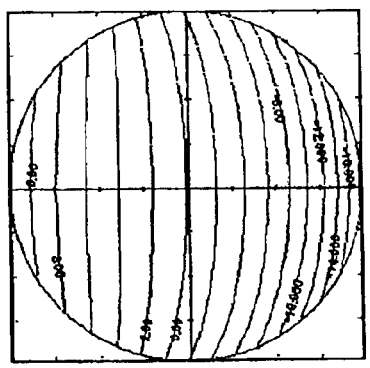
Figure 27B:
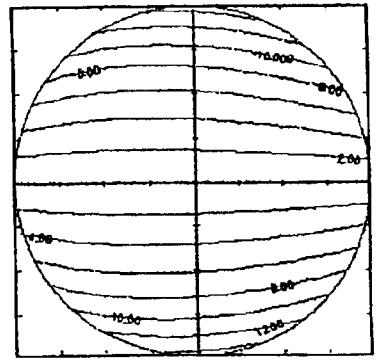

In contrast, optical performance evaluation results of a lens obtained by correcting the shape of the lens back surface from the initial lens shape by the lens shape data creating method of the fourth embodiment are shown in FIGS. 21A to 21F, wherein FIG. 21A is a contour map of the prismatic effect in horizontal direction undergone by a ray passing through the rotation center, FIG. 21B is a contour map of the prismatic effect in vertical direction undergone by the ray passing through the rotation center, FIG. 21C is a contour map of the surface astigmatism of the lens front surface, FIG. 21D is a contour map of the surface mean power of the lens front surface, FIG. 21E is a contour map of the surface astigmatism of the lens back surface, and FIG. 21F is a contour map of the surface mean power of the lens back surface. In the lens having the lens back surface thereof corrected in the second evaluation example, the astigmatism and the mean power error are reduced compared to the first evaluation example; however, as shown in FIG. 21A, the bias of the distribution of the prismatic effect in horizontal direction is increased compared to the first evaluation example. Further, as shown in FIG. 21F, the interval of the contour lines on the right side (the ear side) from the fitting point is smaller than that on the left side (the nose side), so that the surface mean power of the lens back surface in the horizontal cross section passing through the fitting point changes more largely on the ear side than on the nose side.

In the second evaluation example, in the single-vision minus lens having been corrected at a deviation amount removal rate of 50%, the increase of the astigmatism and mean power error is suppressed, and the bias of the prism balance is removed to a certain level. In such case, the discomfort felt by the wearer may also be reduced.

Incidentally, although the third embodiment is described based on a case in which the lens is a single-surface progressive-addition lens whose front surface is a progressive-addition surface, the present invention may also be applied to a case where the lens is a single-surface progressive-addition lens whose back surface is a progressive-addition surface. In such case, the shape data of the progressive-addition surface of the lens back surface may be corrected by the method of the present invention. Further, the present invention may also be applied to multi-focal lens. In such case, the initial lens shape may be such that the segment is formed on the front surface, and the back surface is a spherical surface or a toroidal surface; and the shape data of the lens back surface may be corrected. In such case, similar to the third embodiment, in the dioptric power correcting step, the distance-portion measuring reference point may be used as the power measurement position.

Further, although the first to third embodiments are described based on cases where the corrected surface of initial lens shape is the spherical surface or toroidal surface, the present invention may also be applied to a case where a rotationally symmetric aspherical surface of atoroidal surface is corrected.

Further, although the fourth embodiment is described based on a case where the corrected surface of initial lens shape is a rotationally symmetric aspherical surface, the present invention may also be applied to a case where an atoroidal surface is corrected.

Further, although the first, second and fourth embodiments are described based on cases where the uncorrected surface (the front surface) of initial lens shape is a spherical surface, the present invention may also be applied to a case where the uncorrected surface of initial lens shape is a rotationally symmetric aspherical surface.

As described above, according to the present invention, with the lens to be fitted into a spectacle frame in a state where there is lens front angle, it is possible to well reduce the imbalance of prismatic effect undergone the principal fixation line and the distortion felt when viewing front objects resulting from the lens front angle. Thus, like the case where a non-prescription spectacle lens is fitted into a spectacle frame having large front angle, for example, it is possible to provide a spectacle lens capable of reducing the discomfort felt by the wearer even in the case where there is a large lens front angle.

It is to be understood that the present invention is not limited to each example of the embodiments described above, and various modifications and variations can be made without departing from the spirit of the present invention.

EXPLANATION OF REFERENCE NUMERALS 10,11,12,13,15,20,22,25 spectacle lens
2 lens shape center
3 spectacle frame
30 eyeball
31 rotation center
32 center of the entrance pupil
40 reference front line-of-sight
100 lens shape data designing device
110 computer for design and calculation
120 processing section
121 initial shape design processing section
130 prismatic effect correction processing section
141 power correction processing section

The invention claimed is:

1. A method for creating shape data of a spectacle lens to be fitted into a spectacle frame in a state where there is a lens front angle, wherein the spectacle lens has dioptric power, the method comprising:
a step of receiving lens design conditions from an input terminal of a device that creates shape data of a spectacle lens;
a step for creating initial lens shape data defining an initial lens shape of the spectacle lens that is capable of obtaining desired prescription values, the initial lens shape data including lens front surface shape data defining a shape of a lens front surface of the spectacle lens, lens back surface shape data defining a shape of a lens back surface of the spectacle lens, and lens front and back surfaces directions data defining a direction of the lens back surface relative to the lens front surface of the spectacle lens;
a lens back surface shape data correcting step for correcting the lens back surface shape data of the created initial lens shape data by correcting a spherical or a rotationally symmetric aspherical surface shape to a bilaterally asymmetrical aspherical surface shape and by correcting a toroidal or an atoroidal surface shape to a bilaterally asymmetrical atoroidal surface shape; and
a step of outputting the corrected lens back surface shape data via an output terminal of the device,
wherein the lens back surface shape data correcting step comprises:
a prismatic effect correcting step for correcting the lens back surface shape data of the initial lens shape data, using a hardware processor of the device, so that a first prismatic effect of the spectacle lens of the initial lens shape on a plurality of rays passing through a rotation center of an eye assumed in optical design of the spectacle lens of the initial lens shape when assuming that the spectacle lens of the initial lens shape has been fitted into the spectacle frame in the state where there is a lens front angle, is identical or close to a second prismatic effect of the spectacle lens of the initial lens shape on the plurality of rays passing through the rotation center of the eye assumed in optical design of the spectacle lens of the initial lens shape when assuming that the spectacle lens of the initial lens shape has been fitted into the spectacle frame in a state where there is no lens front angle, wherein the plurality of rays include a ray in the front view direction, and
wherein the prismatic effect correcting step comprises:
a direction correcting step for correcting the lens front and back surfaces directions data of the initial lens shape data so that the first prismatic effect of the spectacle lens of the initial lens shape on the ray in the front view direction of the plurality of rays passing through the rotation center of the eye assumed in optical design of the spectacle lens of the initial lens shape when assuming that the spectacle lens of the initial lens shape has been fitted into the spectacle frame in a state where there is a lens front angle, is identical to the second prismatic effect of the spectacle lens of the initial lens shape on the ray in the front view direction of the plurality of rays passing through the rotation center of the eye assumed in optical design of the spectacle lens of the initial lens shape when assuming that the spectacle lens of the initial lens shape has been fitted into the spectacle frame in a state where there is no lens front angle; and
a shape correcting step for correcting the lens back surface data obtained after performing the direction correcting step so that a third prismatic effect of the spectacle lens of a lens shape according to the initial lens shape data obtained after the direction correcting step on one or more rays of the plurality of rays passing through the rotation center of the eye assumed in optical design of the spectacle lens of the initial lens shape when assuming that the spectacle lens of the initial lens shape has been fitted into the spectacle frame in a state where there is a lens front angle, is identical or close to the second prismatic effect of the spectacle lens of the initial lens shape on the one or more rays of the plurality of rays passing through the rotation center of the eye assumed in optical design of the spectacle lens of the initial lens shape when assuming that the spectacle lens of the initial lens shape has been fitted into the spectacle frame in a state where there is no lens front angle, wherein the one or more rays exclude the ray in the front view direction.

2. A method for creating shape data of a spectacle lens to be fitted into a spectacle frame in a state where there is a lens front angle, wherein the spectacle lens has dioptric power, the method comprising:
a step of receiving lens design conditions from an input terminal of a device that creates shape data of a spectacle lens;

a step for creating initial lens shape data defining an initial lens shape of the spectacle lens that is capable of obtaining desired prescription values, the initial lens shape data including lens front surface shape data defining a shape of a lens front surface of the spectacle lens, lens back surface shape data defining a shape of a lens back surface of the spectacle lens, and lens front and back surfaces directions data defining a direction of the lens back surface relative to the lens front surface of the spectacle lens;

a lens back surface shape data correcting step for correcting the lens back surface shape data of the created initial lens shape data by correcting a spherical or a rotationally symmetric aspherical surface shape to a bilaterally asymmetrical aspherical surface shape and by correcting a toroidal or an atoroidal surface shape to a bilaterally asymmetrical atoroidal surface shape; and a step of outputting the corrected lens back surface shape data via an output terminal of the device, wherein the lens back surface shape data correcting step comprises:

a prismatic effect correcting step for correcting the lens back surface shape data of the initial lens shape data, using a hardware processor of the device, so that a first prismatic effect of the spectacle lens of the initial lens shape on a plurality of rays passing through an entrance pupil center of an eye when viewing objects in front vision assumed in optical design of the spectacle lens of the initial lens shape when assuming that the spectacle lens of the initial lens shape has been fitted into the spectacle frame in a state where there is a lens front angle, is identical or close to a second prismatic effect of the spectacle lens of the initial lens shape on the plurality of rays passing through the entrance pupil center of the eye when viewing objects in front vision assumed in optical design of the spectacle lens of the initial lens shape when assuming that the spectacle lens of the initial lens shape has been fitted into the spectacle frame in a state where there is no lens front angle, wherein the plurality of rays include a ray in the front view direction, and wherein the prismatic effect correcting step comprises:

a direction correcting step for correcting the lens front and back surfaces directions data of the initial lens shape data so that the first prismatic effect of the spectacle lens of the initial lens shape on the ray in the front view direction of the plurality of rays passing through the entrance pupil center of the eye when viewing objects in front vision assumed in optical design of the spectacle lens of the initial lens shape when assuming that the spectacle lens of the initial lens shape has been fitted into the spectacle frame in a state where there is a lens front angle, is identical to the second prismatic effect of the spectacle lens of the initial lens shape on the ray in the front view direction of the plurality of rays passing through the entrance pupil center of the eye when viewing objects in front vision assumed in optical design of the spectacle lens of the initial lens shape when assuming that the spectacle lens of the initial lens shape has been fitted into the spectacle frame in a state where there is no lens front angle; and a shape correcting step for correcting the lens back surface data obtained after performing the direction correcting step so that a third prismatic effect of the spectacle lens of a lens shape according to the initial lens shape data obtained after the direction correcting step on one or more rays of the plurality of rays passing through the entrance pupil center of the eye when viewing objects in front vision assumed in optical design of the spectacle lens of the initial lens shape when assuming that the spectacle lens of initial lens shape has been fitted into the spectacle frame in a state where there is a lens front angle, is identical or close to the second prismatic effect of the spectacle lens of the initial lens shape on the one or more rays of the plurality of rays passing through the entrance pupil center of the eye when viewing objects in front vision assumed in optical design of the spectacle lens of the initial lens shape when assuming that the spectacle lens of the initial lens shape has been fitted into the spectacle frame in a state where there is no lens front angle, wherein the one or more rays exclude the ray in the front view direction.

3. A method for creating shape data of a spectacle lens to be fitted into a spectacle frame in a state where there is a lens front angle, wherein the spectacle lens has dioptric power, the method comprising:

a step of receiving lens design conditions from an input terminal of a device that creates shape data of a spectacle lens;

a step for creating initial lens shape data defining an initial lens shape of the spectacle lens that is capable of obtaining desired prescription values, the initial lens shape data including lens front surface shape data defining a shape of a lens front surface of the spectacle lens, lens back surface shape data defining a shape of a lens back surface of the spectacle lens, and lens front and back surfaces directions data defining a direction of the lens back surface relative to the lens front surface of the spectacle lens;

a lens back surface shape data correcting step for correcting the lens back surface shape data of the created initial lens shape data by correcting a spherical or a rotationally symmetric aspherical surface shape to a bilaterally asymmetrical aspherical surface shape and by correcting a toroidal or an atoroidal surface shape to a bilaterally asymmetrical atoroidal surface shape; and a step of outputting the corrected lens back surface shape data via an output terminal of the device, wherein the lens back surface shape data correcting step comprises:

a prismatic effect correcting step for correcting the lens back surface shape data of the initial lens shape data, using a hardware processor of the device, so that a first prismatic effect of the spectacle lens of the initial lens shape on a plurality of rays passing through an entrance pupil center of an eye when viewing objects in front vision assumed in optical design of the spectacle lens of the initial lens shape when assuming that the spectacle lens of the initial lens shape has been fitted into the spectacle frame in a state where there is a lens front angle, is identical or close to a second prismatic effect of the spectacle lens of the initial lens shape on the plurality of rays passing through the entrance pupil center of the eye when viewing objects in front vision assumed in optical design of the spectacle lens of the initial lens shape when assuming that the spectacle lens of the initial lens shape has been fitted into the spectacle frame in a state where there is no lens front angle, wherein the plurality of rays include a ray in the front view direction, and wherein the lens back surface shape data correcting step comprises:

a dioptric power correcting step for correcting the lens back surface shape data of the initial lens shape data so that, when assuming that the spectacle lens having a lens shape according to the initial lens shape data obtained after performing the prismatic effect correcting step has been fitted into the spectacle frame in a state where there is a lens front angle, power of light acting on the eye in a state where a line-of-sight extends from the rotation center of the eye to a power measurement position of the spectacle lens of the initial lens shape assumed in optical design of the spectacle lens of the initial lens shape is identical to power of the prescription values.

4. The method for creating shape data of the spectacle lens according to claim 1, wherein the prismatic effect correcting step includes correcting the lens back surface shape data of the initial lens shape data so that the first prismatic effect in a horizontal direction of the spectacle lens of the initial lens shape on the plurality of rays passing through the rotation center of the eye assumed in optical design of the spectacle lens of the initial lens shape when assuming that the spectacle lens of the initial lens shape has been fitted into the spectacle frame in a state where there is a lens front angle, is identical or close to the second prismatic effect in a horizontal direction of the spectacle lens of the initial lens shape on the plurality of rays passing through the rotation center of the eye assumed in optical design of the spectacle lens of the initial lens shape when assuming that the spectacle lens of the initial lens shape has been fitted into the spectacle frame in the state where there is no lens front angle, wherein the plurality of rays include the ray in the front view direction.

5. A device for creating shape data of a spectacle lens to be fitted into a spectacle frame in a state where there is a lens front angle, wherein the spectacle lens has dioptric power, the device comprising:

an input section configured to input order data including desired prescription values;

an initial lens shape creating section configured to create initial lens shape data defining an initial lens shape of the spectacle lens that is capable of obtaining the desired prescription values, the initial lens shape data including lens front surface shape data defining a shape of a lens front surface of the spectacle lens, lens back surface shape data defining a shape of a lens back surface of the spectacle lens, and lens front and back surfaces directions data defining a direction of the lens back surface relative to the lens front surface of the spectacle lens;

a lens back surface shape data correcting section configured to correct the lens back surface shape data of the created initial lens shape data by correcting a spherical or a rotationally symmetric aspherical surface shape to a bilaterally asymmetrical aspherical surface shape and by correcting a toroidal or an atoroidal surface shape to a bilaterally asymmetrical atoroidal surface shape; and an output section that outputs the corrected lens back surface shape data, wherein the lens back surface shape data correcting section comprises:

a prismatic effect correcting section, implemented by a hardware processor of the device, configured to correct the lens back surface shape data of the initial lens shape data so that a first prismatic effect of the spectacle lens of the initial lens shape on a plurality of rays passing through a rotation center of an eye or an entrance pupil center of the eye when viewing objects in front vision assumed in optical design of the spectacle lens of the initial lens shape when assuming that the spectacle lens of the initial lens shape has been fitted into the spectacle frame in a state where there is a lens front angle, is identical or close to a second prismatic effect of the spectacle lens of the initial lens shape on the plurality of rays passing through the rotation center of the eye or the entrance pupil center of the eye when viewing objects in front vision assumed in optical design of the spectacle lens of the initial lens shape when assuming that the spectacle lens of the initial lens shape has been fitted into the spectacle frame in a state where there is no lens front angle, wherein the plurality of rays include a ray in the front view direction, and wherein the prismatic effect correcting section comprises:

a direction correcting section for correcting the lens front and back surfaces directions data of the initial lens shape data so that the first prismatic effect of the spectacle lens of the initial lens shape on the ray in the front view direction of the plurality of rays passing through the entrance pupil center of the eye assumed in optical design of the spectacle lens of the initial lens shape when assuming that the spectacle lens of the initial lens shape has been fitted into the spectacle frame in the state where there is a lens front angle, is identical to the second prismatic effect of the spectacle lens of the initial lens shape on the ray in the front view direction of the plurality of rays passing through the rotation center of the eye or the entrance pupil center assumed in optical design of the spectacle lens of the initial lens shape when assuming that the spectacle lens of the initial lens shape has been fitted into the spectacle frame in the state where there is no lens front angle; and a shape correcting section for correcting the lens back surface data obtained after performing the direction correcting step so that a third prismatic effect of the spectacle lens of a lens shape according to the initial lens shape data obtained after the direction correcting step on one or more rays of the plurality of rays passing through the rotation center of the eye or the entrance pupil center of the eye assumed in optical design of the spectacle lens of the initial lens shape when assuming that the spectacle lens of initial lens shape has been fitted into the spectacle frame in the state where there is a lens front angle, is identical or close to the second prismatic effect of the spectacle lens of the initial lens shape on the one or more rays of the plurality of rays passing through the rotation center of the eye or the entrance pupil center of the eye assumed in optical design of the spectacle lens of the initial lens shape when assuming that the spectacle lens of the initial lens shape has been fitted into the spectacle frame in the state where there is no lens front angle, wherein the one or more rays exclude the ray in the front view direction.

6. A spectacle lens to be fitted into a spectacle frame in a state where there is a lens front angle, wherein the spectacle lens has dioptric power, comprising:

a lens front surface which is a spherical surface or a rotationally symmetric aspherical surface; and a lens back surface which is a bilaterally asymmetrical aspherical surface or a bilaterally asymmetrical atoroidal surface, having a shape, the shape reducing right and left imbalance of a prismatic effect resulting from the lens front angle, wherein a change of surface mean power of the lens back surface in a horizontal cross section passing through a fitting point of the lens front surface on an ear side relative to the fitting point is larger than a change of surface mean power of the lens back surface in the horizontal cross section on a nose side relative to the fitting point.

7. The method for creating shape data of the spectacle lens according to claim 1, wherein the lens back surface data correcting step comprises:
a dioptric power correcting step for correcting the lens back surface shape data of the initial lens shape data so that, when assuming that the spectacle lens having a lens shape according to the initial lens shape data obtained after performing the prismatic effect correcting step has been fitted into the spectacle frame in the state where there is a lens front angle power of light acting on the eye in a state where a line-of-sight extends from the rotation center of the eye assumed in optical design of the spectacle lens of the initial lens shape to a power measurement position of the spectacle lens of the initial lens shape is identical to power of the prescription values.

8. A method for creating shape data of a spectacle lens to be fitted into a spectacle frame in a state where there is a lens front angle, wherein the spectacle lens has dioptric power, the method comprising:
a step of receiving lens design conditions from an input terminal of a device that creates shape data of a spectacle lens;
a step for creating initial lens shape data defining an initial lens shape of the spectacle lens that is capable of obtaining desired prescription values, the initial lens shape data including lens front surface shape data defining a shape of a lens front surface of the spectacle lens, lens back surface shape data defining a shape of a lens back surface of the spectacle lens, and lens front and back surfaces directions data defining a direction of the lens back surface relative to the lens front surface of the spectacle lens;
a lens back surface shape data correcting step for correcting the lens back surface shape data of the created initial lens shape data by correcting a spherical or a rotationally symmetric aspherical surface shape to a bilaterally asymmetrical aspherical surface shape and by correcting a toroidal or an atoroidal surface shape to a bilaterally asymmetrical atoroidal surface shape; and
a step of outputting the corrected lens back surface shape data via an output terminal of the device,
wherein the lens back surface shape data correcting step comprises:
a prismatic effect correcting step for correcting the lens back surface shape data of the initial lens shape data, using a hardware processor of the device, so that a first prismatic effect of the spectacle lens of the initial lens shape on a plurality of rays passing through an entrance pupil center of an eye when viewing objects in front vision assumed in optical design of the spectacle lens of the initial lens shape when assuming that the spectacle lens of the initial lens shape has been fitted into the spectacle frame in the state where there is a lens front angle, is identical or close to a second prismatic effect of the spectacle lens of the initial lens shape on the plurality of rays passing through the entrance pupil center of the eye when viewing objects in front vision assumed in optical design of the spectacle lens of the initial lens shape when assuming that the spectacle lens of the initial lens shape has been fitted into the spectacle frame in a state where there is no lens front angle, wherein the plurality of rays include a ray in the front view direction, and
wherein the lens back surface data correcting step comprises:
a dioptric power correcting step for correcting the lens back surface shape data of the initial lens shape data so that, when assuming that the spectacle lens having a lens shape according to the initial lens shape data obtained after performing the prismatic effect correcting step has been fitted into the spectacle frame in the state where there is a lens front angle, power of light acting on the eye in a state where a line-of-sight extends from the rotation center of the eye assumed in optical design of the spectacle lens of the initial lens shape to a power measurement position of the spectacle lens of the initial lens shape is identical to power of the prescription values.

9. The method for creating shape data of the spectacle lens according to claim 2, wherein the lens back surface data correcting step comprises:
a dioptric power correcting step for correcting the lens back surface shape data of the initial lens shape data so that, when assuming that the spectacle lens having a lens shape according to the initial lens shape data obtained after performing the prismatic effect correcting step has been fitted into the spectacle frame in a state where there is a lens front angle power of light acting on the eye in a state where a line-of-sight extends from the rotation center of the eye assumed in optical design of the spectacle lens of the initial lens shape to a power measurement position of the spectacle lens of the initial lens shape is identical to power of the prescription values.

10. The method for creating shape data of the spectacle lens according to claim 1, wherein the prismatic effect correcting step includes correcting the lens back surface shape data of the initial lens shape data so that the first prismatic effect in a horizontal direction of the spectacle lens of the initial lens shape on the plurality of rays passing through the rotation center of the eye assumed in optical design of the spectacle lens of the initial lens shape when assuming that the spectacle lens of the initial lens shape has been fitted into the spectacle frame in a state where there is a lens front angle, is identical or close to the second prismatic effect in a horizontal direction of the spectacle lens of the initial lens shape on the plurality of rays passing through the rotation center of the eye assumed in optical design of the spectacle lens of the initial lens shape when assuming that the spectacle lens of the initial lens shape has been fitted into the spectacle frame in the state where there is no lens front angle, wherein the plurality of rays include the ray in the front view direction.

11. The method for creating shape data of the spectacle lens according to claim 2, wherein the prismatic effect correcting step includes correcting the lens back surface shape data of the initial lens shape data so that the first prismatic effect in a horizontal direction of the spectacle lens of the initial lens shape when assuming that the spectacle lens of the initial lens shape has been fitted into the spectacle frame in the state where there is a lens front angle, is identical or close to the second prismatic effect in a horizontal direction of the spectacle lens of the initial lens shape on the plurality of rays passing through the rotation center of the eye assumed in optical design of the spectacle lens of the initial lens shape when assuming that the spectacle lens of the initial lens shape has been fitted into the spectacle frame in the state where there is no lens front angle, wherein the plurality of rays include the ray in the front view direction.

12. The method for creating shape data of the spectacle lens according to claim 2, wherein the prismatic effect correcting step includes correcting the lens back surface shape data of the initial lens shape data so that the first prismatic effect in a horizontal direction of the spectacle lens of the initial lens shape on the plurality of rays passing through the rotation center of the eye assumed in optical design of the spectacle lens of the initial lens shape when assuming that the spectacle lens of the initial lens shape has been fitted into the spectacle frame in the state where there is a lens front angle is identical or close to the second prismatic effect in a horizontal direction of the spectacle lens of the initial lens shape of the plurality of rays passing through the rotation center of the eye assumed in optical design of the spectacle lens of the initial lens shape when assuming that the spectacle lens of the initial lens shape has been fitted into the spectacle frame in the state where there is no lens front angle, wherein the plurality of rays include the ray in the front view direction.

13. The method for creating shape data of the spectacle lens according to claim 3, wherein the prismatic effect correcting step includes correcting the lens back surface shape data of the initial lens shape data so that the first prismatic effect in a horizontal direction of the spectacle lens of the initial lens shape on the plurality of rays passing through the rotation center of the eye assumed in optical design of the spectacle lens of the initial lens shape when assuming that the spectacle lens of the initial lens shape has been fitted into the spectacle frame in the state where there is a lens front angle, is identical or close to the second prismatic effect in a horizontal direction of the spectacle lens of the initial lens shape on the plurality of rays passing through the rotation center of the eye assumed in optical design of the spectacle lens of the initial lens shape when assuming that the spectacle lens of the initial lens shape has been fitted into the spectacle frame in the state where there is no lens front angle, wherein the plurality of rays include the ray in the front view direction.

14. The method for creating shape data of the spectacle lens according to claim 7, wherein the prismatic effect correcting step includes correcting the lens back surface shape data of the initial lens shape data so that the first prismatic effect in a horizontal direction of the spectacle lens of the initial lens shape on the plurality of rays passing through the rotation center of the eye assumed in optical design of the spectacle lens of the initial lens shape when assuming that the spectacle lens of the initial lens shape has been fitted into the spectacle frame in the state where there is a lens front angle, is identical or close to the second prismatic effect in a horizontal direction of the spectacle lens of the initial lens shape on the plurality of rays passing through the rotation center of the eye assumed in optical design of the spectacle lens of the initial lens shape when assuming that the spectacle lens of the initial lens shape has been fitted into the spectacle frame in the state where there is no lens front angle, wherein the plurality of rays include the ray in the front view direction.

15. The method for creating shape data of the spectacle lens according to claim 8, wherein the prismatic effect correcting step includes correcting the lens back surface shape data of the initial lens shape data so that the first prismatic effect in a horizontal direction of the spectacle lens of the initial lens shape on the plurality of rays passing through the rotation center of the eye assumed in optical design of the spectacle lens of the initial lens shape when assuming that the spectacle lens of the initial lens shape has been fitted into the spectacle frame in a state where there is a lens front angle, is identical or close to the second prismatic effect in a horizontal direction of the spectacle lens of the initial lens shape on the plurality of rays passing through the rotation center of the eye assumed in optical design of the spectacle lens of the initial lens shape when assuming that the spectacle lens of the initial lens shape has been fitted into the spectacle frame in the state where there is no lens front angle, wherein the plurality of rays include the ray in the front view direction.

16. The method for creating shape data of the spectacle lens according to claim 9, wherein the prismatic effect correcting step includes correcting the lens back surface shape data of the initial lens shape data so that the first prismatic effect in a horizontal direction of the spectacle lens of the initial lens shape on the plurality of rays passing through the rotation center of the eye assumed in optical design of the spectacle lens of the initial lens shape when assuming that the spectacle lens of the initial lens shape has been fitted into the spectacle frame in a state where there is a lens front angle, is identical or close to the second prismatic effect in a horizontal direction of the spectacle lens of the initial lens shape on the plurality of rays passing through the rotation center of the eye assumed in optical design of the spectacle lens of the initial lens shape when assuming that the spectacle lens of the initial lens shape has been fitted into the spectacle frame in the state where there is no lens front angle, wherein the plurality of rays include the ray in the front view direction.

\* \* \* \* \*